US011222827B2

(12) United States Patent
Moon

(10) Patent No.: US 11,222,827 B2
(45) Date of Patent: Jan. 11, 2022

(54) SEMICONDUCTOR DEVICE

(71) Applicant: SAMSUNG ELECTRONICS CO., LTD., Suwon-si (KR)

(72) Inventor: Hui Chang Moon, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/723,518

(22) Filed: Dec. 20, 2019

(65) Prior Publication Data
US 2020/0312724 A1 Oct. 1, 2020

(51) Int. Cl.
| H01L 27/1157 | (2017.01) |
| H01L 29/10 | (2006.01) |
| H01L 29/792 | (2006.01) |
| H01L 29/167 | (2006.01) |
| H01L 29/66 | (2006.01) |
| H01L 27/11582 | (2017.01) |
| H01L 21/8234 | (2006.01) |
| H01L 21/762 | (2006.01) |
| H01L 21/02 | (2006.01) |

(52) U.S. Cl.
CPC ........ H01L 21/823487 (2013.01); H01L 21/02172 (2013.01); H01L 21/76224 (2013.01); H01L 27/1157 (2013.01); H01L 27/11582 (2013.01); H01L 29/1037 (2013.01); H01L 29/167 (2013.01); H01L 29/66833 (2013.01); H01L 29/7926 (2013.01)

(58) Field of Classification Search
CPC ....... H01L 21/823487; H01L 21/76224; H01L 21/02172; H01L 27/1157; H01L 29/1037; H01L 29/7926; H01L 29/29; H01L 29/167; H01L 29/66833; H01L 27/11582; H01L 27/11565; H01L 27/11575; H01L 27/11568; H01L 27/11578
See application file for complete search history.

(56) References Cited

U.S. PATENT DOCUMENTS

| 8,507,973 | B2 | 8/2013 | Lee | |
| 8,637,913 | B2 | 1/2014 | Yoo et al. | |
| 9,035,372 | B2 | 5/2015 | Song | |
| 9,786,681 | B1 | 10/2017 | Ariyoshi | |
| 9,859,207 | B2* | 1/2018 | Kim | H01L 28/00 |
| 2012/0299005 | A1 | 11/2012 | Lee | |
| 2012/0299076 | A1 | 11/2012 | Yoo et al. | |
| 2015/0318301 | A1* | 11/2015 | Lee | H01L 27/11582 257/324 |
| 2016/0163732 | A1* | 6/2016 | Lim | H01L 27/11582 257/314 |

(Continued)

Primary Examiner — Victor A Mandala
(74) Attorney, Agent, or Firm — Sughrue Mion, PLLC

(57) ABSTRACT

A semiconductor device is provided. The semiconductor device includes a stack structure disposed on a lower structure; an insulating structure disposed on the stack structure; and a vertical structure extending in a direction perpendicular to an upper surface of the lower structure and having side surfaces opposing the stack structure and the insulating structure. The stack structure includes interlayer insulating layers and gate layers, alternately stacked, and the insulating structure includes a lower insulating layer, an intermediate insulating layer on the lower insulating layer, and an upper insulating layer on the intermediate insulating layer.

20 Claims, 45 Drawing Sheets

(56) References Cited

U.S. PATENT DOCUMENTS

| | | | |
|---|---|---|---|
| 2016/0204122 A1* | 7/2016 | Shoji | H01L 27/11575 |
| | | | 257/324 |
| 2016/0293627 A1* | 10/2016 | Kim | H01L 27/11582 |
| 2017/0148677 A1* | 5/2017 | Shin | H01L 23/53266 |
| 2017/0271345 A1* | 9/2017 | Shimura | H01L 27/11582 |
| 2017/0287926 A1 | 10/2017 | Ariyoshi | |
| 2018/0012903 A1* | 1/2018 | Kim | H01L 27/11565 |
| 2018/0247950 A1* | 8/2018 | Yun | H01L 27/11573 |
| 2019/0035798 A1* | 1/2019 | Hwang | H01L 27/11575 |
| 2019/0067320 A1* | 2/2019 | Cho | H01L 21/76816 |
| 2019/0157283 A1* | 5/2019 | Jung | H01L 27/11575 |
| 2019/0304991 A1* | 10/2019 | Seo | H01L 27/11565 |

* cited by examiner

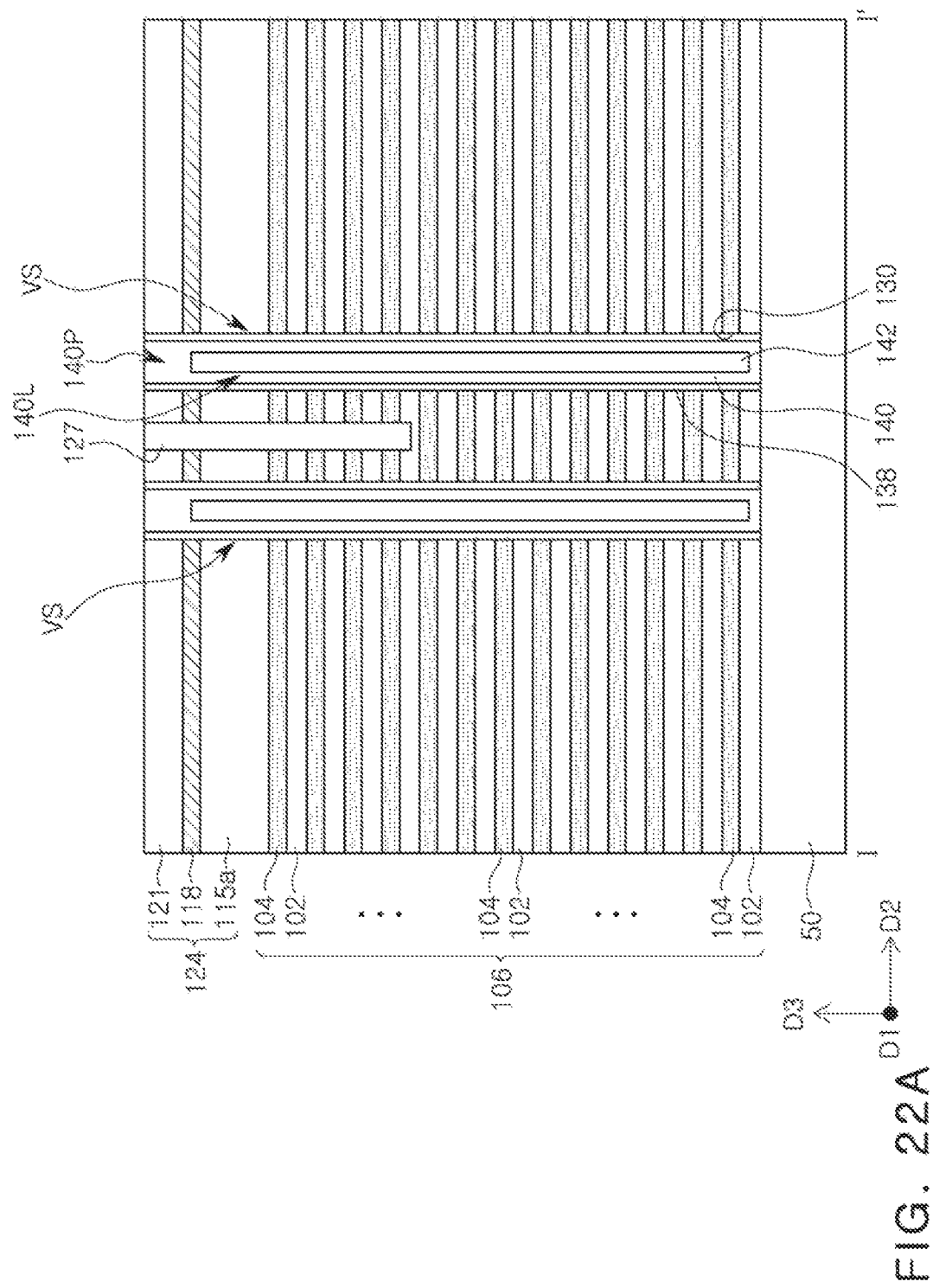

SEMICONDUCTOR DEVICE

CROSS-REFERENCE TO RELATED APPLICATION(S)

This application claims benefit of priority to Korean Patent Application No. 10-2019-0037916 filed on Apr. 1, 2019 in the Korean Intellectual Property Office, the disclosure of which is hereby incorporated by reference herein in its entirety.

BACKGROUND

Example embodiments of the present application relate to a semiconductor device, and more particularly to a three-dimensional semiconductor device.

Demand for improving integration density of a semiconductor device has increased, to improve price competitiveness of electronic products. To improve integration density of a semiconductor device, a semiconductor device in which memory cells are arranged three-dimensionally has been suggested instead of a semiconductor device including memory cells arranged two-dimensionally.

SUMMARY

An example embodiment of the present application is to provide a semiconductor device having improved integration density.

Provided herein is a semiconductor device, including: a stack structure; a lower structure, wherein the stack structure is disposed on the lower structure; an insulating structure disposed on the stack structure; and a vertical structure extending in a direction perpendicular to an upper surface of the lower structure, wherein the vertical structure comprises side surfaces opposing the stack structure and opposing the insulating structure, wherein at least a portion of the stack structure includes interlayer insulating layers and gate layers, wherein the interlayer insulating layers and gate layers are alternately stacked, wherein the insulating structure includes a lower insulating layer, an intermediate insulating layer, and an upper insulating layer, wherein the intermediate insulating layer is disposed on the lower insulating layer, wherein the upper insulating layer is disposed on the intermediate insulating layer, and wherein the intermediate insulating layer exhibits etch selectivity.

In some embodiments of the semiconductor device a material of the intermediate insulating layer is different from a material of the lower insulating layer and a material of the upper insulating layer, and the intermediate insulating layer comprises a dopant, wherein the dopant includes a group-5 element of the periodic table, and wherein the intermediate insulating layer exhibits the etch selectivity with respect to the upper insulating layer.

Also provided, in some embodiments is an alternative semiconductor device, including: a stack structure; a lower structure, wherein the stack structure is disposed on the lower structure; an insulating structure disposed on the stack structure; a vertical structure extending in a direction perpendicular to an upper surface of the lower structure, wherein the vertical structure penetrates the stack structure and penetrates the insulating structure; a capping insulating layer, wherein the capping insulating layer is disposed on the insulating structure and on the vertical structure; and a separation structure, wherein the separation structure extends in a direction perpendicular to an upper surface of the lower structure, and wherein the separation structure penetrates the stack structure, penetrates the insulating structure, and penetrates the capping insulating layer, the insulating structure includes a lower insulating layer, an intermediate insulating layer, and an upper insulating layer, the intermediate insulating layer is disposed on the lower insulating layer, the upper insulating layer is disposed on the intermediate insulating layer, and the intermediate insulating layer exhibits an etch selectivity.

In some embodiments of the alternative semiconductor device, at least a portion of the stack structure includes gate layers and interlayer insulating layers, wherein the interlayer insulating layers are disposed between the gate layers, a material of the interlayer insulating layers is different from a material of the lower insulating layer, a material of the upper insulating layer, and a material of the interlayer insulating layers, and the intermediate insulating layer comprises a dopant, wherein the dopant includes a group-5 element of the periodic table, and wherein the intermediate insulating layer exhibits the etch selectivity with respect to the upper insulating layer.

Also provided in some embodiments, is yet another semiconductor device, including: a stack structure; a lower structure, wherein the stack structure is disposed on the lower structure; an insulating structure disposed on the stack structure; a vertical structure extending in a direction perpendicular to an upper surface of the lower structure, wherein the vertical structure penetrates the stack structure and penetrates the insulating structure; a capping insulating layer, wherein the capping insulating layer is disposed on the insulating structure and on the vertical structure; and contact plugs, wherein the contact plugs penetrate the capping insulating layer and penetrate the insulating structure, the insulating structure includes a lower insulating layer, an intermediate insulating layer, and an upper insulating layer, the intermediate insulating layer is disposed on the lower insulating layer, wherein the upper insulating layer is disposed on the intermediate insulating layer, and the intermediate insulating layer exhibits an etch selectivity.

BRIEF DESCRIPTION OF DRAWINGS

The above and other aspects, features, and advantages of the present application will be more clearly understood from the following detailed description, taken in conjunction with the accompanying drawings, in which.

DETAILED DESCRIPTION

Hereinafter, embodiments of the present application will be described as follows with reference to the accompanying drawings.

Figure 1:
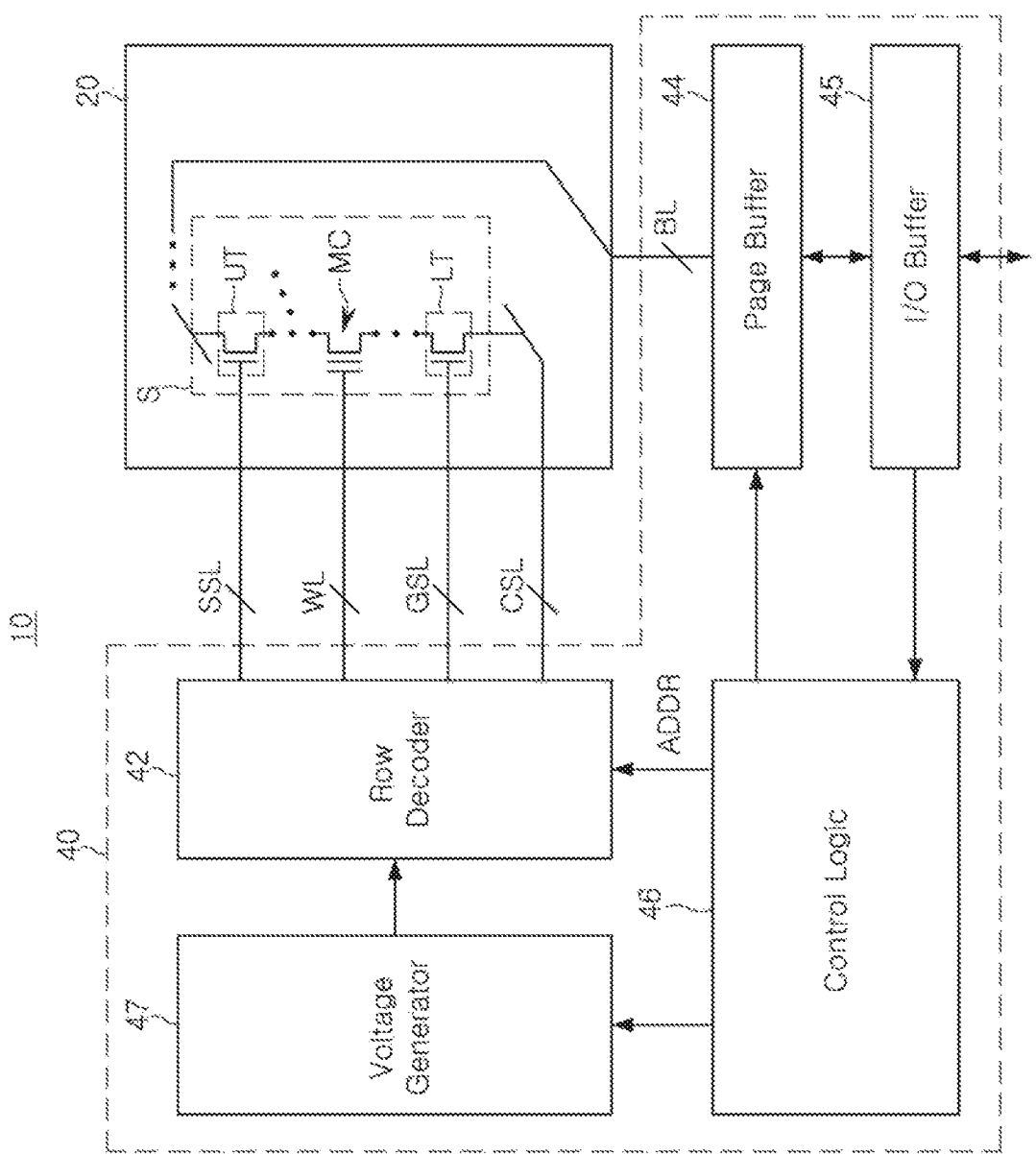
FIG. 1 is a block diagram illustrating a semiconductor device according to an example embodiment of the present application.

An example of a semiconductor device will be described with reference to FIG. 1. FIG. 1 is a block diagram illustrating a semiconductor device according to an example embodiment.

Referring to FIG. 1, a semiconductor device 10 may include a memory cell array region 20 in which a cell string S including an upper transistor UT controlled by a string selection line SSL, a lower transistor LT controlled by a ground selection line GSL, and memory cells MC disposed between the upper transistor UT and the lower transistor LT and controlled by word lines WL is disposed, and a peripheral circuit region 40 in which a peripheral circuit used for storing information in the memory cells MC or for reading out information stored in the memory cells MC, such as a row decoder 42, a page buffer 44, an input and output buffer 45, a control logic 46, a voltage generator 47, and the like, are disposed.

Figure 2:
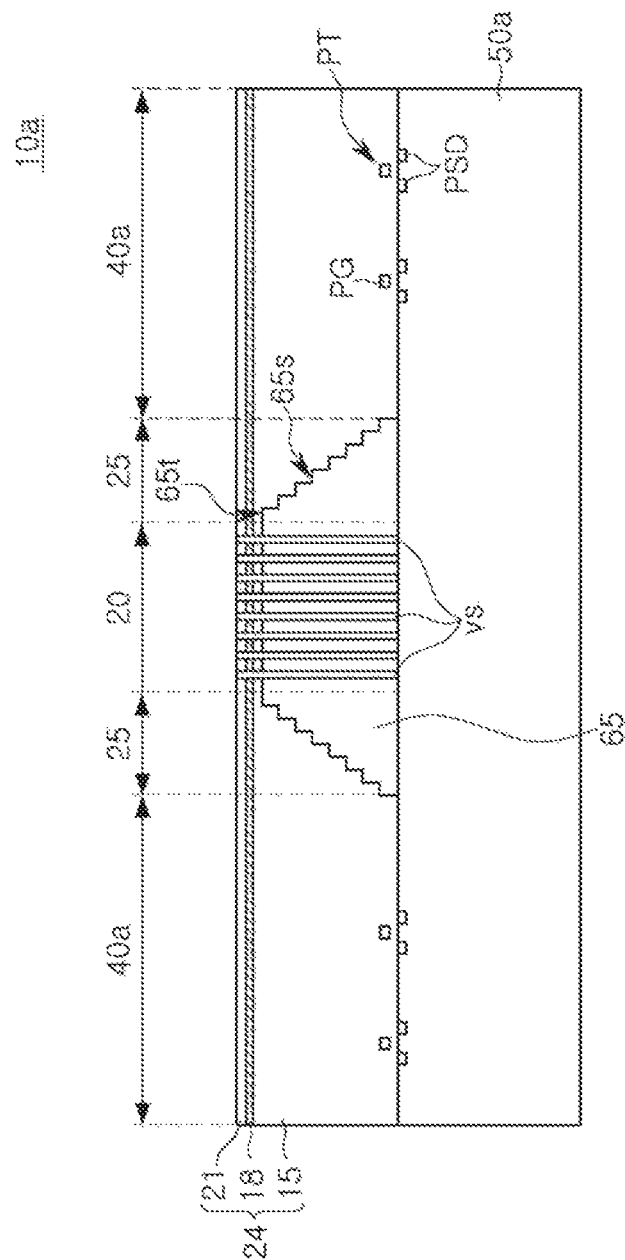
FIG. 2 is a cross-sectional diagram illustrating an example of a semiconductor device according to an example embodiment of the present application.

An example of a semiconductor device will be described with reference to FIG. 2. FIG. 2 is a cross-sectional diagram illustrating an example of a semiconductor device according to an example embodiment.

Referring to FIG. 2, in an example embodiment, a semiconductor device 10a may include a memory cell array region 20 and a peripheral circuit region 40a disposed adjacent to the memory cell array region 20. The peripheral circuit region 40a may include peripheral transistors PT included in a peripheral circuit. The peripheral transistors PT may include a peripheral gate PG and a peripheral source/drain PSD.

In an example, the semiconductor device 10a may include a connection region 25 adjacent to the memory cell array region 20. The connection region 25 may be referred to as "contact region" or "extension region."

In an example, the semiconductor device 10a may include a lower structure 50a, a stack structure 65 disposed on the lower structure 50a, and an insulating structure 24 disposed on the lower structure 50a and covering the stack structure 65. In an example embodiment, the lower structure 50a may be a semiconductor substrate. The memory cell array region 20 and the peripheral circuit region 40a may be disposed on the lower structure 50a. The stack structure 65 may be disposed in the memory cell array region 20 and may extend into the connection region 25.

In the example embodiment, the stack structure 65 may include a first region 65t and a second region 65s extending from the first region 65t and having a staircase form in the connection region 25. The second region 65s may have a staircase form descending from an upper surface of the first region 65t. The second region 65s may be disposed in the connection region 25.

In the example embodiment, the staircase form may include a form gradually descending with a certain height difference between steps, and may also include different types of staircase forms. Hereinafter, the first region 65t of the stack structure 65 may be referred to as a "stack region," and the second region 65s of the stack structure 65 may be referred to as a "staircase region."

The insulating structure 24 may include a lower insulating layer 15, an intermediate insulating layer 18 disposed on the lower insulating layer 15, and an upper insulating layer 21 disposed on the intermediate insulating layer 18.

A material of the intermediate insulating layer 18 may be different from a material of the lower insulating layer 15 and a material of the upper insulating layer 21. The intermediate insulating layer 18 may be formed of a material having etch selectivity different from etch selectivity of a material of the lower insulating layer 15 and etch selectivity of a material of the upper insulating layer 21.

In the example embodiment, the semiconductor device 10a may include vertical structures VS disposed on the lower structure 50a and penetrating the second region 65s and the insulating structure 24. The vertical structures VS may have side surfaces facing the stack structure 65 and the insulating structure 24. The vertical structures VS may be disposed in the memory cell array region 20, and may penetrate the stack region 65t of the stack structure 65 and the insulating structure 24 disposed on the stack region 65t.

In an example embodiment, the vertical structures VS may have upper surfaces substantially coplanar with an upper surface of the insulating structure 24. The upper surfaces of the vertical structures VS and the upper surface of the insulating structure 24 may be positioned on substantially the same level.

Figure 3:
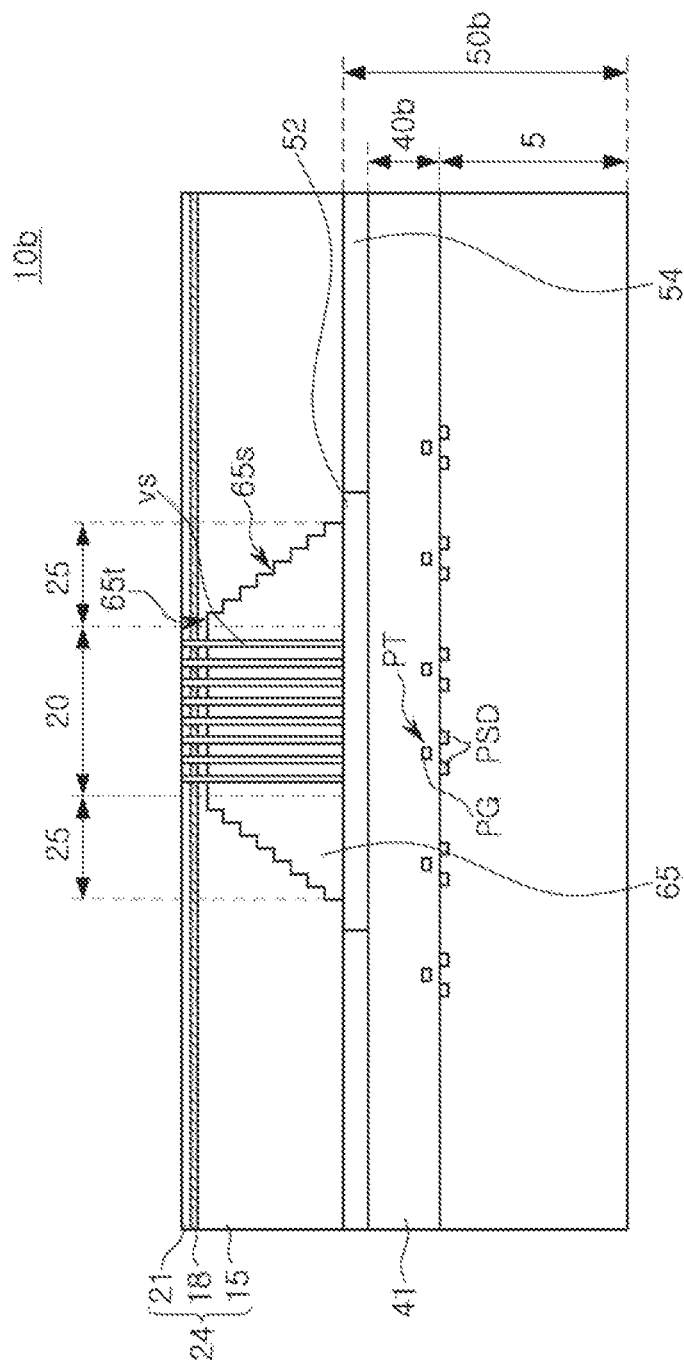
FIG. 3 is a cross-sectional diagram illustrating a modified example of a semiconductor device according to an example embodiment of the present application.

The peripheral circuit region 40a may be disposed adjacent to the memory cell array region 20, but an example embodiment thereof is not limited thereto. In the description below, a modified example of the peripheral circuit region 40a will be described with reference to FIG. 3. FIG. 3 is a cross-sectional diagram illustrating a modified example of a semiconductor device according to an example embodiment.

In the modified example, referring to FIG. 3, a semiconductor device 10b may include the memory cell array region 20 and the connection region 25, and a peripheral circuit region 40b disposed below the memory cell array region 20 and the connection region 25 as in the aforementioned example embodiment described with reference to FIG. 2.

In the example embodiment, the semiconductor device 10b may include a lower structure 50b. The lower structure 50b may include a first substrate 5 and the peripheral circuit region 40b disposed on the first substrate 5. The first substrate 5 may be a semiconductor substrate. The peripheral circuit region 40b may include peripheral transistors PT including a peripheral gate PG and a peripheral source/drain PSD included in a peripheral circuit, and a peripheral insulating layer 41 covering the peripheral transistors PT.

In the example embodiment, the lower structure 50b may further include a second substrate 52 disposed on the peripheral circuit region 40b, and an intermediate insulating layer 54 disposed on side surfaces of the second substrate 52. The second substrate 52 may include a semiconductor material (e.g., polysilicon, and the like) and/or a conductive material (e.g., TiN, tungsten, or the like).

Figure 4:
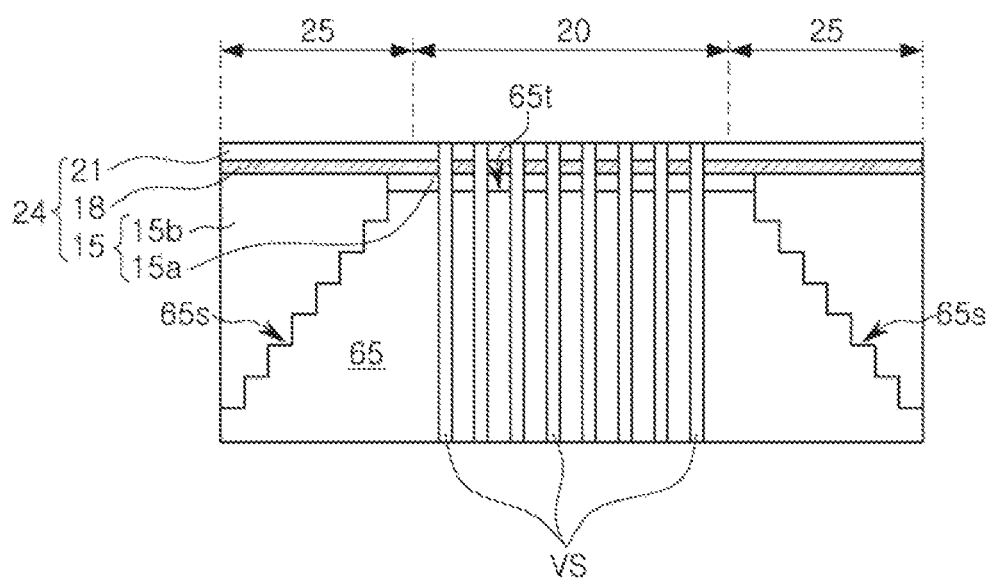
FIG. 4 is a cross-sectional diagram illustrating an example of a semiconductor device according to an example embodiment of the present application.

In an example embodiment, the semiconductor device 10b may include the stack structure 65, the insulating structure 24, and the vertical structures VS as in the aforementioned example described with reference to FIG. 2. An example of the insulating structure 24 described with reference to FIGS. 2 and 3 will be described with reference to FIG. 4. FIG. 4 is a cross-sectional diagram illustrating an example of a semiconductor device according to an example embodiment.

In an example embodiment, referring to FIG. 4, the stack structure 65 may include the stack region 65t and the staircase region 65s, and the insulating structure 24 disposed on the stack structure 65 may include the lower insulating layer 15, the intermediate insulating layer 18, and the upper insulating layer 21 stacked in order, as in the example embodiments described with reference to FIGS. 2 and 3.

In the example embodiment, the lower insulating layer 15 may include a first lower insulating layer 15a and a second lower insulating layer 15b. The first lower insulating layer 15a may be disposed on the stack region 65t of the stack structure 65, and the second lower insulating layer 15b may be disposed on the staircase region 65s of the stack structure 65.

In the example embodiment, the first lower insulating layer 15a may have an upper surface coplanar with an upper surface of the second lower insulating layer 15b.

In the example embodiment, the first lower insulating layer 15a may have a width substantially the same as a width of an upper surface of the stack region 65t. The first lower insulating layer 15a may be self-aligned with the stack region 65t.

In the example embodiment, the intermediate insulating layer 18 may be in contact with the first and second lower insulating layers 15a and 15b.

The vertical structures VS described with reference to FIGS. 2 and 3 may penetrate through the stack region 65t, the first lower insulating layer 15a, the intermediate insulating layer 18, and the upper insulating layer 21.

Figure 5:
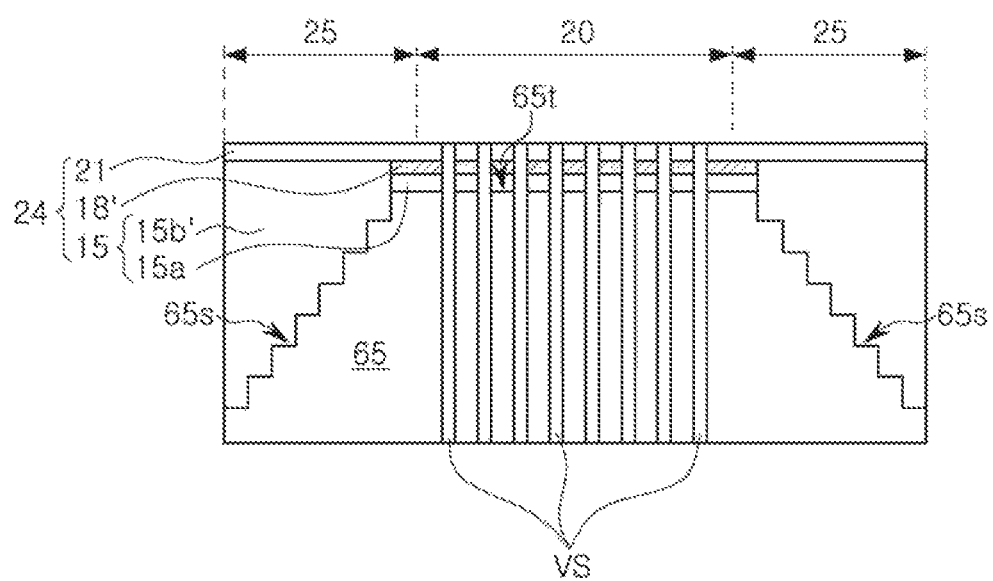
FIG. 5 is a cross-sectional diagram illustrating a modified example of a semiconductor device according to an example embodiment of the present application.

In the description below, modified examples of the second lower insulating layer 15b and the intermediate insulating layer 18 of the insulating structure 24 will be described with reference to FIG. 5. FIG. 5 is a cross-sectional diagram illustrating a modified example of a semiconductor device according to an example embodiment.

In the modified example embodiment, referring to FIG. 5, a first lower insulating layer 15a and an intermediate insulating layer 18' stacked in order may be disposed on the stack region 65t of the stack region 65t. A second lower insulating layer 15b' may be disposed on the staircase region 65s of the stack structure 65 as described in the aforementioned example embodiment.

In the example embodiment, the first lower insulating layer 15a and the intermediate insulating layer 18' may have substantially the same width.

The upper insulating layer 21 may be disposed on the intermediate insulating layer 18' and the second lower insulating layer 15b'. Accordingly, the lower insulating layer 15 including the first and second lower insulating layers 15a and 15b', the intermediate insulating layer 18', and the insulating structure 24 including the upper insulating layer 21 may be disposed on the stack structure 65.

In the example embodiment, the second lower insulating layer 15b' may have an upper surface coplanar with an upper surface of the intermediate insulating layer 18'.

The upper insulating layer 21 may be in contact with the second lower insulating layer 15b' and the intermediate insulating layer 18'.

Figure 6:
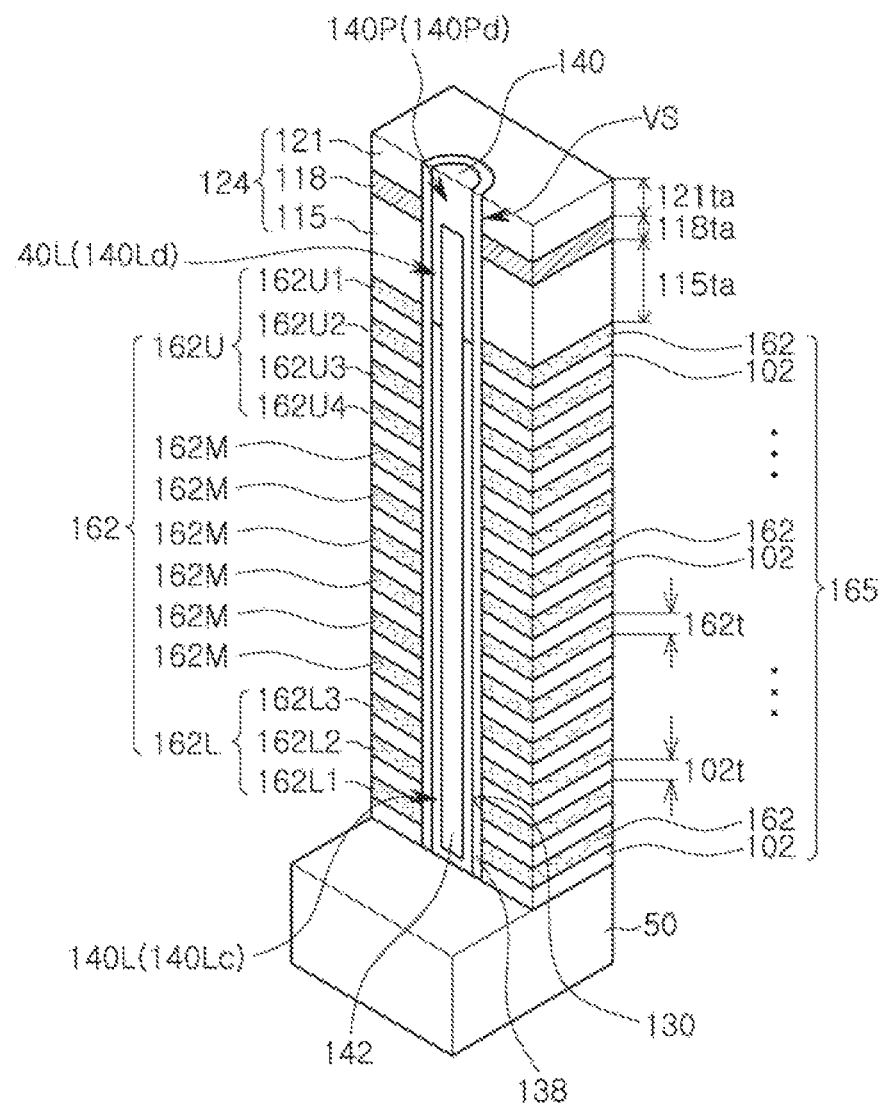
FIG. 6 is a perspective diagram illustrating an example of a portion of a semiconductor device according to an example embodiment of the present application.

In the description below, example embodiments of the stack structure 65, the insulating structure 124, and the vertical structure VS disposed in the memory cell array region 20 described in the aforementioned example embodiment will be described with reference to FIG. 6. FIG. 6 is a perspective diagram illustrating an example of a semiconductor device according to an example embodiment.

Referring to FIG. 6, a stack structure 165, an insulating structure 124, and a vertical structure VS may be disposed on a lower structure 50. The lower structure 50 may be the lower structure 50a (in FIG. 2) illustrated in the example in FIG. 2, or may be the lower structure 50b (in FIG. 3) illustrated in the example in FIG. 3.

The stack structure 165 may include interlayer insulating layers 102 and gate layers 162, alternately stacked. The interlayer insulating layers 102 may be formed of an insulating material such as a silicon oxide, and the like.

The gate layers 162 may include one or a plurality of lower gate layers 162L, a plurality of interlayer gate layers 162M disposed on one or a plurality of the lower gate layers 162L, and one or a plurality of upper gate layers 162U disposed on the plurality of interlayer gate layers 162M.

In the example embodiment, as for one or a plurality of the lower gate layers 162L, a plurality of lower gate layers 162L may be disposed. For example, the plurality of lower gate layers 162L may include a first lower gate layer 162L1, a second lower gate layer 162L2, and a third lower gate layer 162L3 disposed in order in a direction perpendicular to an upper surface of the lower structure 50 from an upper surface of the lower structure 50.

In the example embodiment, as for one or a plurality of the upper gate layers 162U, a plurality of the upper gate layers 162U may be disposed. For example, the plurality of upper gate layers 162U may include a first upper gate layer 162U1, a second upper gate layer 162U2, a third upper gate layer 162U3, and a fourth upper gate layer 162U4 disposed in order in a direction of the lower structure 50 from an upper surface of the stack structure 165.

The insulating structure 124 may include a lower insulating layer 115, an intermediate insulating layer 118, and an upper insulating layer 121 stacked in order. The insulating structure 124 may be substantially the same as the insulating structure 24 (in FIGS. 4 and 5) disposed in the memory cell array region 20 illustrated in the examples illustrated in FIGS. 4 and 5. For example, the lower insulating layer 115, the intermediate insulating layer 118, and the upper insulating layer 121 of the insulating structure 124 may correspond to the first lower insulating layer 15a (in FIGS. 4 and 5), and the intermediate insulating layer 18 and 18' (in FIGS. 4 and 5), and the upper insulating layer 21 (in FIGS. 4 and 5) of the insulating structure 24 (in FIGS. 4 and 5), respectively, described with reference to FIGS. 4 and 5. Thus, as described above, the intermediate insulating layer 118 may be formed of a material different from a material of the lower insulating layer 115 and a material of the upper insulating layer 121.

A hole 130 penetrating the stack structure 165 and the insulating structure 124 in order may be disposed. The vertical structure VS may be disposed in the hole 130. The vertical structure VS may extend in a direction perpendicular to an upper surface of the lower structure 50 and may penetrate through the stack structure 165 and the insulating structure 124 in order. The vertical structure VS may have side surfaces opposing side surface of the stack structure 165 and side surfaces of the insulating structure 124. The vertical structure VS may have an upper surface substantially coplanar with an upper surface of the stack structure 165.

The vertical structure VS may include a semiconductor pattern 140. The semiconductor pattern 140 may include a pad portion 140P positioned on a higher level than the stack structure 165, and a liner portion 140L extending in a direction of the lower structure 50 from an edge region of the pad portion 140P.

The vertical structure VS may include a channel region 140Lc and doped regions 140Ld and 140Pd. The channel region 140Lc may be formed in the liner portion 140L of the semiconductor pattern 140. The doped regions 140Ld and 140Pd may include the first doped region 140Pd formed in the pad portion 140P of the semiconductor pattern 140, and the second doped region 140Ld extending into the liner portion 140L from the first doped region 140Pd and formed in the liner portion 140L.

In the example embodiment, the insulating structure 124 may oppose the doped regions 140Ld and 140Pd. A lower surface of the insulating structure 124 may be disposed on a higher level than a contact region 140J.

The vertical structure VS may further include a core pattern 142, and a dielectric structure 138 surrounding an external side surface of the semiconductor pattern 140. The semiconductor pattern 140 may surround side surfaces of the core pattern 142 and may cover an upper surface of the core pattern 142. The semiconductor pattern 140 may surround side surfaces of the core pattern 142 and may extend to a region between a lower surface of the core pattern 142 and the lower structure 50. The core pattern 142 may be formed of an insulating material, a silicon oxide, for example. The liner portion 140L of the semiconductor pattern 140 may be disposed to surround side surface of the core pattern 142, and the pad portion 140P of the semiconductor pattern 140 may be disposed on the core pattern 142.

Figure 7:
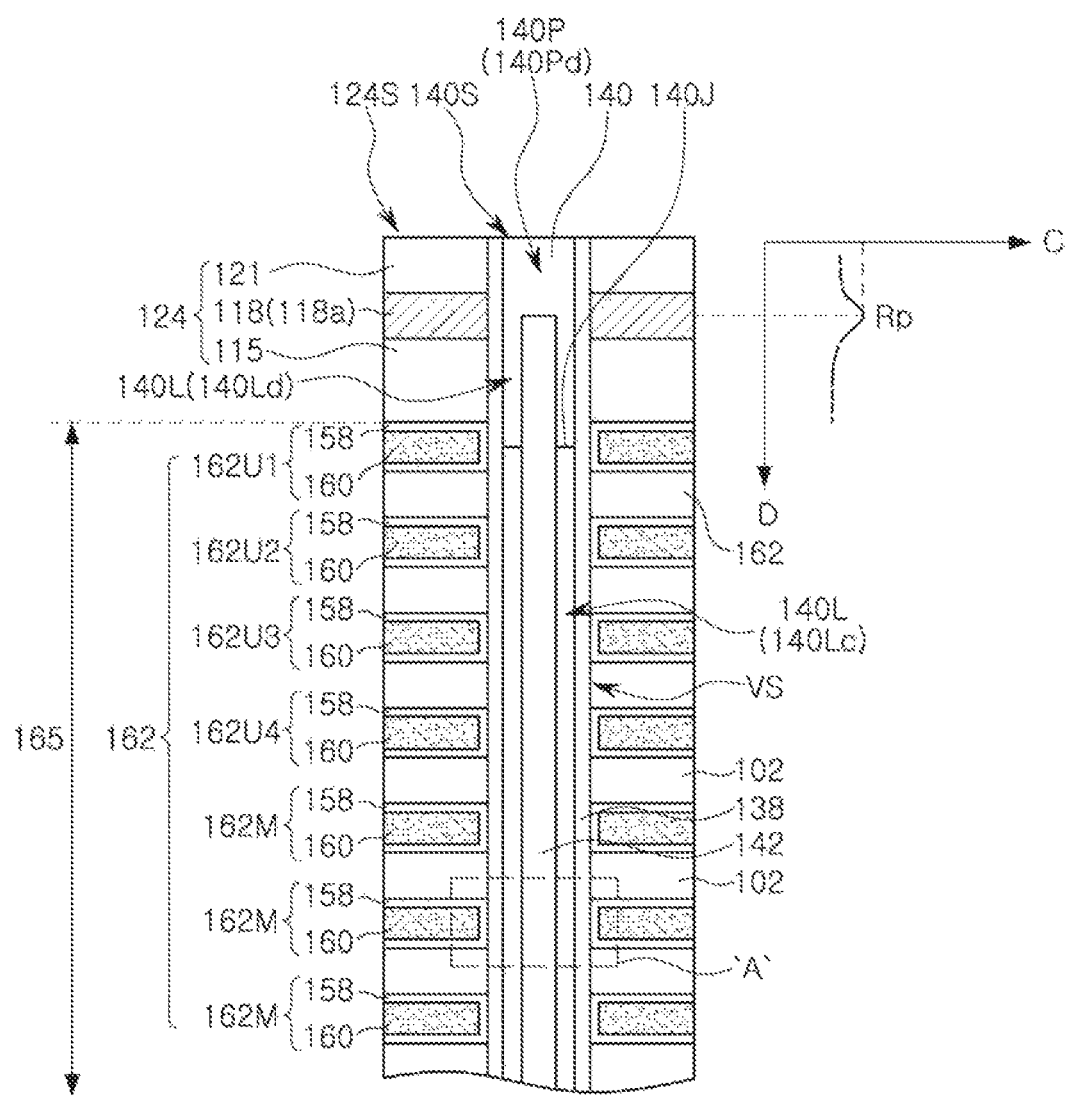
FIG. 7 is a cross-sectional diagram illustrating an example of a semiconductor device and a graph illustrating an example of a doping profile of a portion of the semiconductor device according to an example embodiment of the present application.
Figure 8:
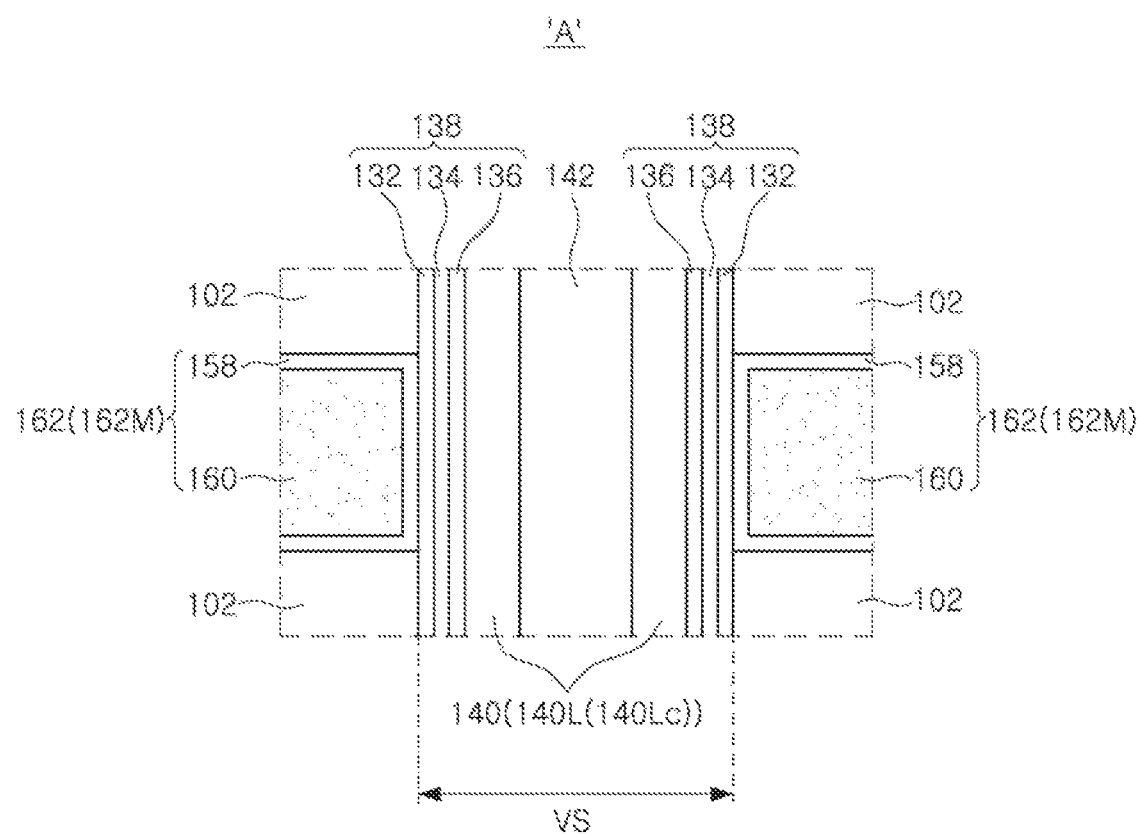
FIG. 8 is an enlarged diagram illustrating an example of a portion of a semiconductor device according to an example embodiment of the present application.
Figure 9:
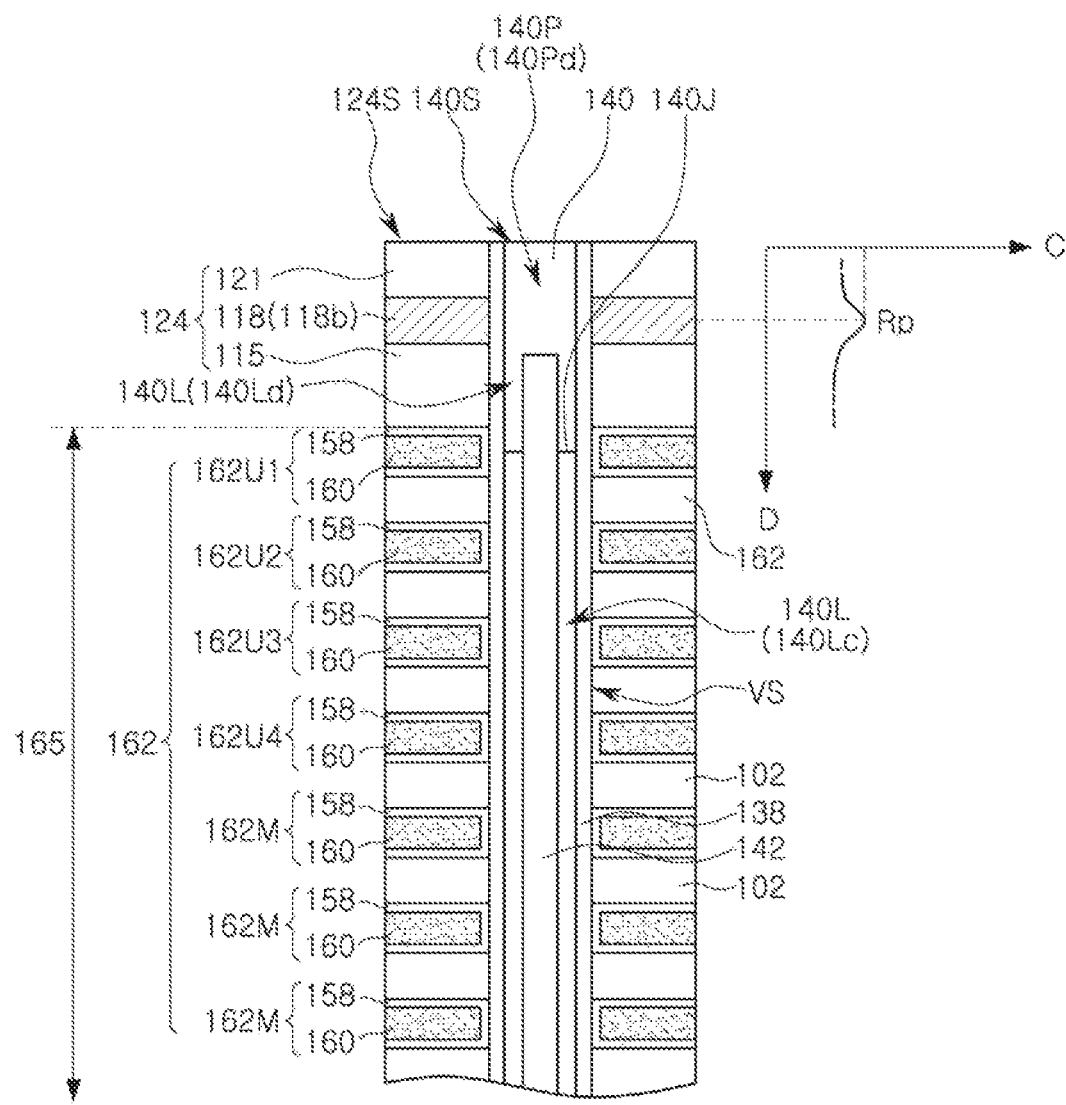
FIG. 9 is a cross-sectional diagram illustrating a modified example of a semiconductor device and a graph illustrating an example of a doping profile of a portion of the cross-sectional diagram according to an example embodiment of the present application.
Figure 10:
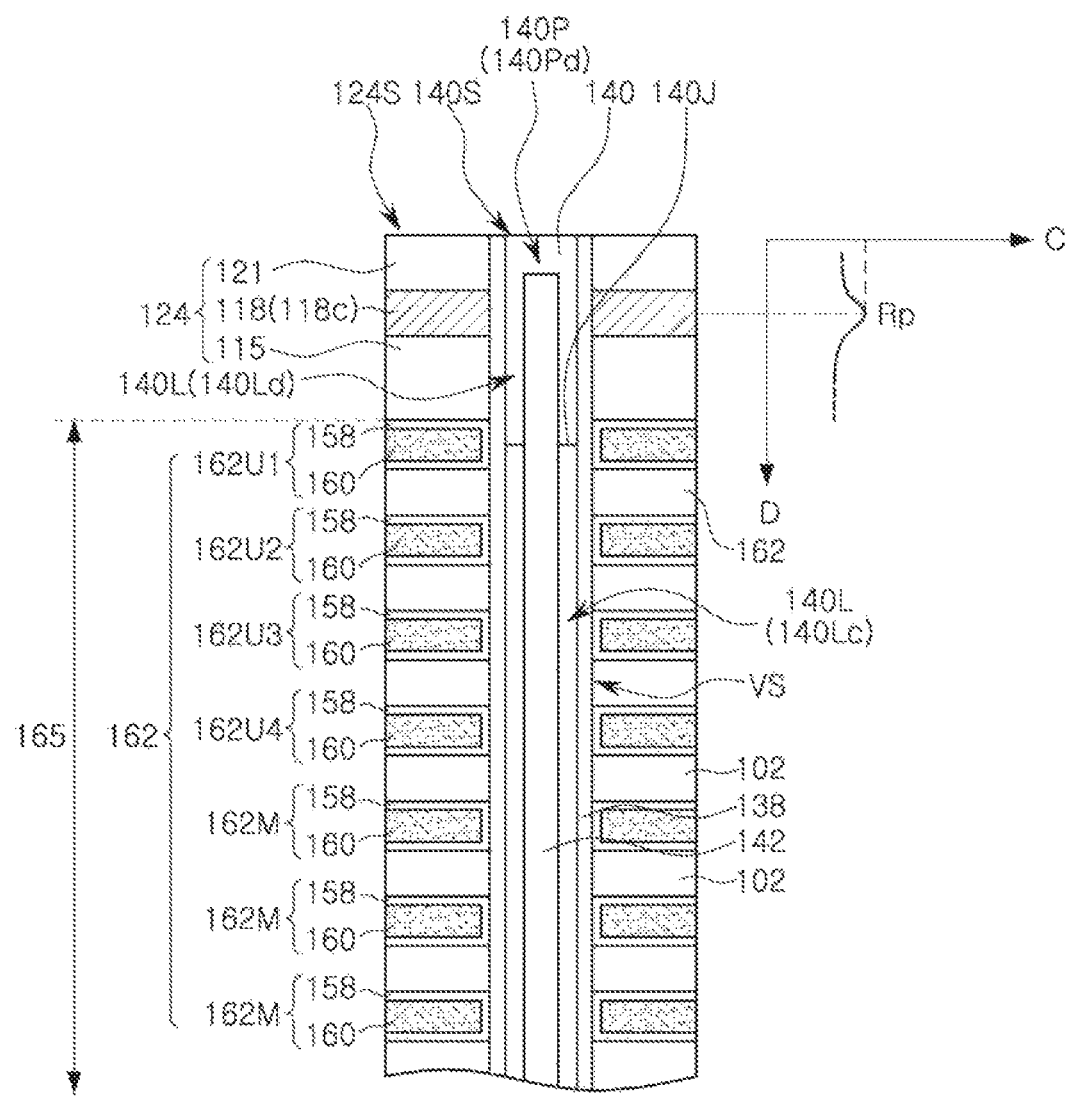
FIG. 10 is a cross-sectional diagram illustrating a modified example of a semiconductor device and a graph illustrating an example of a doping profile of a portion of the cross-sectional diagram according to an example embodiment of the present application.
Figure 11:
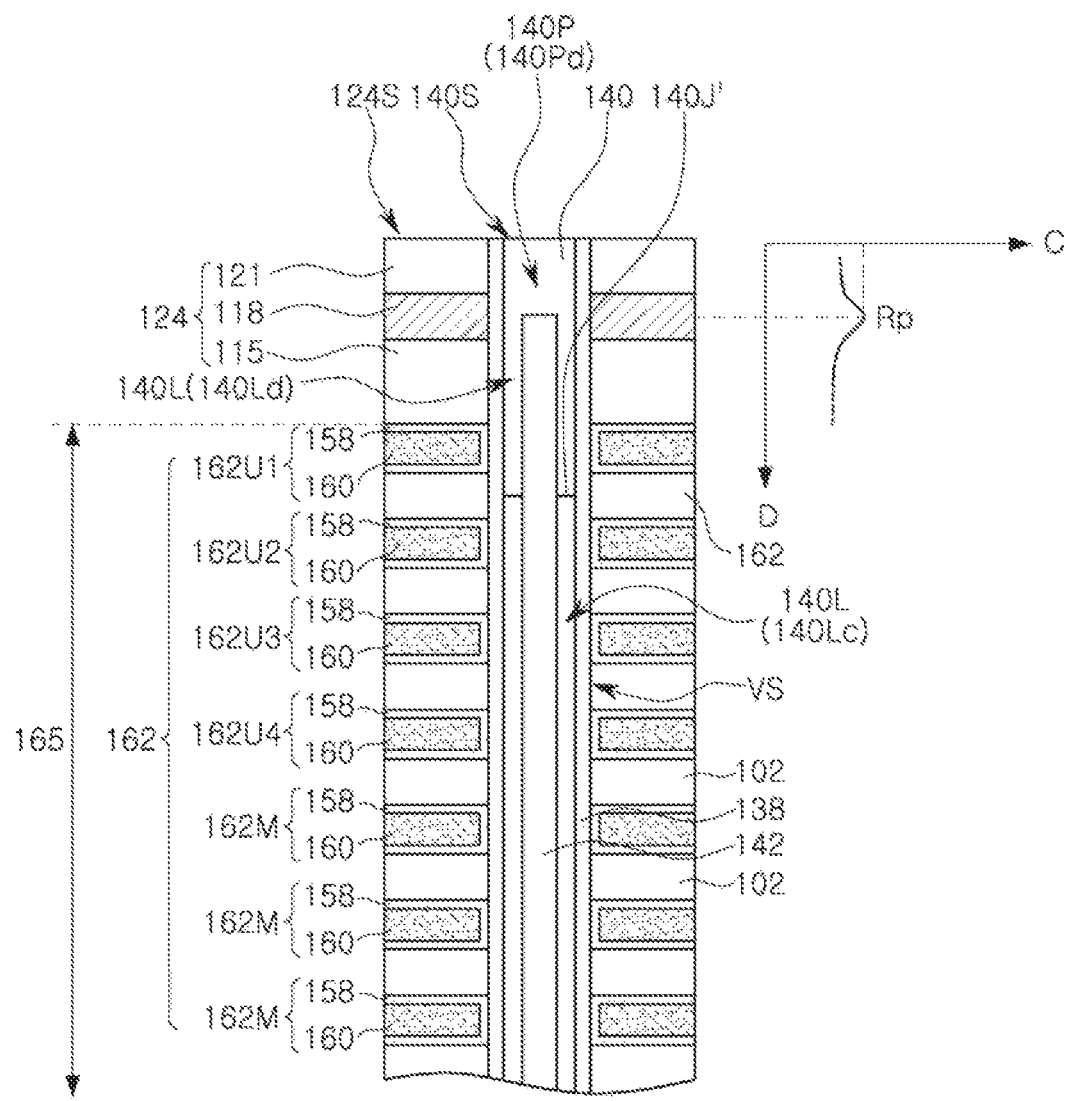
FIG. 11 is a cross-sectional diagram illustrating a modified example of a semiconductor device and a graph illustrating an example of a doping profile of a portion of the cross-sectional diagram according to an example embodiment of the present application.

In the description below, various examples of the stack structure 165, the insulating structure 124, and the vertical structure VS will be described with reference to FIGS. 7, 8, 9, 10, and 11. FIG. 7 is a cross-sectional diagram illustrating an example of a semiconductor device and a graph illustrating an example of a doping profile of a portion of the cross-sectional diagram according to an example embodiment. FIG. 8 is an enlarged diagram illustrating a portion marked "A" illustrated in FIG. 7. FIG. 9 is a cross-sectional diagram illustrating a modified example of a semiconductor device and a graph illustrating an example of a doping profile of a portion of the cross-sectional diagram according to an example embodiment. FIG. 10 is a cross-sectional diagram illustrating another modified example of a semiconductor device and a graph illustrating an example of a doping profile of a portion of the cross-sectional diagram according to an example embodiment. FIG. 11 is a cross-sectional diagram illustrating another modified example of a semiconductor device and a graph illustrating an example of a doping profile of a portion of the cross-sectional diagram according to an example embodiment. The cross-sectional diagram in FIG. 7 may be the cross-sectional surface from portions of the plurality of interlayer gate layers 162M described with reference to FIG. 6 to an upper surface of the insulating structure 124 described with reference to FIG. 6. In the graphs representing doping profiles of FIGS. 7, 9, 10, and 11, a "C" axis may represent doping concentration, and a "D" axis may represent a depth taken in a direction of the stack structure 165 from an upper surface of the insulating structure 124.

Examples of the stack structure 165, the insulating structure 124, and the vertical structure VS will be described with reference to FIG. 7.

Referring to FIG. 7, the stack structure 165, the insulating structure 124, and the vertical structure VS as in the example embodiment described with reference to FIG. 6 may be disposed. The stack structure 165 may include the gate layers 162 as described above. Each of the gate layers 162 may include a first material layer 158 and a second material layer 160. The first material layer 158 may cover an upper surface and a lower surface of the second material layer 160, and may extend to a region between a side surface of the second material layer 160 and a side surface of the vertical structure VS.

In the example embodiment, the first material layer 158 may be formed of a dielectric material such as an aluminum oxide, and the like, and the second material layer 160 may be formed of a conductive material including one of or two or more of a doped silicon, a metal nitride (e.g., TiN, and the like), and a metal (e.g., W, and the like).

In another example embodiment, the first material layer 158 may be formed of a conductive material such as a metal nitride (e.g., TiN, and the like), and the like, and the second material layer 160 may be formed of a conductive material such as a metal (e.g., W, and the like), and the like.

As described with reference to FIG. 6, the insulating structure 124 may include the lower insulating layer 115, the intermediate insulating layer 118, and the upper insulating layer 121 staked in order, and the vertical structure VS may include the channel region 140Lc and the doped regions 140Ld and 140Pd formed in the semiconductor pattern 140. The doped regions 140Ld and 140Pd may include the first doped region 140Pd formed in the pad portion 140P of the semiconductor pattern 140, and the second doped region 140Ld formed in the liner portion 140L of the semiconductor pattern 140.

In the example embodiment, a contact region 140J between the second doped region 140Ld and the channel region 140Lc may be disposed on a lower level than an upper surface of the first upper gate layer 162U1 positioned on the highest level among the gate layers 162. For example, the contact region 140J may be positioned on a level between an upper surface of the first upper gate layer 162U1 and a lower surface of the first upper gate layer 162U1.

The doped regions 140Ld and 140Pd and the insulating structure 124 may include a first element implanted from an upper surface 140S of the semiconductor pattern 140 and an upper surface 124S of the insulating structure 124 through an ion implantation process.

In the example embodiment, the first element may be doped to have Gaussian distribution or distribution similar to Gaussian distribution in the insulating structure 124.

In the example embodiment, a doping profile of the first element may have the maximum concentration at a first depth Rp from the upper surface 140S of the semiconductor pattern 140 and the upper surface 124S of the insulating structure 124 in the insulating structure 124. The upper surface 140S of the semiconductor pattern 140 and the upper surface 124S of the insulating structure 124 may be coplanar with each other. The first depth Rp may be positioned between an upper surface and a lower surface of the intermediate insulating layer 118. Thus, the first element in the insulating structure 124 may have the maximum concentration in the intermediate insulating layer 118. Concentration of the first element in the insulating structure 124 may be higher in the intermediate insulating layer 118 than in the lower and upper insulting layers 115 and 121.

In the example embodiment, the first element may be a group-5 element (e.g., phosphorus (P), arsenic (As), or the like) in the periodic table. Accordingly, the doped regions 140Ld and 140Pd may have N-type conductivity.

In the example embodiment, the insulating structure 124 may be substantially the same as the insulating structure 24 (in FIGS. 4 and 5) disposed in the memory cell array region 20 described with reference to FIGS. 4 and 5, and the insulating structure 24 (in FIGS. 4 and 5) may thus include the first element, and doping concentration of the first element of the insulating structure 24 (in FIGS. 4 and 5) may be the highest in the intermediate insulating layers 18 and 18' (in FIGS. 4 and 5, respectively) than in the first lower insulating layer 15a (in FIGS. 4 and 5) and the upper insulating layer 21 (in FIGS. 4 and 5).

In the description below, it may be understood that the intermediate insulating layer 118 may include the first element, and that doping concentration of the first element in the insulating structure 124 may be the highest in the intermediate insulating layer 118 than in the lower and upper insulating layers 115 and 121. Thus, although the descriptions thereof is not provided, it may be understood that the insulating structure 124 or an insulating structure corresponding to the insulating structure 124 may have the concentration distribution of the first element described above.

In the example embodiment, the intermediate insulating layer 118 may be an intermediate insulating layer 118a configured to surround a boundary region between the pad portion 140P and the liner portion 140L of the semiconductor pattern 140. The intermediate insulating layer 118a may surround an upper surface of the core pattern 142. Thus, the intermediate insulating layer 118a may be disposed on the same level as a portion of the pad portion 140P and a portion of the liner portion 140L.

In the description below, an example of the dielectric structure 138 will be described with reference to FIG. 8.

Referring to FIG. 8, the dielectric structure 138 may include a first dielectric layer 132, a data storage layer 134, and a second dielectric layer 136. The data storage layer 134 may be disposed between the first and second dielectric layers 132 and 136. The first dielectric layer 132 may be disposed between the data storage layer 134 and the gate layers 162, and may extend to a region between the data storage layer 134 and the interlayer insulating layers 102. The second dielectric layer 136 may be disposed between the semiconductor pattern 140 and the data storage layer 134.

In the example embodiment, the data storage layer 134 may be used as a data storage region of a memory cell of a NAND fresh memory device. For example, regions of the data storage layer 134 opposing intermediate gate layers used as the word lines WL (in FIG. 1) among the interlayer gate layers 162M may be "data storage regions," and may be included in the memory cells MC (in FIG. 1) illustrated in the example in FIG. 1. The data storage layer 134 may be formed of a material which may trap electric charge, such as a silicon nitride, for example. The first dielectric layer 132 may be a blocking layer, and the second dielectric layer 136 may be a tunneling layer. The dielectric structure 138 may be referred to as a "gate dielectric."

In the description below, various modified examples of levels (height) of the pad portion 140P of the vertical structure VS and the intermediate insulating layer 118 of the insulating structure 124 will be described with reference to FIGS. 9 and 10, respectively.

In the modified example, referring to FIG. 9, the intermediate insulating layer 118 of the insulating structure 124 may be positioned on a higher level than the liner portion 140L, and may be an intermediate insulating layer 118b surrounding a portion of the pad portion 140P. A thickness of the intermediate insulating layer 118b may be less than a thickness of the pad portion 140P.

In another modified example, referring to FIG. 10, the intermediate insulating layer 118 of the insulating structure 124 may be positioned on a lower level than the pad portion 140P, and may be an intermediate insulating layer 118c surrounding a portion of the liner portion 140L.

In the description below, a modified example of the contact region 140J between the second doped region 140Ld and the channel region 140Lc will be described with reference to FIG. 11.

In the modified example, referring to FIG. 11, a contact region 140J' between the second doped region 140Ld and the channel region 140Lc may be positioned on a lower level than the first upper gate layer 162U1 positioned on the highest level among the gate layers 162. For example, the contact region 140J' between the second doped region 140Ld and the channel region 140Lc may be positioned on a level between the first upper gate layer 162U1 positioned on the highest level among the gate layers 162 and the second upper gate layer 162U2 positioned on the second highest level among the gate layers 162.

Referring back to FIG. 6, in the example embodiment, a thickness 115ta of the lower insulating layer 115 may be greater than a thickness 118ta of the intermediate insulating layer 118, a thickness 121ta of the upper insulating layer 121, a thickness 102t of each of the interlayer insulating layers 102, and a thickness 162t of each of the gate layers 162. The thickness 121ta of the upper insulating layer 121 may be greater than the thickness 118ta of the intermediate insulating layer 118. The thickness 118ta of the intermediate insulating layer 118 may be greater than the thickness 102t of each of the interlayer insulating layers 102. The thickness 118ta of the intermediate insulating layer 118 may be the same or greater than the thickness 162t of each of the gate layers 162.

In the description below, various modified examples of thicknesses of the lower insulating layer 115, the intermediate insulating layer 118, and the upper insulating layer 121 of the insulating structure 124 will be described with reference to FIGS. 12A to 12F. FIGS. 12A to 12F are cross-sectional diagrams illustrating portions of the lower insulating layer 115, the intermediate insulating layer 118, and the upper insulating layer 121 of the insulating structure 124, the first and second upper gate layers 162U1 and 162U2 of the stack structure 165, and the interlayer insulating layer 102 between the first and second upper gate layers 162U1 and 162U2.

Figure 12A:
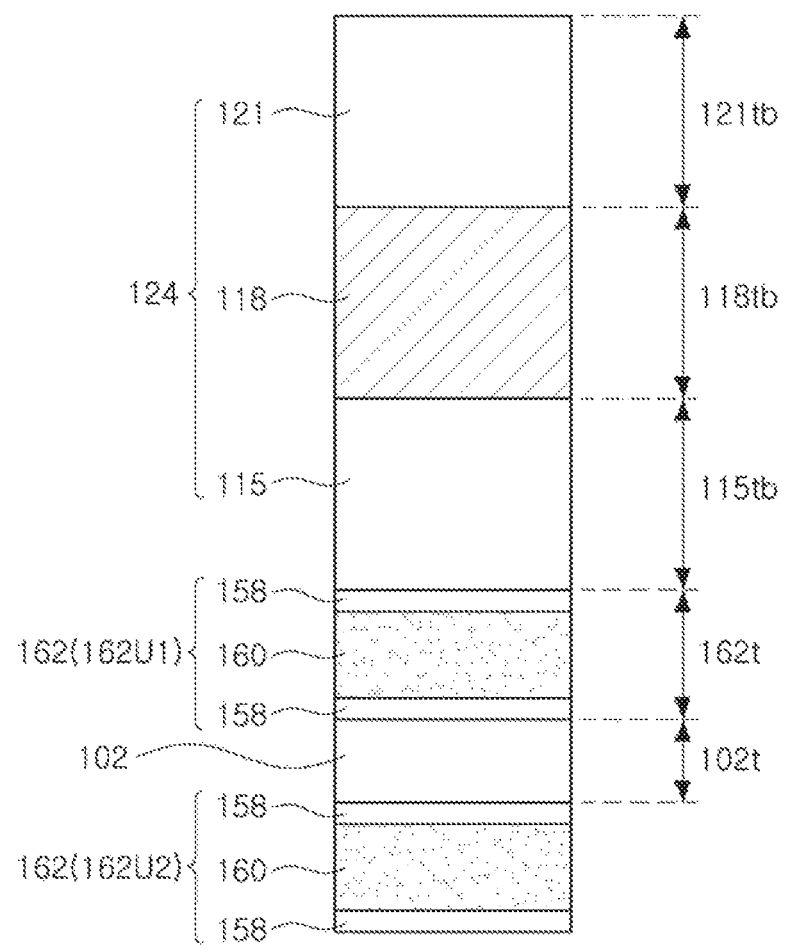
FIGS. 12A to 12F are cross-sectional diagrams illustrating various modified examples of portions of a semiconductor device according to an example embodiment of the present application.

In the modified example, referring to FIG. 12A, a thickness 115tb of the lower insulating layer 115, a thickness 118tb of the intermediate insulating layer 118, and a thickness 121tb of the upper insulating layer 121 may be substantially the same. The thickness 115tb of the lower insulating layer 115, the thickness 118tb of the intermediate insulating layer 118, and the thickness 121tb of the upper insulating layer 121 may be greater than a thickness 162t of each of the gate layers 162 and a thickness 102t of each of the interlayer insulating layers 102. In the example embodiment, the thickness 162t of each of the gate layers 162 may be greater than the thickness 102t of each of the interlayer insulating layers 102.

Figure 12B:
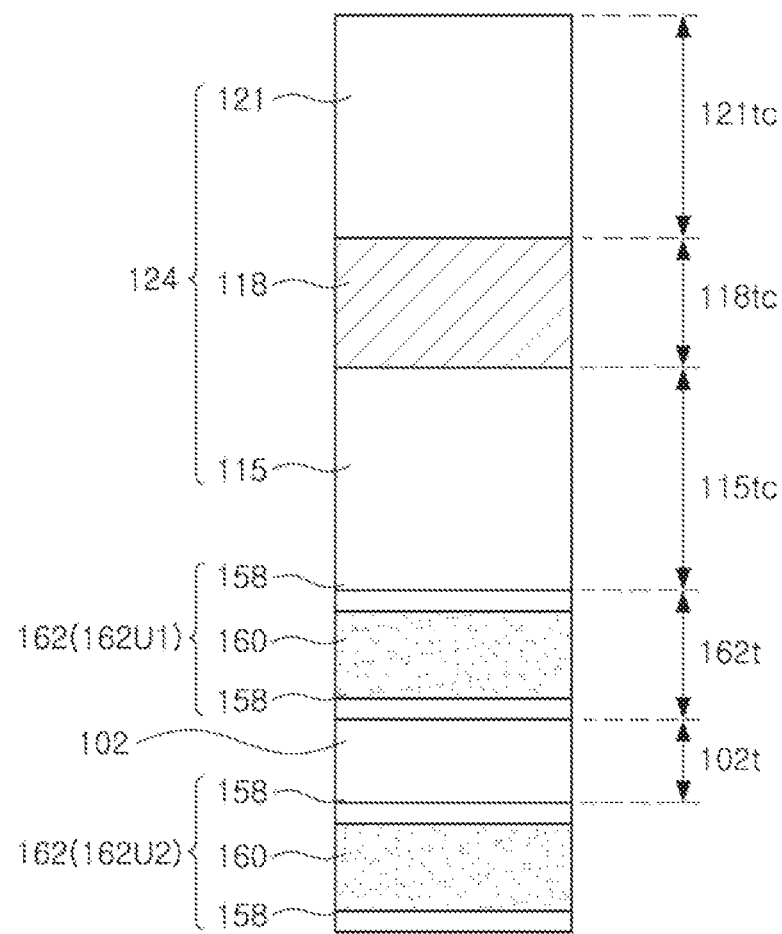

In another modified example, referring to FIG. 12B, a thickness 115tc of the lower insulating layer 115 may be less than a thickness 118tc of the intermediate insulating layer 118, and a thickness 121tc of the upper insulating layer 121. The thickness 118tc of the intermediate insulating layer 118 may be substantially the same as the thickness 121tc of the upper insulating layer 121.

Figure 12C:
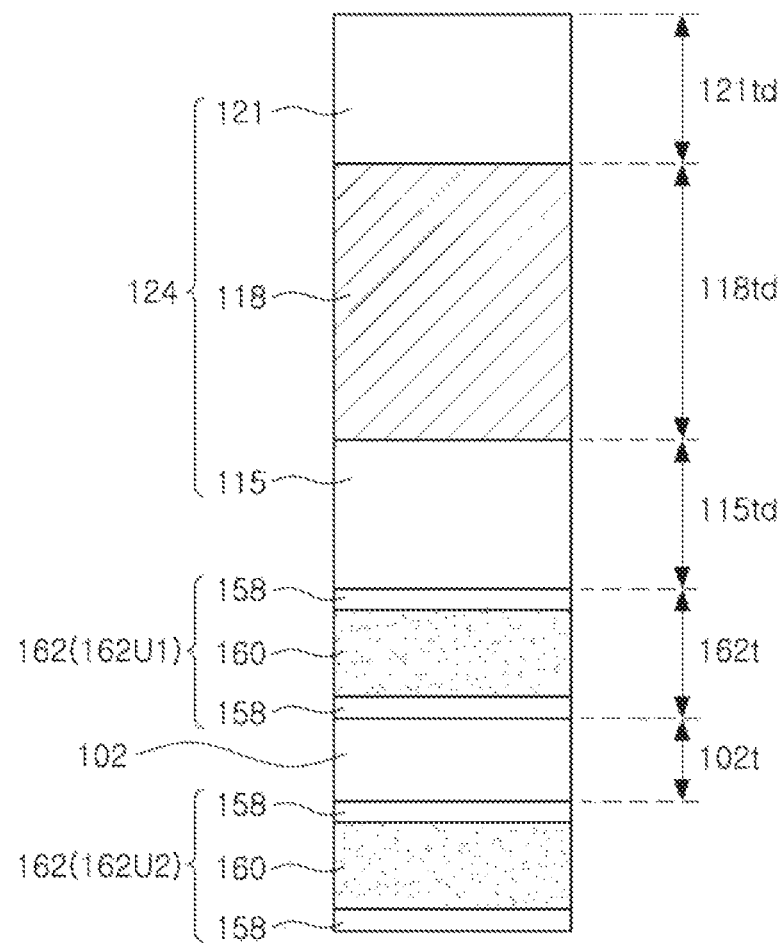

In another modified example embodiment, referring to FIG. 12C, a thickness 118td of the intermediate insulating layer 118 may be greater than a thickness 115tb of the lower insulating layer 115 and a thickness 12ltb of the upper insulating layer 121.

Figure 12D:
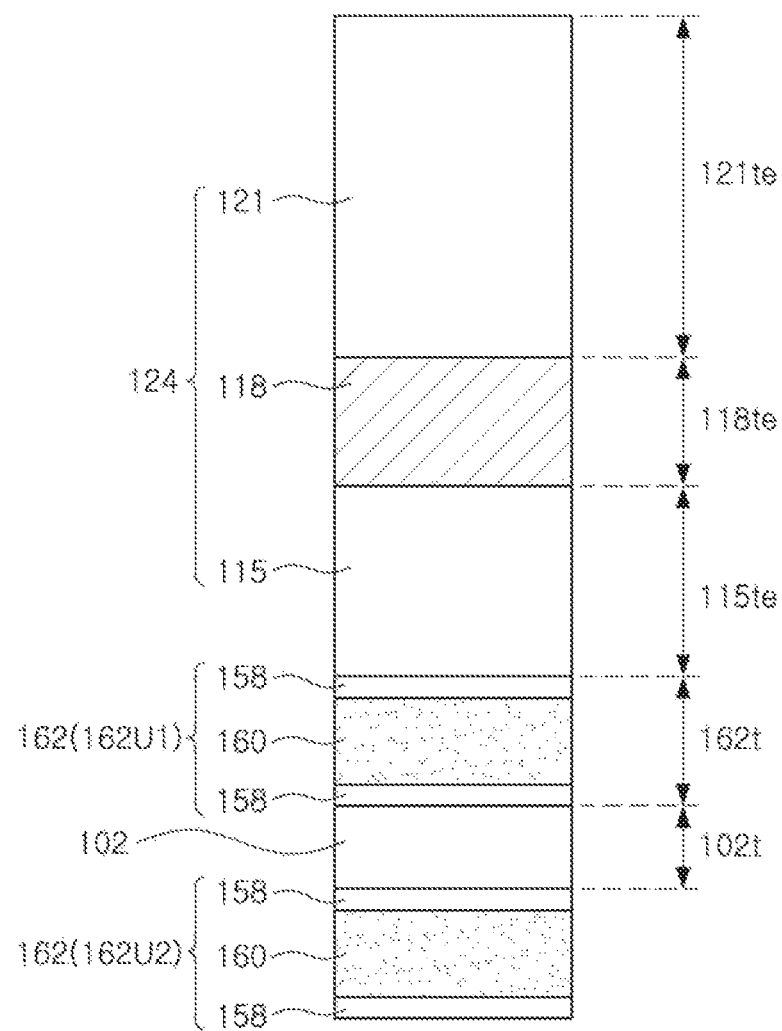

In another modified example embodiment, referring to FIG. 12D, a thickness 121te of the upper insulating layer 121 may be greater than a thickness 118te of the intermediate insulating layer 118 and a thickness 115te of the lower insulating layer 115. The thickness 115te of the lower insulating layer 115 may be greater than the thickness 118te of the intermediate insulating layer 118.

Figure 12E:
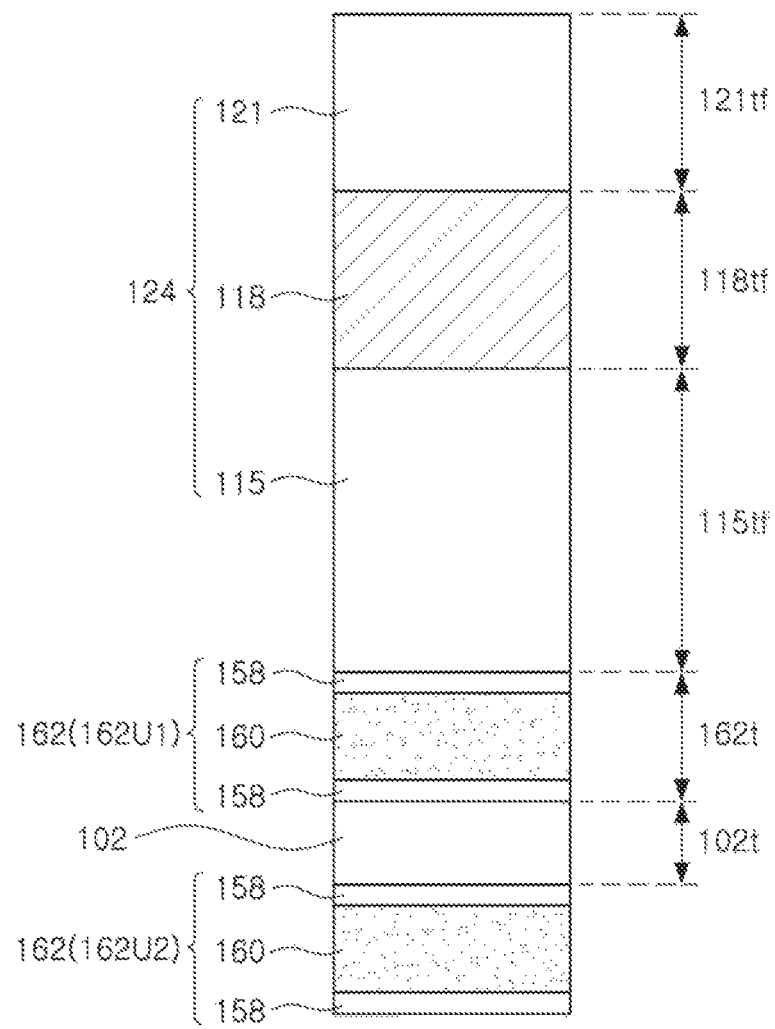

In another modified example, referring to FIG. 12E, a thickness 121tf of the upper insulating layer 121 and a thickness 118tf of the intermediate insulating layer 118 may be substantially the same, and a thickness 115tf of the lower insulating layer 115 may be greater than the thickness 121tf of the upper insulating layer 121 and the thickness 118tf of the intermediate insulating layer 118.

Figure 12F:
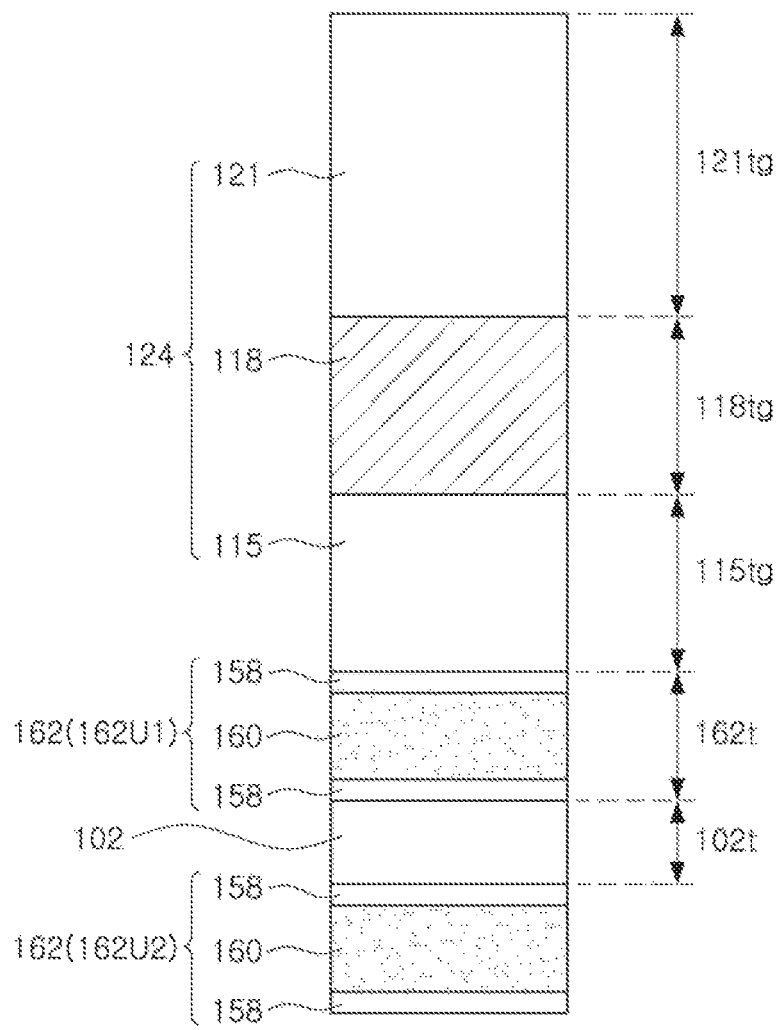

In another modified example, referring to FIG. 12F, a thickness 121tg of the upper insulating layer 121 may be greater than a thickness 118tg of the intermediate insulating layer 118 and a thickness 115tg of the lower insulating layer 115, and a thickness 118tg of the intermediate insulating layer 118 and the thickness 115tg of the lower insulating layer 115 may be substantially the same.

Figure 13:
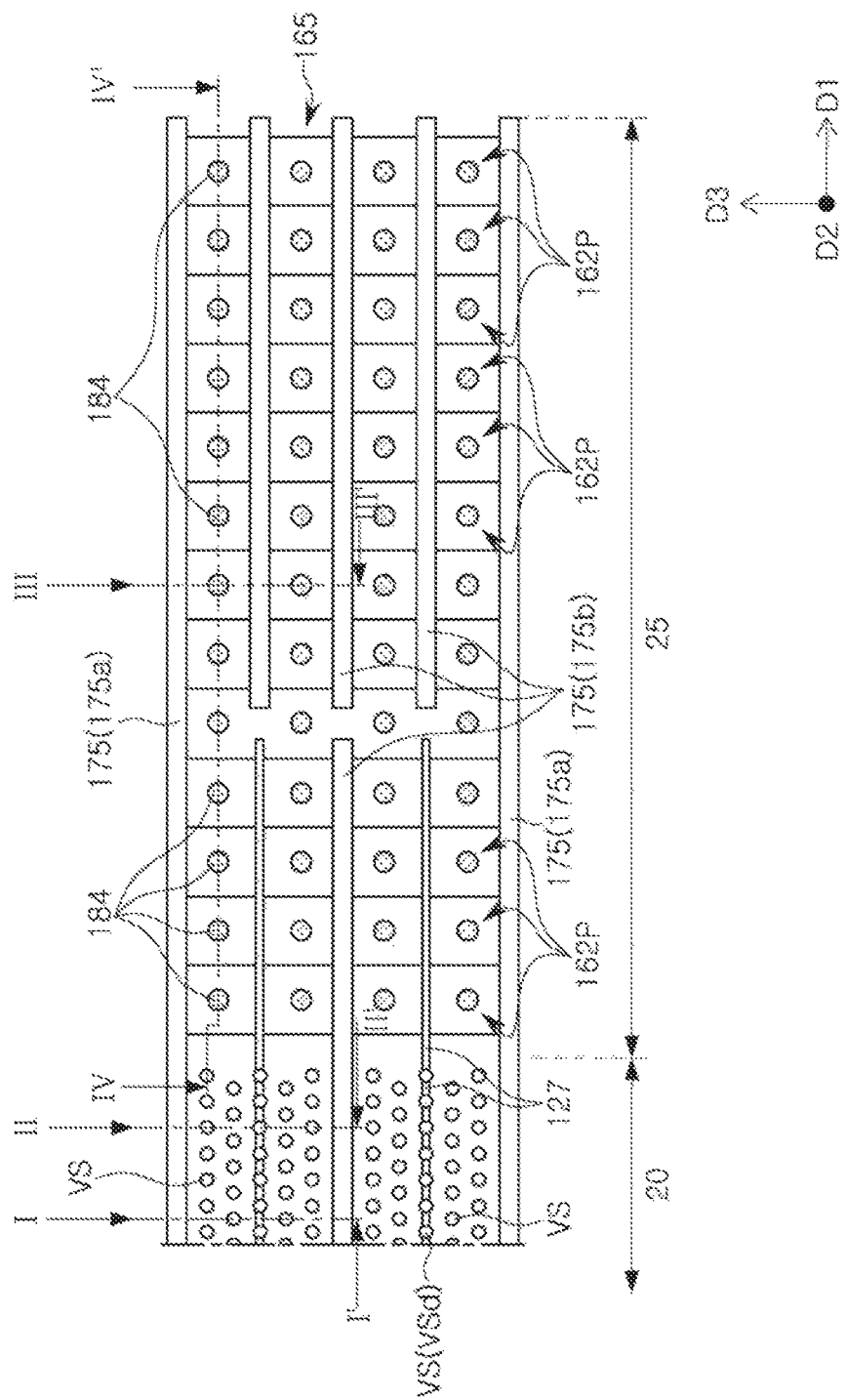
FIG. 13 is a plan diagram illustrating a semiconductor device according to an example embodiment of the present application.
Figure 14A:
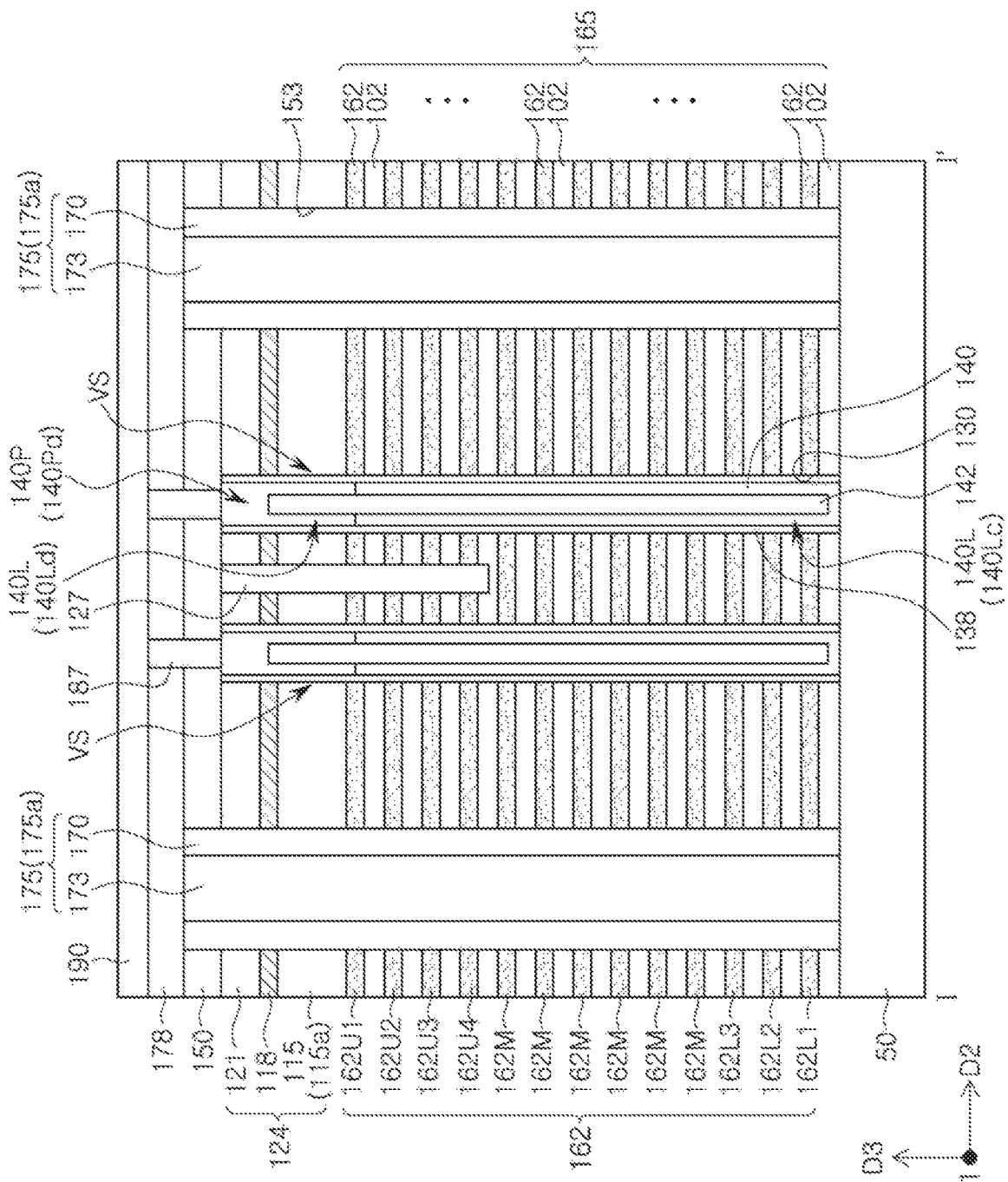
FIGS. 14A to 14D are cross-sectional diagrams illustrating an example of a semiconductor device.
Figure 14B:
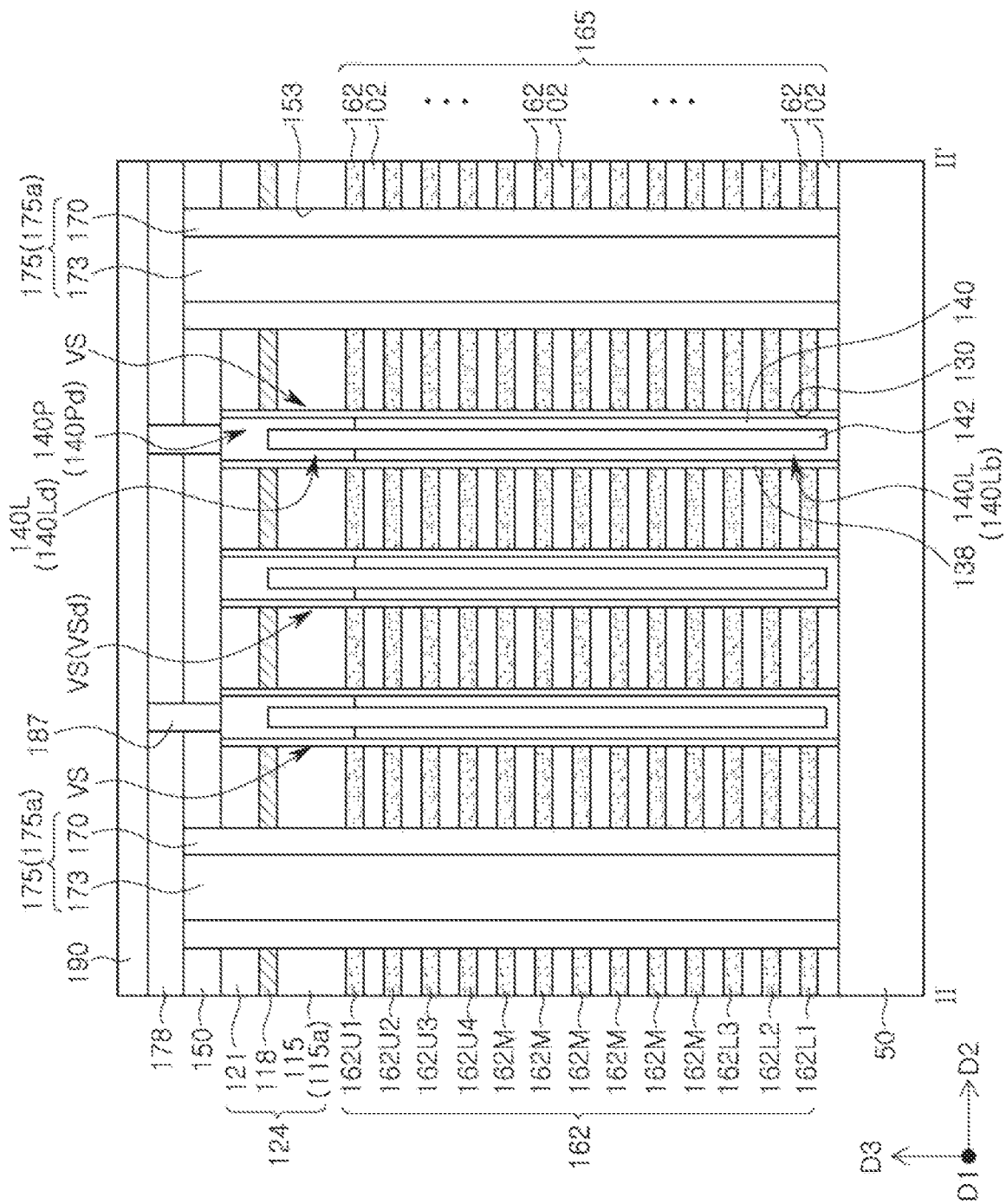
Figure 14C:
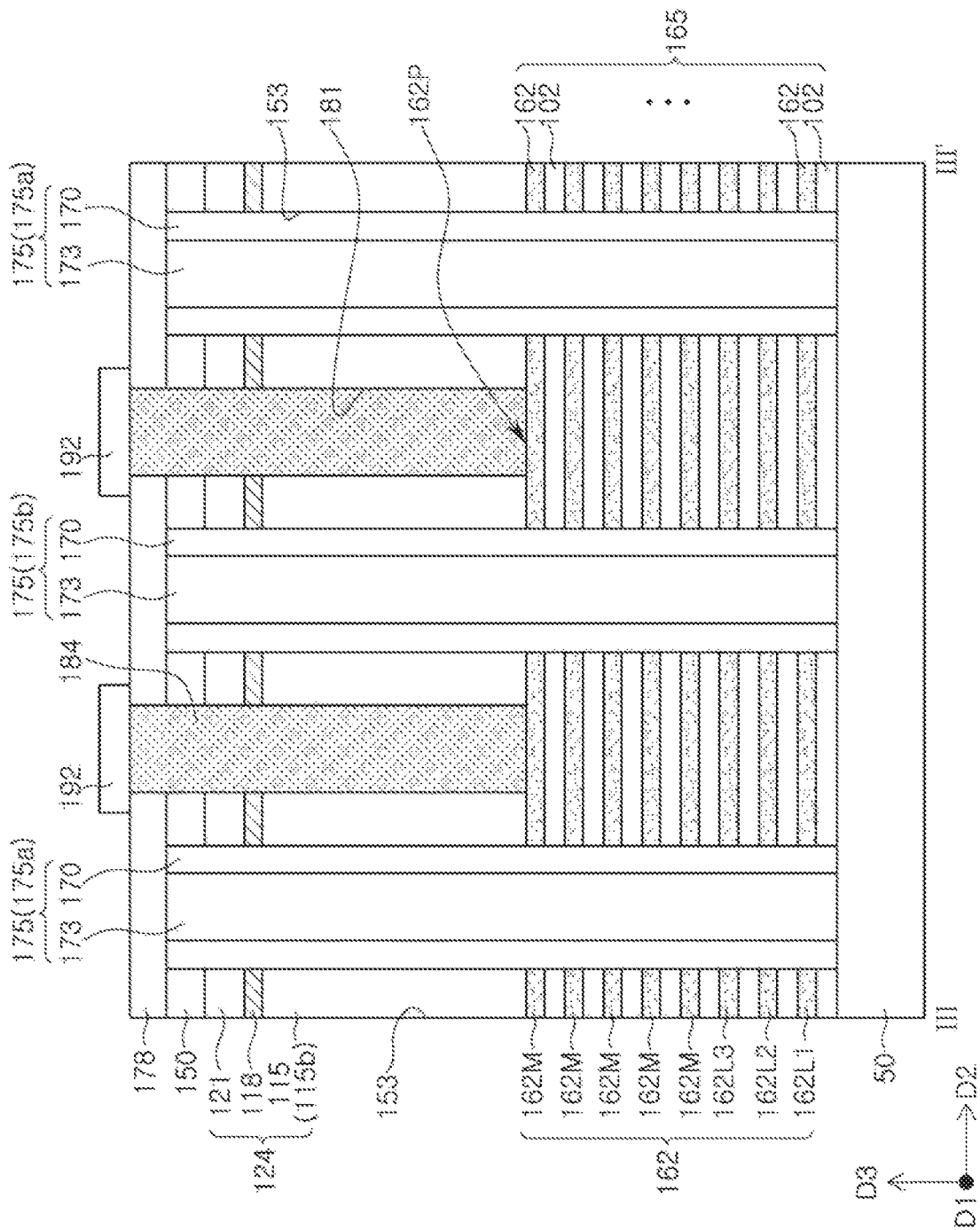
Figure 14D:
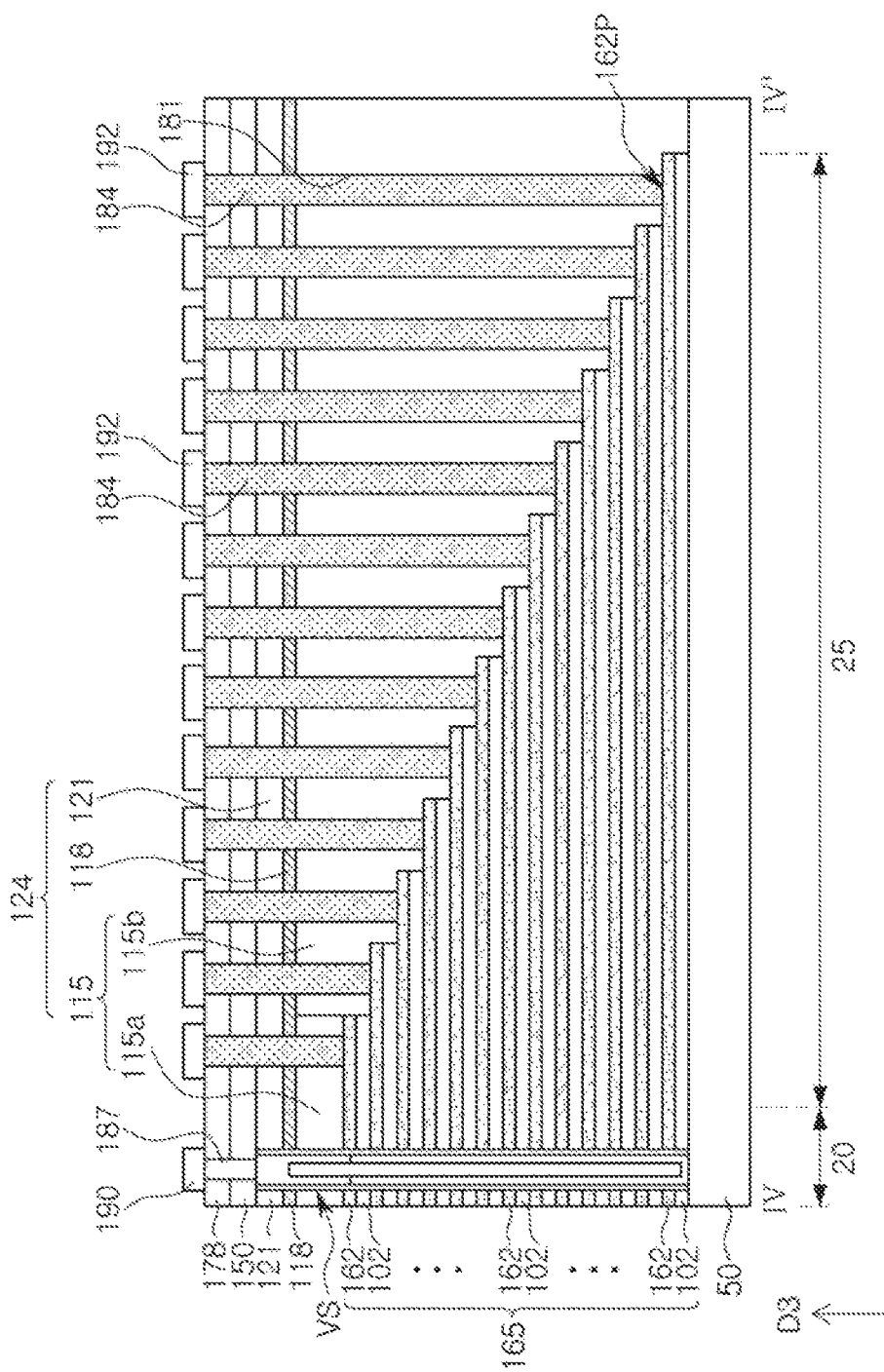

In the description below, an example of a semiconductor device will be described with reference to FIGS. 13, and 14A to 14D. With respect to FIGS. 13, and 14A to 14D, FIG. 13 is a plan diagram illustrating a semiconductor device 10c according to an example embodiment. FIG. 14A is a cross-sectional diagram illustrating a region taken along line I-I' in FIG. 13. FIG. 14B is a cross-sectional diagram illustrating a region taken along line II-II' in FIG. 13. FIG. 14C is a cross-sectional diagram illustrating a region taken along line III-III' in FIG. 13. FIG. 14D is a cross-sectional diagram illustrating a region taken along line IV-IV' in FIG. 13.

Referring to FIGS. 13, and 14A to 14D, a stack structure 165, an insulating structure 124, and a vertical structure VS may be disposed on a lower structure 50. The lower structure 50 may be the lower structure 50a illustrated in the example embodiment in FIG. 2, or may be the lower structure 50b illustrated in the example embodiment in FIG. 3.

The stack structure 165 may be disposed in a memory cell array region 20, and may extend into a connection region 25 from the memory cell array region 20.

The stack structure 165 may include interlayer insulating layers 102 and gate layers 162, alternately stacked. The interlayer insulating layers 102 may be formed of a silicon oxide.

In the memory cell array region 20, the gate layers 162 may include one or a plurality of the lower gate layers 162L1, 162L2, and 162L3, a plurality of the interlayer gate layers 162M, and one or a plurality of the upper gate layers 162U1, 162U2, 162U3, and 162U4, as in the aforementioned example embodiments described with reference to FIGS. 6 to 8.

In the connection region 25, the gate layers 162 may have pad regions 162P arranged in staircase form. Accordingly, the stack structure 165 may have a staircase form in the connection region 25.

In the example embodiment, the vertical structure VS may extend in a direction D3 perpendicular to an upper surface of the lower structure 50 and may penetrate the stack structure 165 and the insulating structure 124, and may include the semiconductor pattern 140, the core pattern 142, the dielectric structure 138, the channel region 140Lc, and the doped regions 140Ld and 140Pd, illustrated in the example in FIGS. 6 to 8.

The insulating structure 124 may include a lower insulating layer 115, an intermediate insulating layer 118, and an upper insulating layer 121, stacked in order. The lower insulating layer 115 may include a first lower insulating layer 115a and a second lower insulating layer 115b which may correspond to the first lower insulating layer 15a and the second lower insulating layer 15b illustrated in the example in FIG. 4, respectively. For example, the first lower insulating layer 115a may be disposed on the stack structure 165 in the memory cell array region 20, and the second lower insulating layer 115b may have an upper surface coplanar with an upper surface of the first lower insulating layer 115a and may be disposed on the stack structure 165 in the connection region 25.

In the example embodiment, the first lower insulating layer 115a may overlap and self-aligned with the first upper gate layer 162U1, an uppermost gate layer among the gate layers 162, and the second lower insulating layer 115b may have an upper surface coplanar with an upper surface of the first lower insulating layer 115a and may be disposed in the stack structure 165 in the connection region 25.

In the example embodiment, the intermediate insulating layer 118 may be in contact with the first and second lower insulating layers 115a and 115b.

In the example embodiment, an insulating pattern 127 (in FIG. 14A) penetrating the insulating structure 124 and penetrating one or a plurality of the upper gate layers 162U1, 162U2, 162U3, and 162U4.

A plurality of the vertical structures VS may be disposed. Among the plurality of the vertical structures VS, vertical structures penetrating or in contact with the insulating pattern 127 may be dummy vertical structures VSd (in FIG. 14B), and the remaining vertical structures may be memory cell vertical structures VS. The dummy vertical structures VSd among the plurality of the vertical structures VS may not include the memory cells MC (in FIG. 1) illustrated in the example in FIG. 1, and the remaining vertical structures may include the memory cells MC (in FIG. 1) illustrated in the example in FIG. 1.

A first capping insulating layer 150 and a second capping insulating layer 178, stacked in order, may be disposed on the insulating structure 124 and the vertical structure VS. The first and second capping insulating layers 150 and 178 may be formed of a silicon oxide.

Separation structures 175 extending in a direction D3 perpendicular to an upper surface of the lower structure 50 and penetrating the stack structure 165, the insulating structure 124, and the first capping insulating layer 150 may be disposed. Each of the separation structures 175 may include a separation core pattern 173 and a spacer layer 170 disposed on side surfaces of the separation core pattern 173. In an example embodiment, the spacer layer 170 may be formed of an insulating material such as a silicon oxide, and the like, and the separation core pattern 173 may be formed of a conductive material such as doped silicon or a metal. In another example embodiment, the separation core pattern 173 may be formed of an insulating material.

The separation structures 175 may include first separation structures 175a and second separation structures 175b disposed between the first separation structures 175a. The stack structure 165 may be disposed between the first separation structures 175a. As illustrated in FIG. 13, each of the first separation structures 175a may have a length taken in a first direction D1 greater than a length of each of the second separation structures 175b taken in a first direction D1. As illustrated in FIG. 13, portions of the second separation structures 175b may cross the memory cell array region 20 and may extend into a portion of the connection region 25, and the insulating pattern 127 may be disposed between the second separation structure 175b crossing the memory cell array region 20 and extending into a portion of the connection region 25 among the second separation structures 175b, and the first separation structures 175a.

Bit-line contact plugs 187 penetrating the first and second capping insulating layers 150 and 178 and electrically connected to the pad portions 140P of the vertical structure VS may be disposed.

In the connection region 25, gate contact plugs 184 penetrating the first and second capping insulating layers 150 and 178 and the insulating structure 124 and electrically connected to the pad regions 162P of the gate layers 162 may be disposed. Bit lines 190 may be disposed on the bit-line contact plugs 187, and gate connection wiring lines 192 may be disposed on the gate contact plugs 184.

Figure 15:
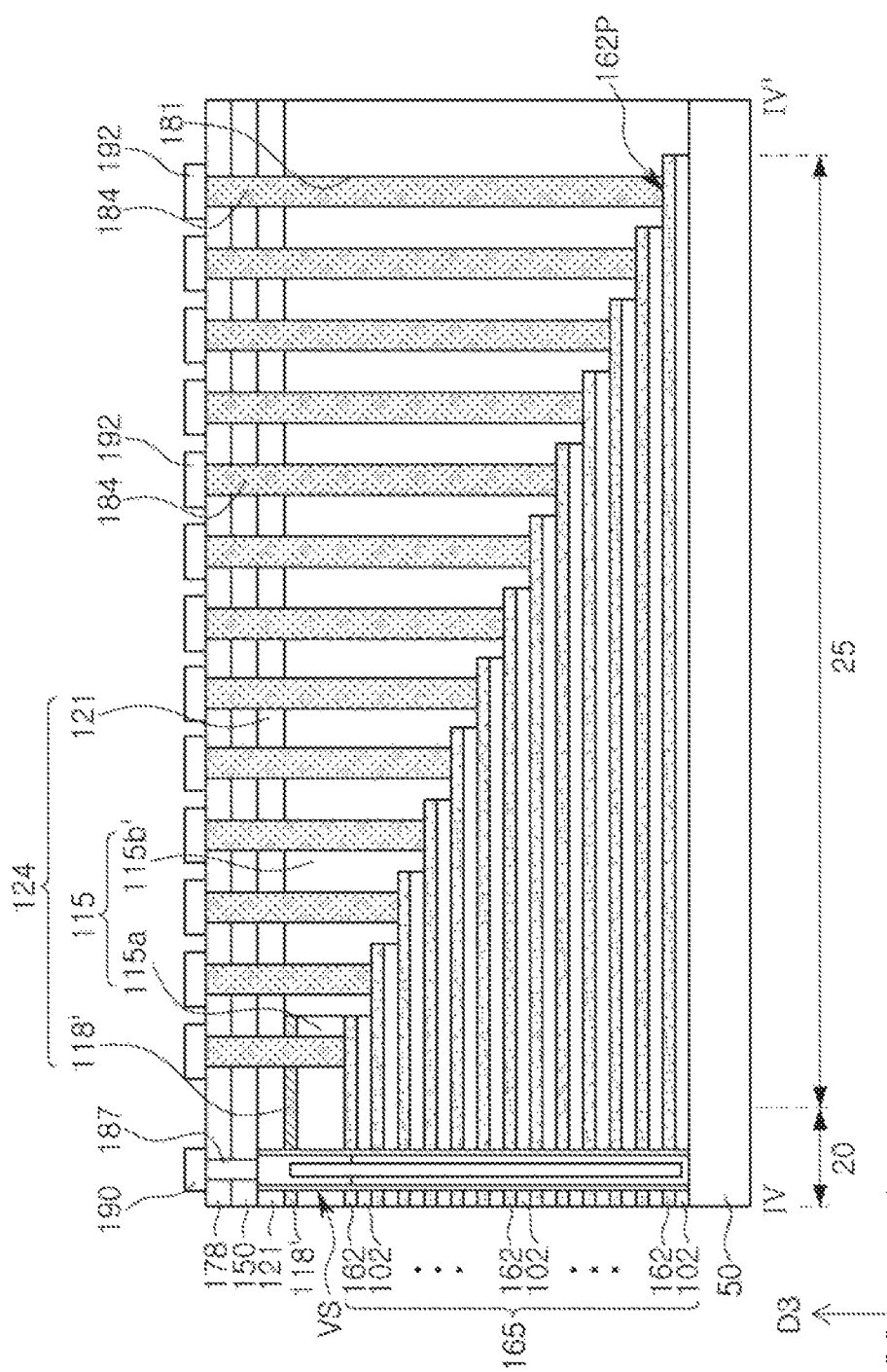
FIG. 15 is a cross-sectional diagram illustrating a modified example of a semiconductor device according to an example embodiment of the present application.

In the description below, a modified example of the insulating structure 124 will be described with reference to FIG. 15. FIG. 15 is a cross-sectional diagram illustrating a region taken along line IV-IV' in FIG. 13.

In the modified example embodiment, referring to FIG. 15, an insulating structure 124 may include a lower insulating layer 115, an intermediate insulating layer 118', and an upper insulating layer 121. The lower insulating layer 115 may include a first lower insulating layer 115a and a second lower insulating layer 115b' having different heights of upper surfaces. The first lower insulating layer 115a may be disposed on the stack structure 165 in the memory cell array region 20, and the intermediate insulating layer 118' may be self-aligned with the first lower insulating layer 115a. The second lower insulating layer 115b' may have an upper surface coplanar with an upper surface of the intermediate insulating layer 118'. The second lower insulating layer 115b' may be disposed on the staircase region 65s of the stack structure 65. The upper insulating layer 121 may be in contact with the second lower insulating layer 115b' and the intermediate insulating layer 118'.

Referring back to FIGS. 13 and 14A to 14D, the separation structures 175 may be in contact with the intermediate insulating layer 118. However, an example embodiment thereof is not limited thereto, and the separation structures 175 may be spaced apart from the intermediate insulating layer 118. One or more example configurations in which the separation structures 175 and the intermediate insulating layer 118 may be spaced apart from each other will be described with reference to FIGS. 16 and 17.

Figure 16:
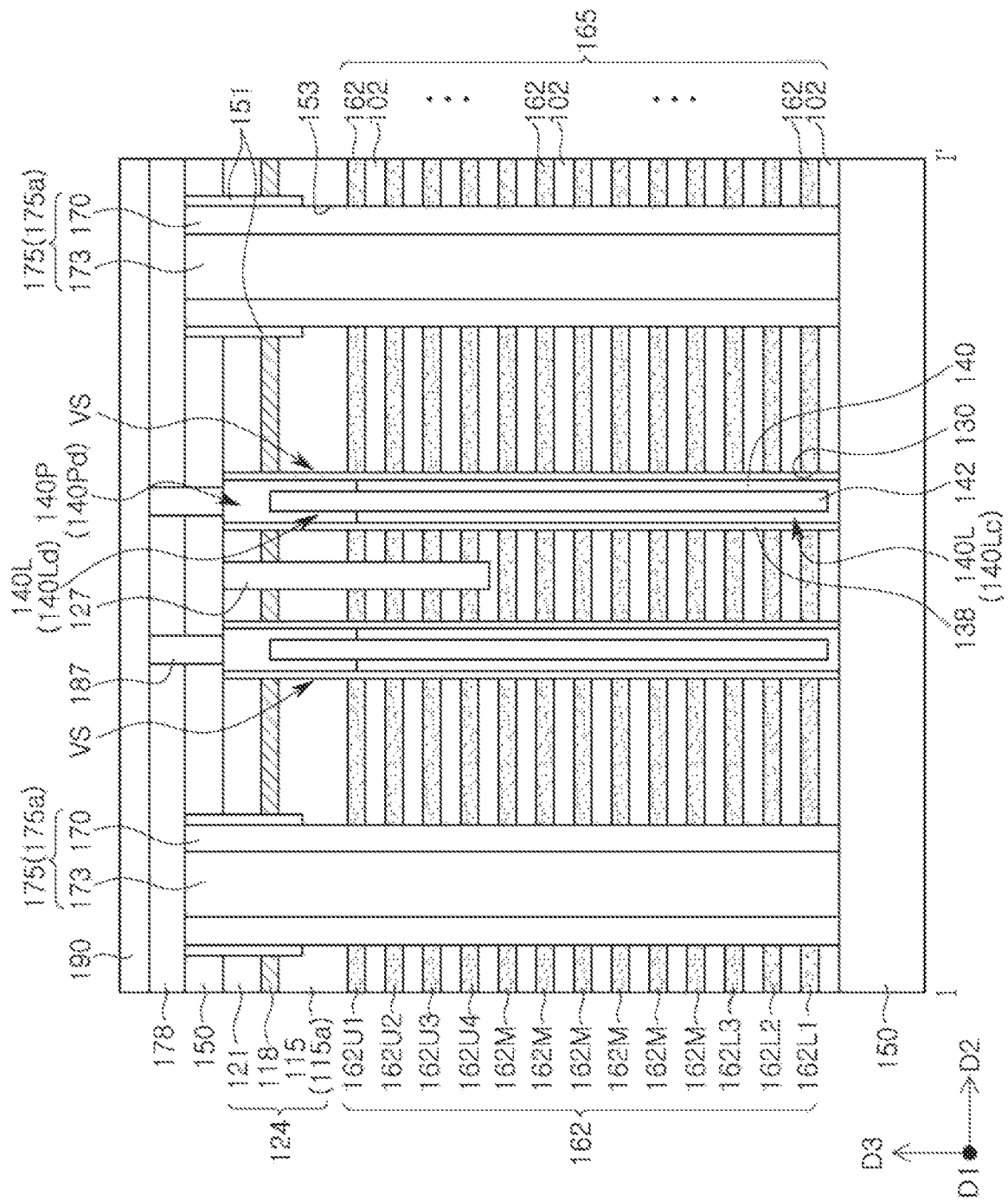
FIG. 16 is a cross-sectional diagram illustrating a modified example of a semiconductor device according to an example embodiment of the present application.
Figure 17:
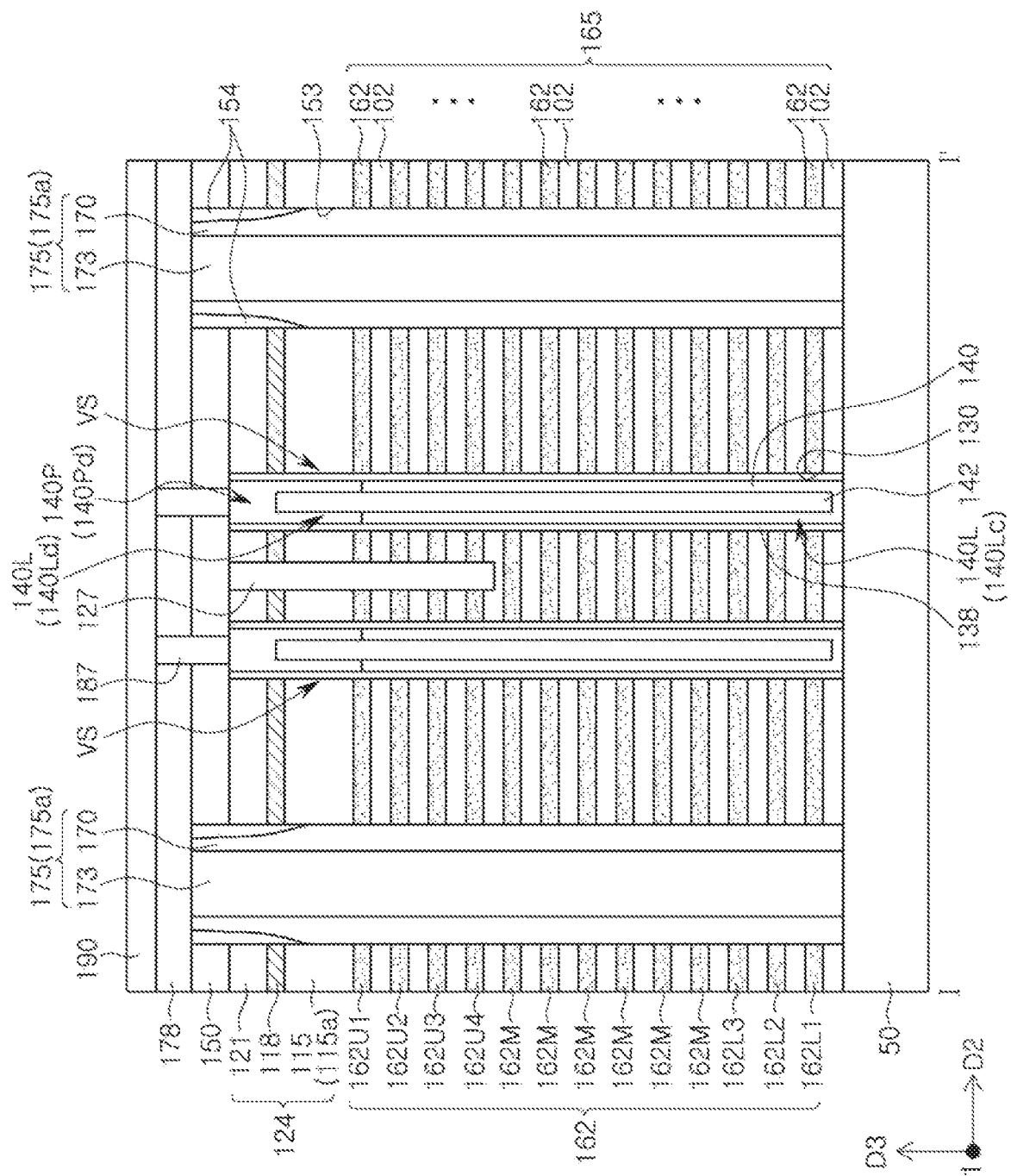
FIG. 17 is a cross-sectional diagram illustrating a modified example of a semiconductor device according to an example embodiment of the present application.

FIGS. 16 and 17 are cross-sectional diagrams illustrating a region taken along line I-I' in FIG. 13, illustrating one or more example configurations in which the separation structures 175 and the intermediate insulating layer 118 may be spaced apart from each other.

In the modified example, referring to FIG. 16, a buffer layer 151 may be disposed between the separation structures 175 and the intermediate insulating layer 118. The buffer layer 151 may be disposed on the stack structure 165. The buffer layer 151 may be disposed between the separation structures 175 and the intermediate insulating layer 118, may extend to a region between the separation structures 175 and the lower insulating layer 115, and may further extend to a region between the separation structures 175 and the intermediate insulating layer 118. Further, the buffer layer 151 may further extend to a region between the separation structures 175 and the first capping insulating layer 150.

The buffer layer 154 may be formed of an insulating material such as a silicon oxide or a silicon nitride, for example.

In the example embodiment, the buffer layer 151 may overlap the stack structure 165.

The buffer layer 151 may prevent defects between the doped regions 140Ld and 140Pd of the vertical structure VS, adjacent to each other, along with the intermediate insulating layer 118 of the insulating structure 124.

In another modified example, referring to FIG. 17, the separation structures 175 may be disposed in separation trenches 153 penetrating the stack structure 165, the insulating structure 124, and the first capping insulating layer 150. A buffer layer 154 covering upper side walls of the separation trenches 153 may be disposed. The buffer layer 154 may be positioned on a higher level than the stack structure 165. The buffer layer 154 may be formed of an insulating material such as a silicon oxide or a silicon nitride, for example. The buffer layer 154 may prevent defects between the doped regions 140Ld and 140Pd of the vertical structure VS, adjacent to each other, along with the intermediate insulating layer 118 of the insulating structure 124. The buffer layer 154 may be referred to as a "buffer layer."

Figure 18A:
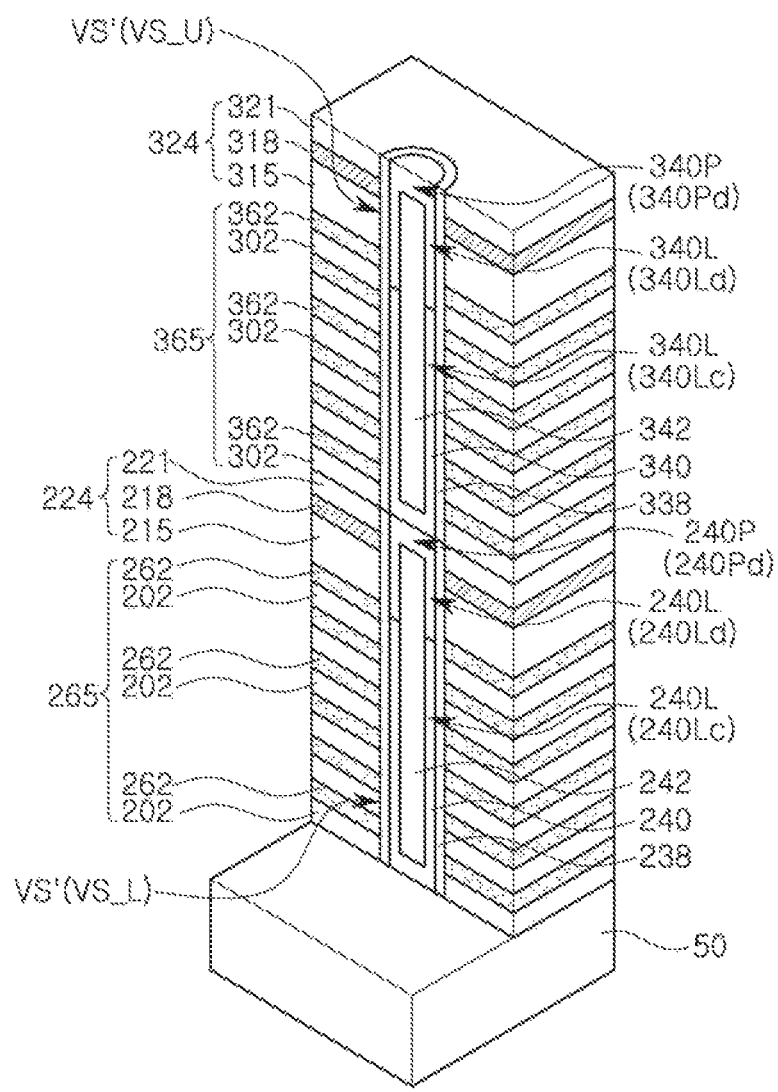
FIG. 18A is a perspective diagram illustrating a modified example of a semiconductor device according to an example embodiment of the present application.
Figure 18B:
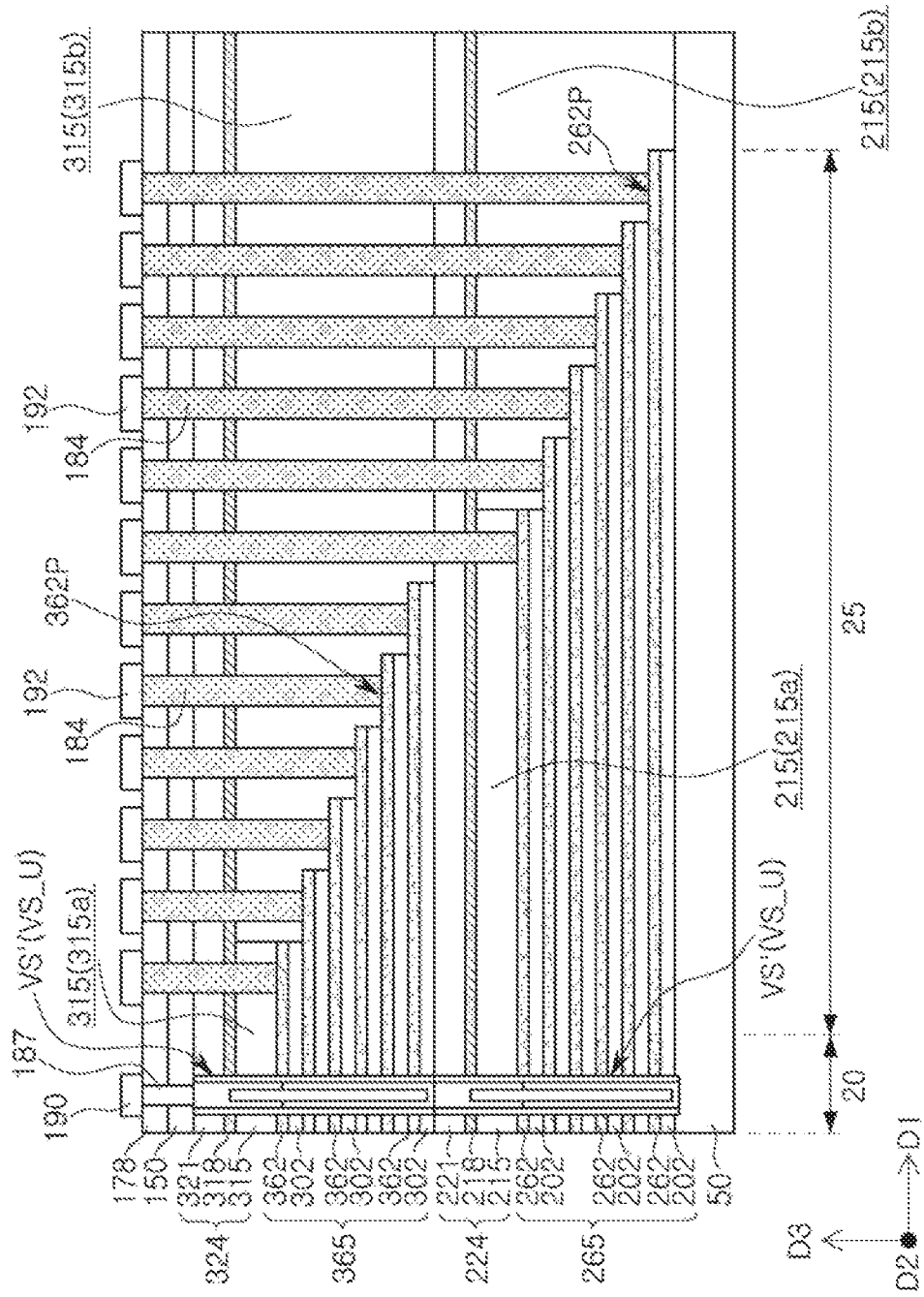
FIG. 18B is a cross-sectional diagram illustrating a modified example of a semiconductor device according to an example embodiment of the present application.

A modified example of a semiconductor device will be described with reference to FIGS. 18A and 18B. FIG. 18A is a perspective diagram illustrating a modified example of a semiconductor device disposed in the memory cell array region 20 described in the aforementioned example embodiment. FIG. 18B is a cross-sectional diagram illustrating a modified example of a semiconductor device disposed in the memory cell array region 20 and the connection region 25 described in the aforementioned example embodiment.

In the modified examples, referring to FIGS. 18A and 18B, a lower stack structure 265, a lower insulating structure 224, an upper stack structure 365, and an upper insulating structure 324 may be disposed on a lower structure 50. The lower stack structure 265, the lower insulating structure 224, the upper stack structure 365, and the upper insulating structure 324 may be disposed in the memory cell array region 20 (in FIG. 18B) and may extend into the connection region 25 (in FIG. 18B). The lower stack structure 265 may have lower pad regions 262P (in FIG. 18B) arranged in staircase form in the connection region 25 (in FIG. 18B), and the upper stack structure 365 may have upper pad regions 362P (in FIG. 18B) arranged in staircase form in the connection region 25 (in FIG. 18B).

Each of the lower and upper stack structures 265 and 365 may have the same as or similar to a structure of the stack structure 165 illustrated in the examples in FIGS. 6 and 7. For example, the lower stack structure 265 may include first interlayer insulating layers 202 and first gate layers 262, alternately stacked, and the upper stack structure 365 may include second interlayer insulating layers 302 and second gate layers 362, alternately stacked.

A vertical structure VS' may be disposed on the lower structure 50. The vertical structure VS' may include a lower vertical structure VS_L and an upper vertical structure VS_U disposed on the lower vertical structure VS_L. The lower vertical structure VS_L may penetrate the lower stack structure 265 and the lower insulating structure 224. The upper vertical structure VS_U may penetrate the upper stack structure 365 and the upper insulating structure 324. Each of the lower vertical structure VS_L and the upper vertical structure VS_U may have a structure the same as or similar to a structure of the vertical structure VS illustrated in the examples in FIGS. 6, 7, and 8. For example, the lower vertical structure VS_L may include a lower core pattern 242, a lower semiconductor pattern 240, and a lower dielectric structure 238, and the upper vertical structure VS_U may include an upper core pattern 342, and an upper semiconductor pattern 340, and an upper dielectric structure 338. In the example embodiment, each of the lower and upper dielectric structures 238 and 338 may have substantially the same structure as the structure of the dielectric structure 138 described with reference to FIG. 8.

The lower and upper core patterns 242 and 342 may be formed of an insulating material (e.g., a silicon oxide, and the like). The lower semiconductor pattern 240 may include a lower pad portion 240P disposed on the lower core pattern 242, and a lower liner portion 240L extending in a direction of the lower structure 50 from an edge region of the lower pad portion 240P. The upper semiconductor pattern 340 may include an upper pad portion 340P disposed on the upper core pattern 342, and an upper liner portion 340L extending in a direction of the lower structure 50 from an edge region of the upper pad portion 340P.

The lower semiconductor pattern 240 may further extend to a region between a bottom surface of the lower core pattern 242 and the lower structure 50 from the lower liner portion 240L. The upper semiconductor pattern 340 may further extend to a region between a bottom surface of the upper core pattern 342 and the lower vertical structure VS_L from the upper liner portion 340L. The upper liner portion 340L of the upper semiconductor pattern 340 may be in contact with the lower pad portion 240P of the lower semiconductor pattern 240.

The lower vertical structure VS_L may include a lower channel region 240Lc and lower doped regions 140Ld and 140Pd, and the upper vertical structure VS_U may include an upper channel region 340Lc and upper doped regions 340Ld and 340Pd.

The lower channel region 240Lc may be formed in the lower liner portion 240L of the lower semiconductor pattern 240, and the lower doped regions 140Ld and 140Pd may include a first lower doped region 240Pd formed in the lower pad portion 240P of the lower semiconductor pattern 240, and a second lower doped region 240Ld extending into the lower liner portion 240L from the first lower doped region 240Pd and formed in the lower liner portion 240L.

The upper channel region 340Lc may be formed in the upper liner portion 340L of the upper semiconductor pattern 340, and the upper doped regions 340Ld and 340Pd may include a first upper doped region 340Pd formed in the upper semiconductor pattern 340 of the upper semiconductor pattern 340, and a second upper doped region 340Ld extending into the upper liner portion 340L from the first upper doped region 340Pd and formed in the upper liner portion 340L.

In the example embodiment, the upper doped regions 340Ld and 340Pd and the lower doped regions 240Ld and 240Pd may be substantially the same as the doped regions 140Ld and 140Pd (in FIG. 7) described with reference to FIG. 7.

In the example embodiment, each of the lower and upper insulating structures 224 and 324 may have a structure the same as or similar to a structure of the insulating structure 124 (in FIGS. 6 and 7) illustrated in the examples in FIGS. 6 and 7. For example, the lower insulating structure 224 may include a lower insulating layer 215, an intermediate insulating layer 218, and an upper insulating layer 221, stacked in order, and the upper insulating structure 324 may include a lower insulating layer 315, an intermediate insulating layer 318, and an upper insulating layer 321 stacked in order. In the example embodiment, the lower insulating layer 215 of the lower insulating structure 224 may include a first lower insulating layer 215a (in FIG. 18B) aligned with an uppermost gate layer 262 (in FIG. 18B) among the first gate layers 262, and a second lower insulating layer 215b covering the lower pad regions 262P (in FIG. 18B).

In the example embodiment, the lower insulating layer 315 of the lower insulating layer 315 may include a first lower insulating layer 315a (in FIG. 18B) aligned with an uppermost gate layer 362 (in FIG. 18B) among the second gate layers 362, and a second lower insulating layer 315b covering upper pad regions 362P (in FIG. 18B).

A first capping insulating layer 150 (in FIG. 18B) and a second capping insulating layer 178 (in FIG. 18B), stacked in order, may be disposed on the upper insulating structure 324. A bit line contact plug 187 (in FIG. 18B) penetrating the first and second capping insulating layers 150 and 178 (in FIG. 18B) and electrically connected to the upper pad portion 340P (in FIG. 18B) of the upper vertical structure VS_U of the vertical structure VS' may be disposed. A bit line 190 (in FIG. 18B) may be disposed on the bit line contact plug 187 (in FIG. 18B).

Gate contact plugs 184 may be disposed in the connection region 25 (in FIG. 18B). Some plugs of the gate contact plugs 184 may be disposed on the upper pad regions 362P (in FIG. 18B), and may extend to an upper portion and may penetrate the upper insulating structure 324 (in FIG. 18B) and the first and second capping insulating layers 150 and 178 (in FIG. 18B). The other plugs of the gate contact plugs 184 (in FIG. 18B) may be disposed on the lower pad regions 262P (in FIG. 18B), and may extend to an upper portion and may penetrate the lower insulating structure 224 (in FIG. 18B), the upper insulating structure 324 (in FIG. 18B), and the first and second capping insulating layers 150 and 178 (in FIG. 18B). Gate connection wiring lines 192 (in FIG. 18B) may be disposed on the gate contact plugs 184 (in FIG. 18B).

The upper insulating structure 324 including the intermediate insulating layer 318, and the lower insulating structure 224 including the intermediate insulating layer 218 may prevent electrical shorts, current leakage, or the like, occurring between the gate contact plugs 184.

Figure 19:
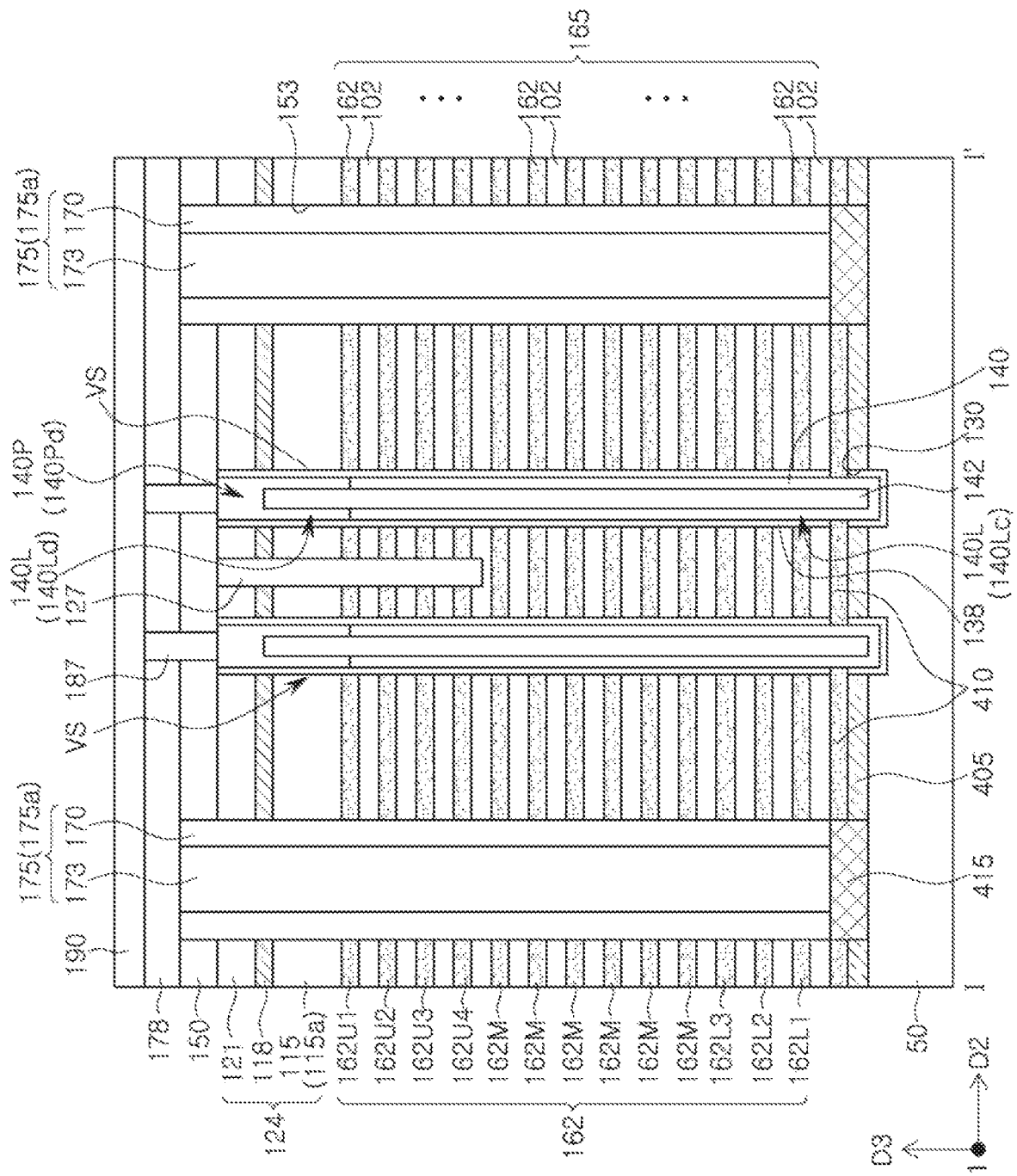
FIG. 19 is a cross-sectional diagram illustrating a modified example of a semiconductor device according to an example embodiment of the present application.

In the description below, modified examples of the vertical structure VS and the separation structures 175 described in the aforementioned example embodiment will be described with reference to FIG. 19. FIG. 19 is a cross-sectional diagram illustrating a region taken along line I-I' along FIG. 13.

In the modified example, referring to FIGS. 13 and 19, the lower structure 50, the stack structure 165, the insulating structure 124, the first capping insulating layer 150, and the second capping insulating layer 178, described with reference to FIGS. 13, and 14A to 14D, may be disposed.

A base insulating layer 405 may be disposed between the lower structure 50 and the stack structure 165, and a horizontal connection pattern 410 may be disposed on the base insulating layer 405.

A vertical structure VS penetrating the stack structure 165 and the insulating structure 124 may be disposed on the lower structure 50. The vertical structure VS may include the core pattern 142, the semiconductor pattern 140, and the dielectric structure 138, described with reference to FIGS. 13, and 14A to 14D. The semiconductor pattern 140 may include a liner portion 140L surrounding side surfaces of the core pattern 142 as described in the aforementioned example embodiment.

The horizontal connection pattern 410 may be disposed below the stack structure 165, may penetrate the dielectric structure 138, and may be connected to the liner portion 140L. For example, the horizontal connection pattern 410 may be in contact with the liner portion 140L. In an example embodiment, the horizontal connection pattern 410 may include a polysilicon having N-type conductivity.

Separation structures 175 penetrating the stack structure 165, the insulating structure 124, and the first capping insulating layer 150 may be disposed. Each of the separation structures 175 may include a separation core pattern 173, and a spacer layer 170 disposed on side surfaces of the separation core pattern 173.

Lower patterns 415 may be disposed between the separation structures 175 and the lower structure 50. In an example embodiment, the lower patterns 415 may be an epitaxial semiconductor layer formed by an epitaxial process from the lower structure 50. In another example, the lower patterns 415 may be formed of polysilicon. In an example embodiment, the lower patterns 415 may include silicon having N-type conductivity.

In the description below, an example of a method of manufacturing a semiconductor device will be described with reference to FIGS. 20A to 26B. With respect to FIGS. 20A to 26B, FIGS. 20A, 21A, 22A, 23A, 24, 25A, and 26A are cross-sectional diagrams illustrating a region taken along line I-I' in FIG. 13, and FIGS. 20B, 21B, 22B, 23B, 25B, and 26B are cross-sectional diagrams illustrating a region taken long line IV-IV' in FIG. 13.

Figure 20A:
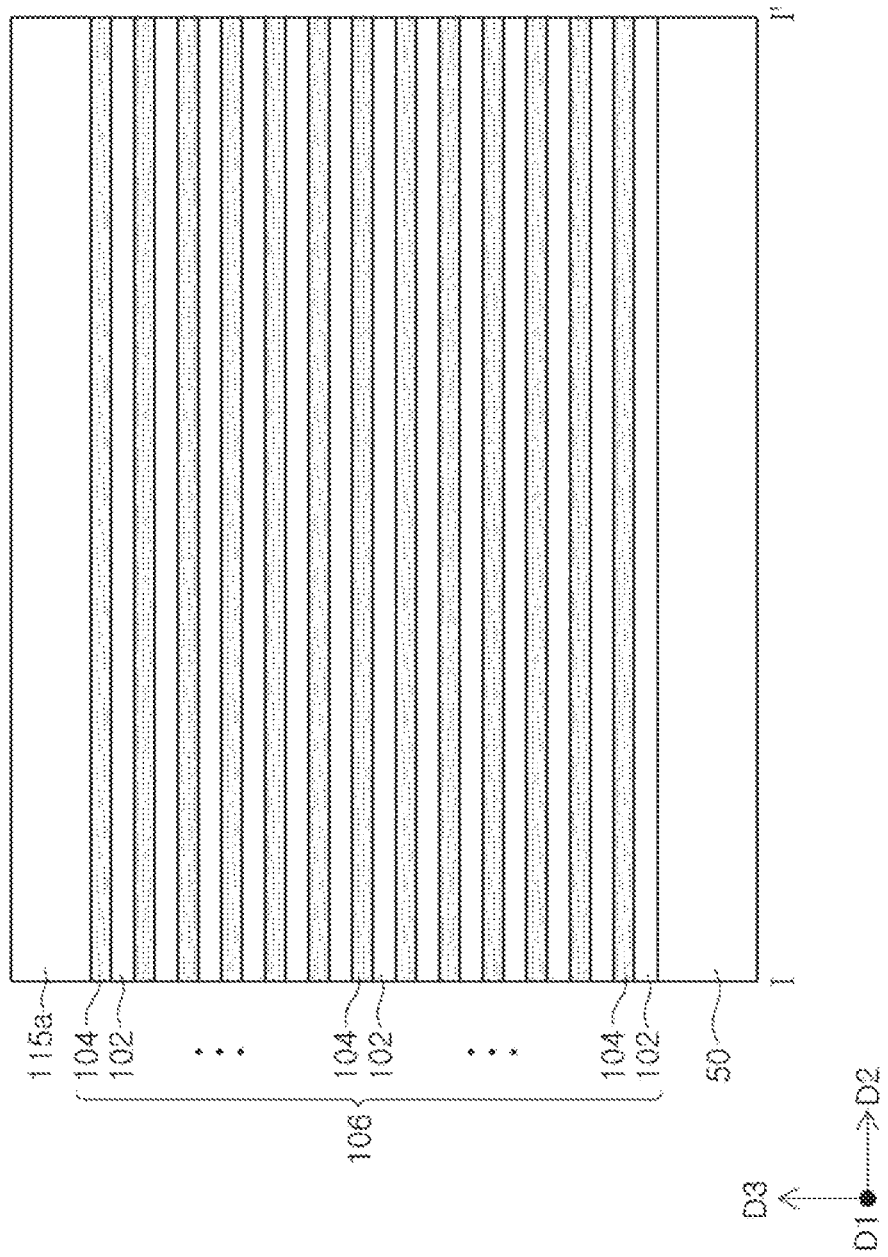
FIGS. 20A to 26B are cross-sectional diagrams illustrating a method of manufacturing a semiconductor device according to an example embodiment of the present application.
Figure 20B:
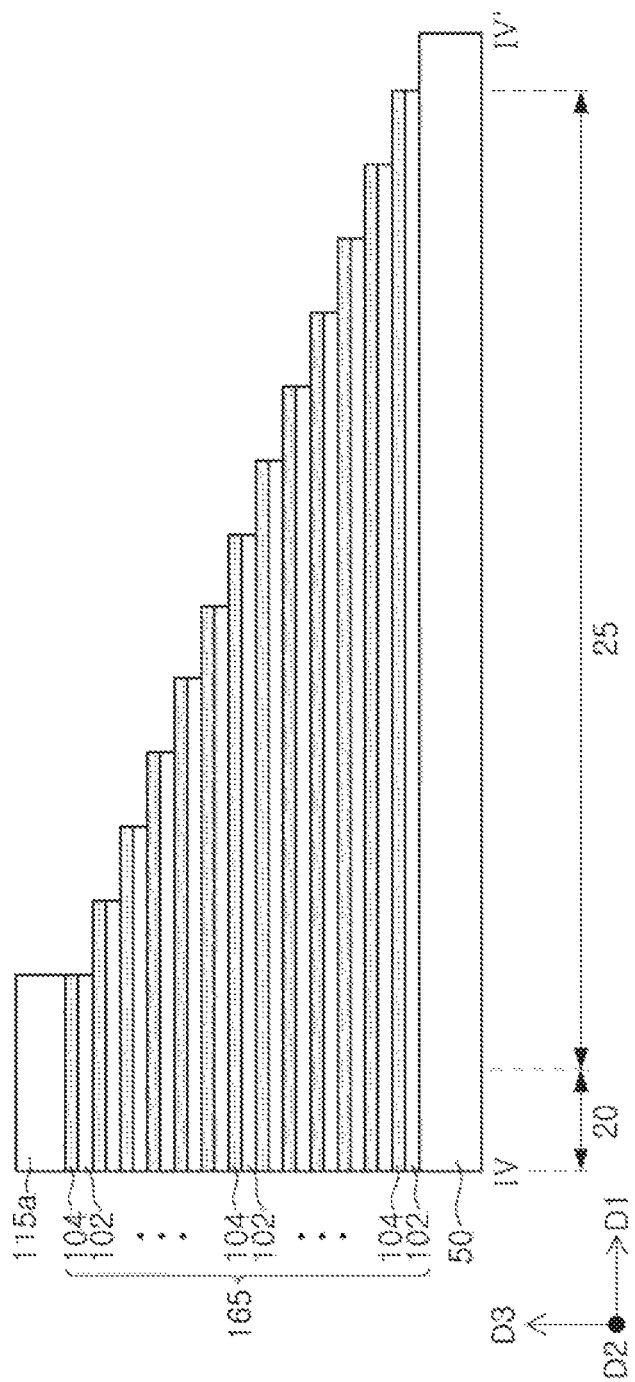

Referring to FIGS. 13, 20A, and 20B, a mold structure 106 including interlayer insulating layers 102 and mold layers 104, alternately stacked, may be formed on a lower structure 50. The interlayer insulating layers 102 may be formed of a silicon oxide, and the mold layers 104 may be formed of a material having etch selectivity with the interlayer insulating layers 102. For example, the mold layers 104 may be formed of a material having etch selectivity with the interlayer insulating layers 102, and the material having etch selectivity with the interlayer insulating layers 102 may not be limited to any particular material. For example, when the interlayer insulating layers 102 are formed of a silicon oxide, the mold layers 104 may be formed of a material having etch selectivity with a silicon oxide, such as a silicon nitride, a polysilicon, or the like.

A first lower insulating layer 115a may be formed on the mold structure 106. The first lower insulating layer 115a may be formed of a silicon oxide.

A staircase structure may be formed by patterning the first lower insulating layer 115a and the mold structure 106. Accordingly, the interlayer insulating layers 102 and the mold layers 104 of the mold structure 106 may be alternately stacked in the memory cell array region 20, and may be formed in a staircase structure in a connection region 25 adjacent to the memory cell array region 20.

Figure 21A:
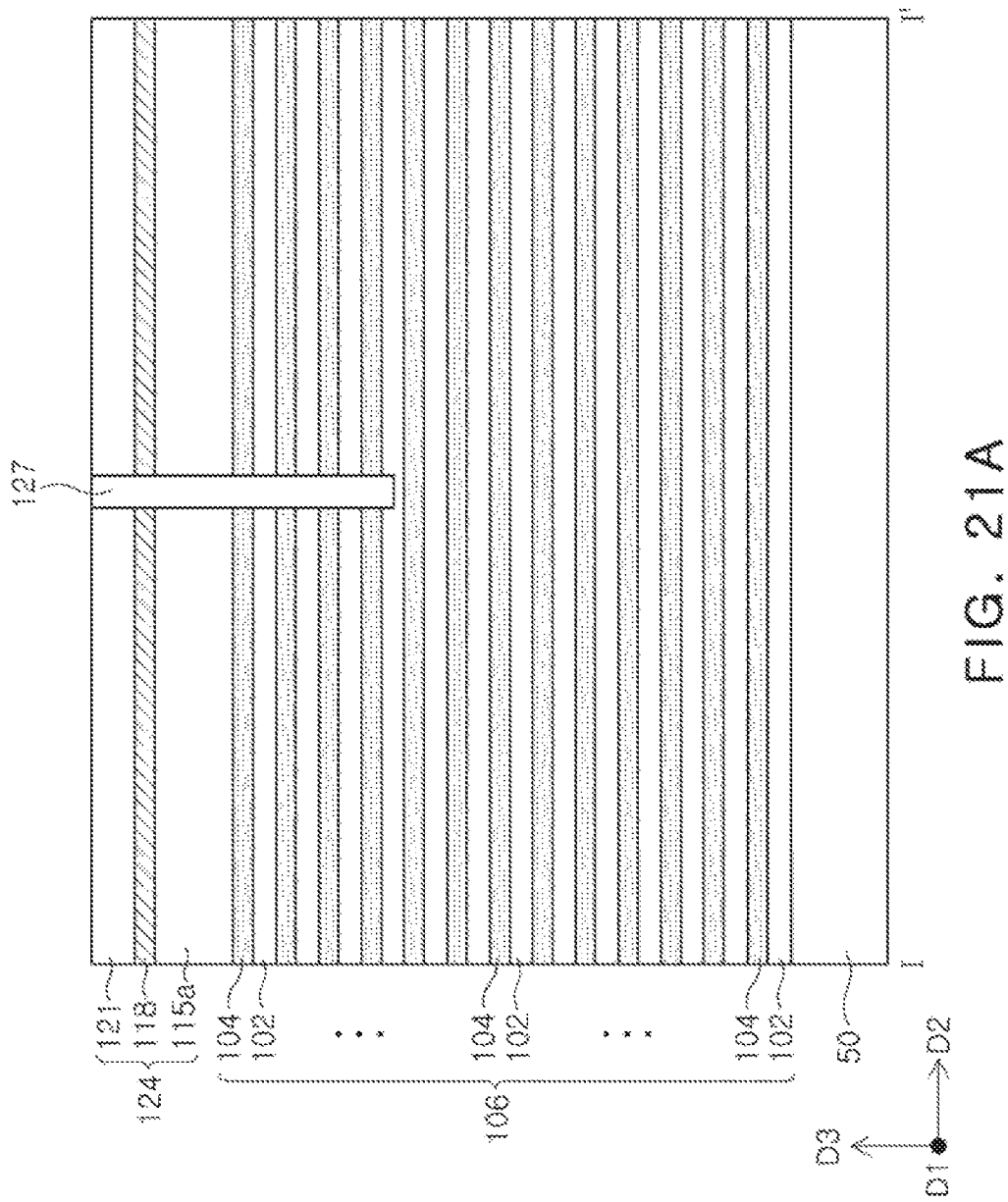
Figure 21B:
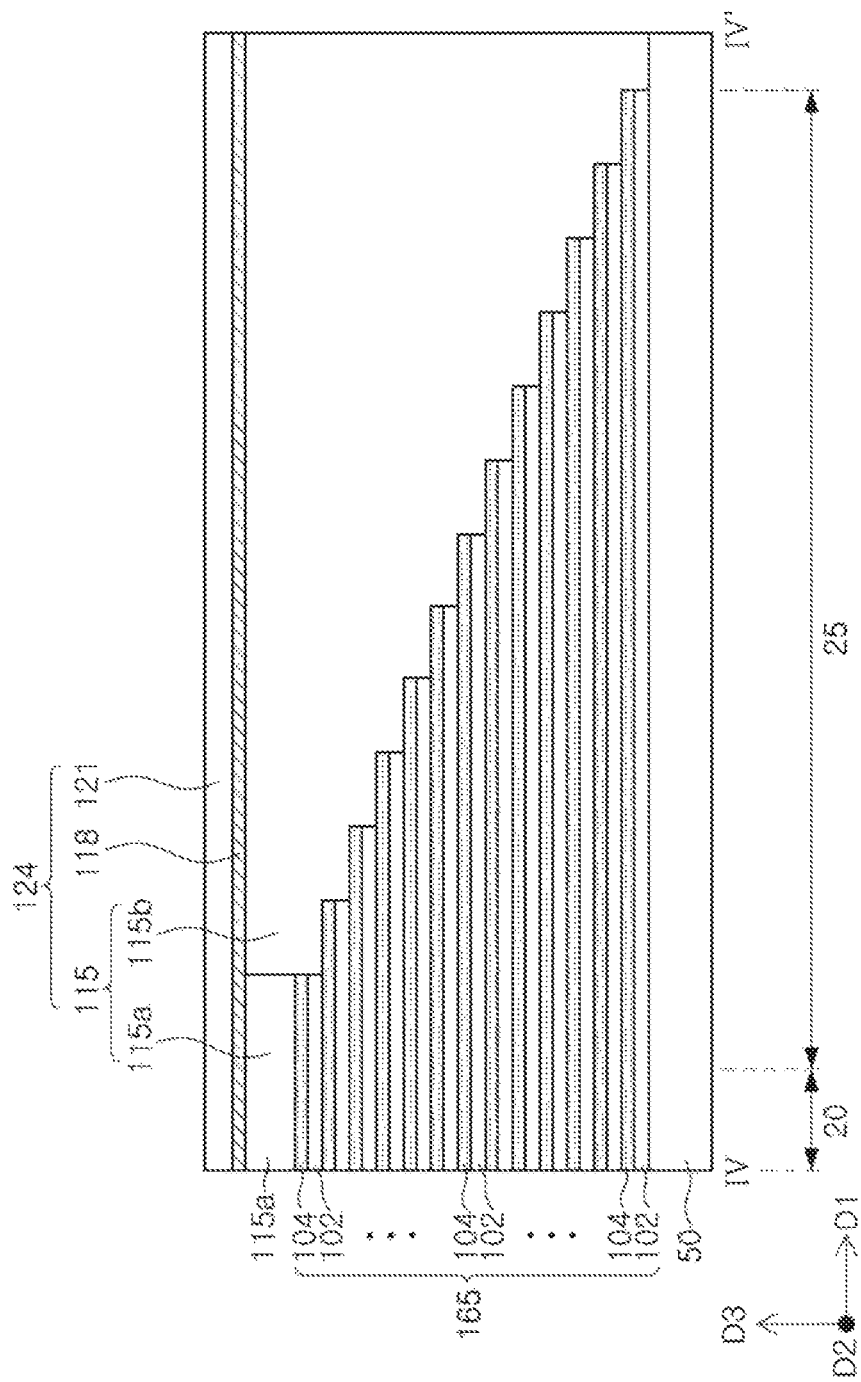

Referring to FIGS. 13, 21A, and 21B, a second lower insulating layer 115b (in FIG. 21B) having an upper surface coplanar with an upper surface of the first lower insulating layer 115a may be formed. For example, the forming the second lower insulating layer 115b (in FIG. 21B) may include forming an insulating layer on the lower structure 50 having the first lower insulating layer 115a and the mold structure 106, and planarizing the insulating layer until an upper surface of the first lower insulating layer 115a is exposed. The first and second lower insulating layers 115a and 115b may be included in a lower insulating layer 115.

An intermediate insulating layer 118 and an upper insulating layer 121, stacked in order, may be formed on the lower insulating layer 115. The lower insulating layer 115, the intermediate insulating layer 118, and the upper insulating layer 121, stacked in order, may be included in an insulating structure 124.

In the example embodiment, the intermediate insulating layer 118 may be formed of a material the same as a material of the lower insulating layer 115, such as a silicon oxide, for example.

In the example embodiment, the intermediate insulating layer 118 may be formed of a material different from materials of the lower and upper insulating layers 115 and 121 and a material of the interlayer insulating layers 102. For example, the intermediate insulating layer 118 may be formed of a material having etch selectivity different from etch selectivity of the lower and upper insulating layers 115 and 121. For example, the lower and upper insulating layers 115 and 121 and the interlayer insulating layers 102 may be formed of a silicon oxide, and the intermediate insulating layer 118 may be formed of a silicon nitride. In example embodiments, a material of the intermediate insulating layer 118 may not be limited to a silicon nitride, and may be replaced with an insulating material having etch selectivity different from etch selectivity of the lower and upper insulating layers 115 and 121 and the interlayer insulating layers 102.

In the example embodiment, the intermediate insulating layer 118 may be formed of a material different from a material of the mold layers 104. For example, when the mold layers 104 are formed of polysilicon or formed as amorphous carbon layers, the intermediate insulating layer 118 may be formed of a silicon nitride. For example, when the mold layers 104 are formed of a silicon nitride, the intermediate insulating layer 118 may be formed of an insulating material different from a silicon nitride.

An insulating pattern 127 (in FIG. 21A) penetrating the insulating structure 124 and a portion of the mold structure 106 may be formed. The insulating pattern 127 (in FIG. 21A) may be formed of a silicon oxide.

Figure 22B:
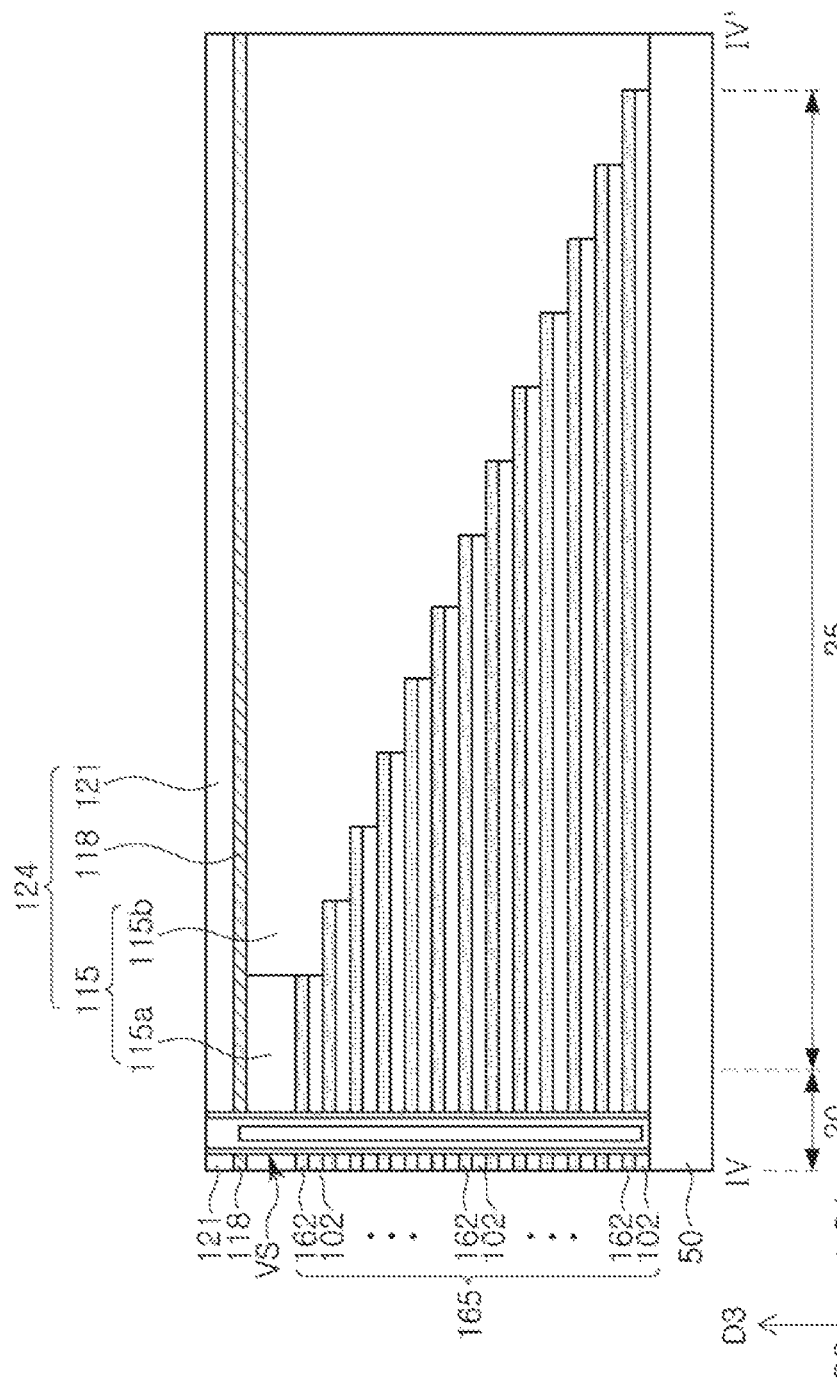

Referring to FIGS. 13, 22A, and 22B, a vertical structure VS penetrating the mold structure 106 and the insulating structure 124 may be formed on the lower structure 50.

In the example embodiment, the forming the vertical structure VS may include forming a hole 130 penetrating the mold structure 106 and the insulating structure 124, forming a dielectric structure 138 on a side wall of the hole 130, forming a liner portion 140L covering the dielectric structure 138 on an internal wall of the hole 130, forming a core pattern 142 partially filling the hole 130 in which the liner portion 140L is formed, and forming a pad portion 140P connected to the liner portion 140L on the core pattern 142. The liner portion 140L and the pad portion 140P may be formed as a semiconductor pattern 140. The semiconductor pattern 140 may be formed of polysilicon.

Figure 23A:
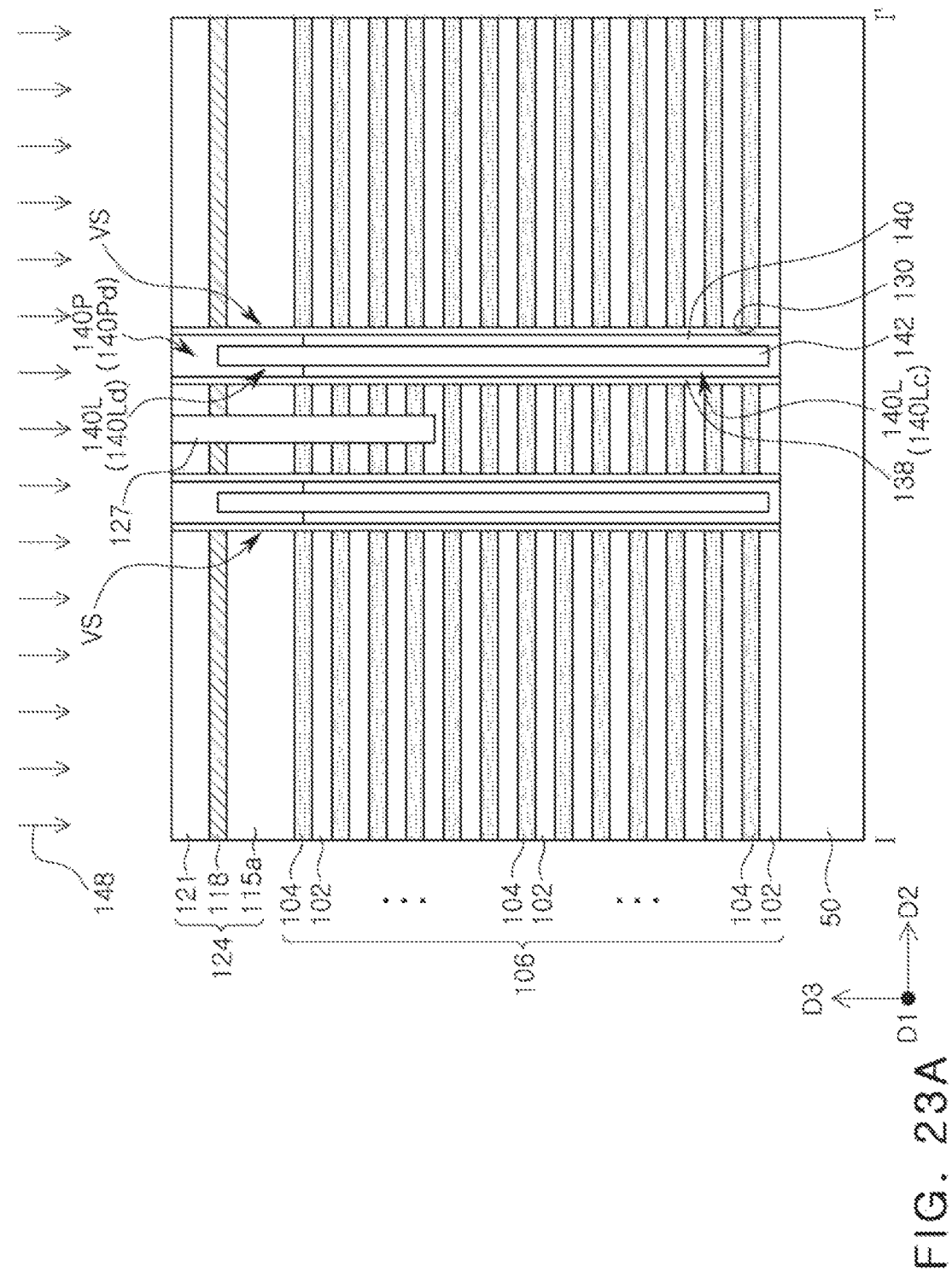
Figure 23B:
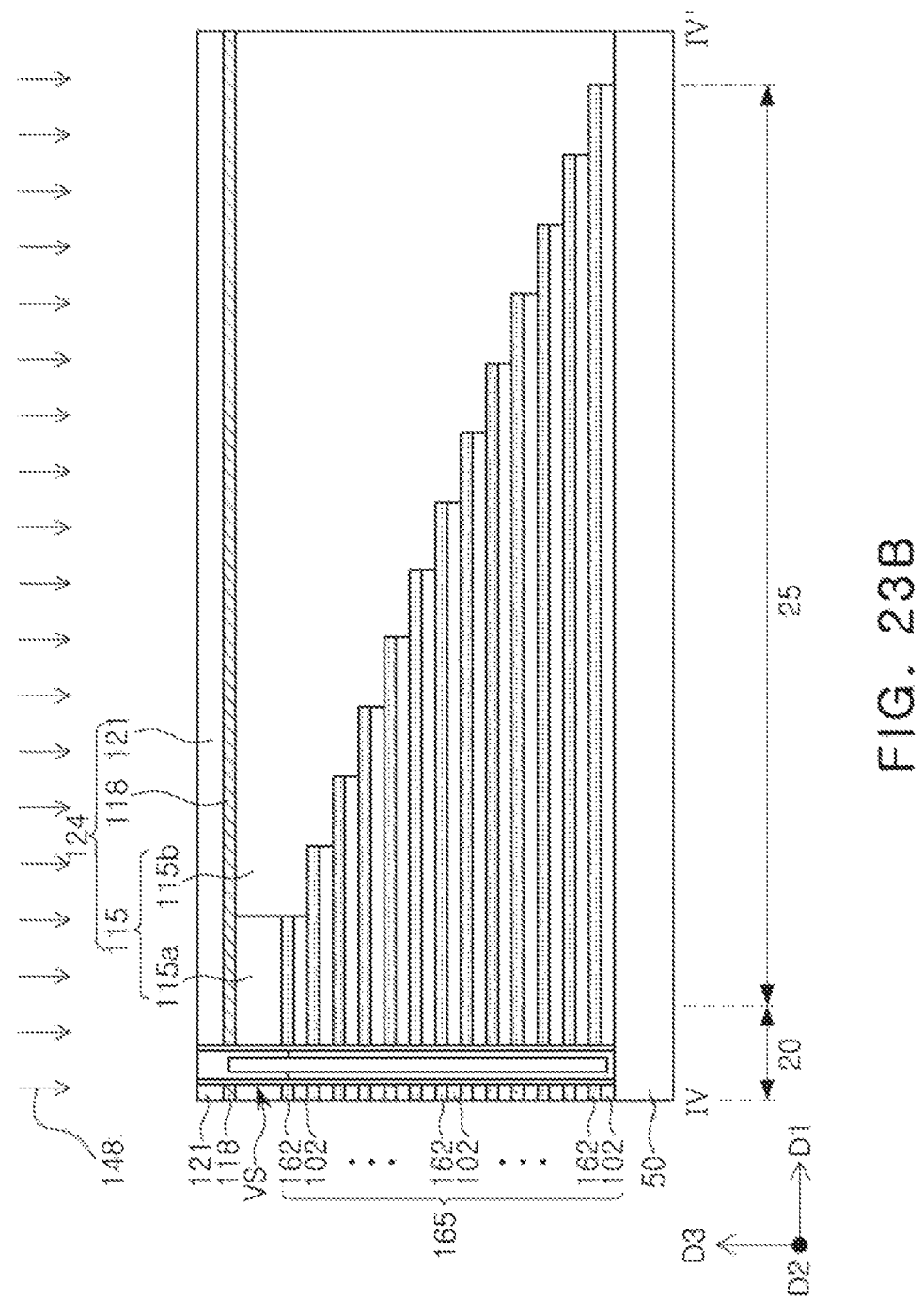

Referring to FIGS. 13, 23A, and 23A, an ion implantation process 148 may be performed. Through the ion implantation process 148, the pad portion 140P of the semiconductor pattern 140 may be formed as a first doped region 140Pd, and a portion of the liner portion 140L of the semiconductor pattern 140 may be formed as a second doped region 140Ld.

In an example embodiment, a portion of the second doped region 140Ld may oppose side surfaces of at least an uppermost mold layer among the mold layers 104.

In an example embodiment, a lower end portion of the second doped region 140Ld may be positioned on a higher level than a bottom surface of the insulating pattern 127. The second doped region 140Ld may be positioned on a higher level than a second uppermost mold layer among the mold layers 104.

In an example embodiment, the first and second doped regions 140Ld and 140Pd and the insulating structure 124 may include a first element doped through the ion implantation process 148. The first element may be a group-5 element in the periodic table, phosphorus (P) or arsenic (As), for example. The first and second doped regions 140Ld and 140Pd may have N-type conductivity. In an example embodiment, in the insulating structure 124, a doping profile of the first element may have the maximum concentration at a first height Rp (in FIG. 7) formed from an upper surface of the semiconductor pattern 140 and an upper surface of the insulating structure 124. The first height Rp (in FIG. 7) may be positioned between an upper surface and a lower surface of the intermediate insulating layer 118. Thus, the first element in the insulating structure 124 may have the maximum concentration in the insulating structure 124. A material of the intermediate insulating layer 118 in which the first element is doped in the maximum concentration through the ion implantation process 148 (FIGS. 23A and 23A) may have etch selectivity with the mold layers 104.

Figure 24:
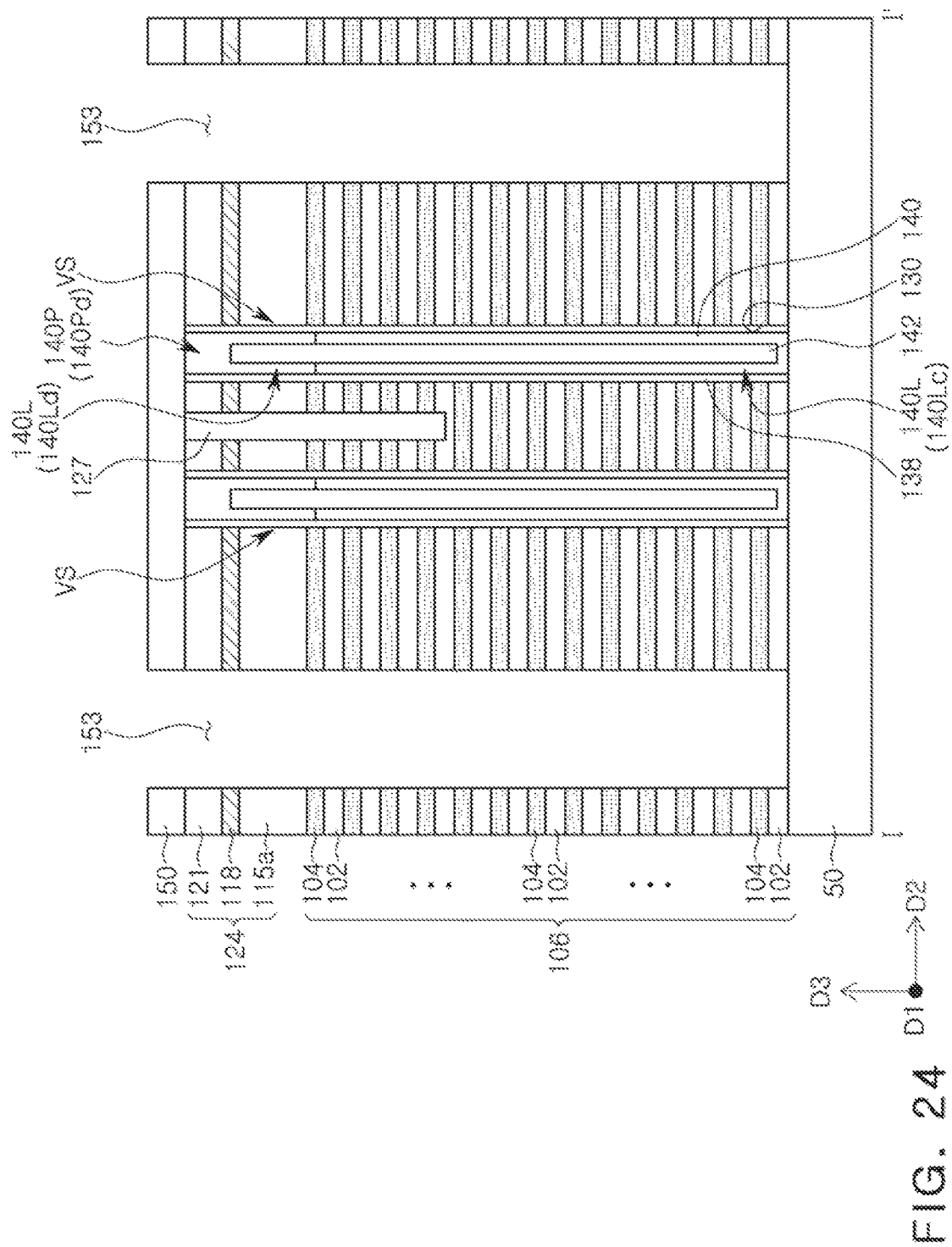

Referring to FIGS. 13 and 24, a first capping insulating layer 150 may be formed on the insulating structure 124. Also, separation trenches 153 penetrating the first capping insulating layer 150, the insulating structure 124, and the mold structure 106 may be formed. Side surfaces of the interlayer insulating layers 102, the mold layers 104, and the insulating structure 124 may be exposed by the separation trenches 153.

Figure 25A:
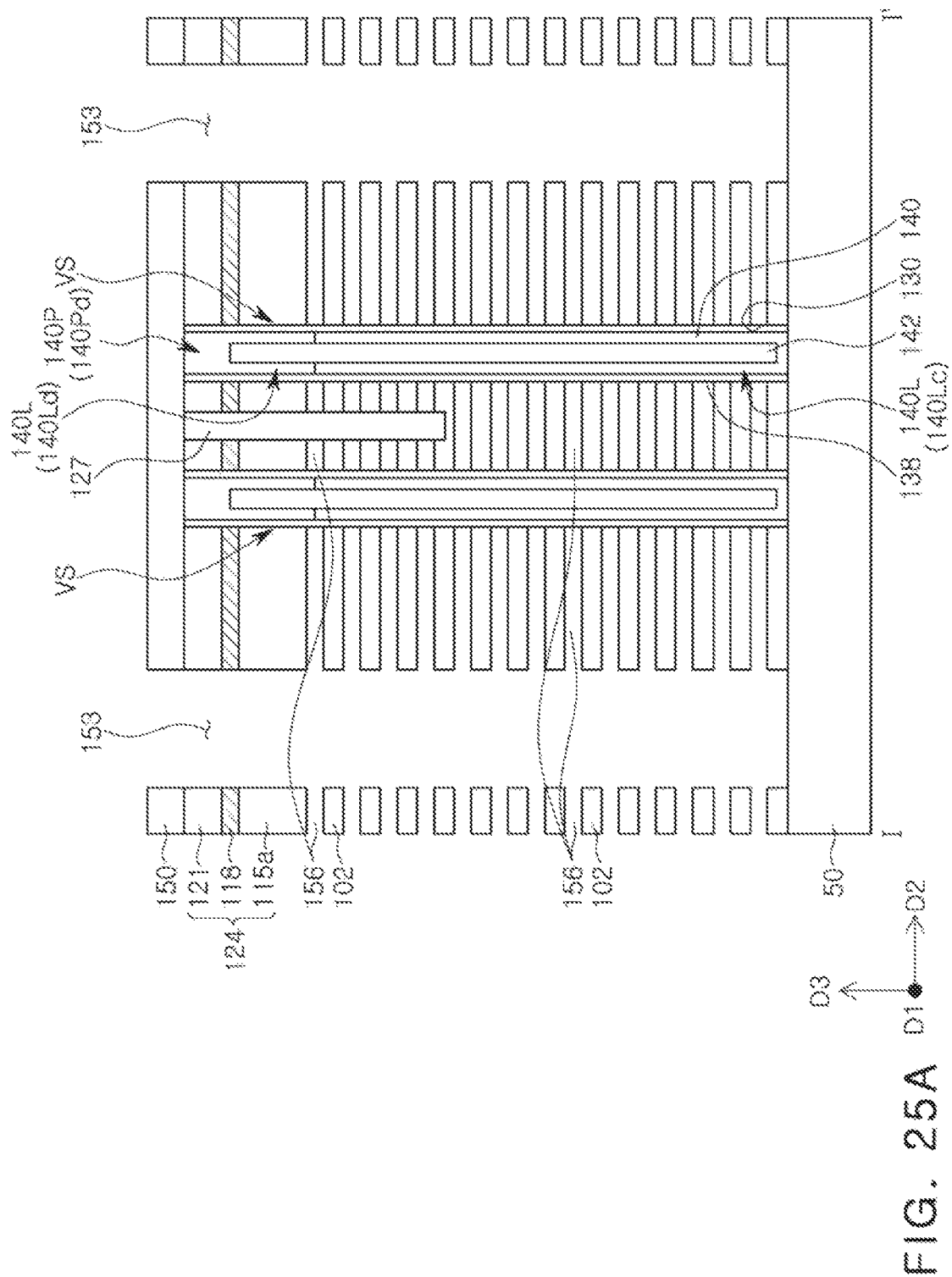

Referring to FIGS. 13, 25A, and 25A, empty spaces 156 may be formed by selectivity removing the mold layers 104 using an etching process. The interlayer insulating layers 102, the lower insulating layer 115, the intermediate insulating layer 118, and the upper insulating layer 121 may be formed of a material having etch selectivity with the mold layers 104, and thus, while the mold layers 104 are removed, the interlayer insulating layers 102, the lower insulating layer 115, the intermediate insulating layer 118, and the upper insulating layer 121 may remain.

Figure 25B:
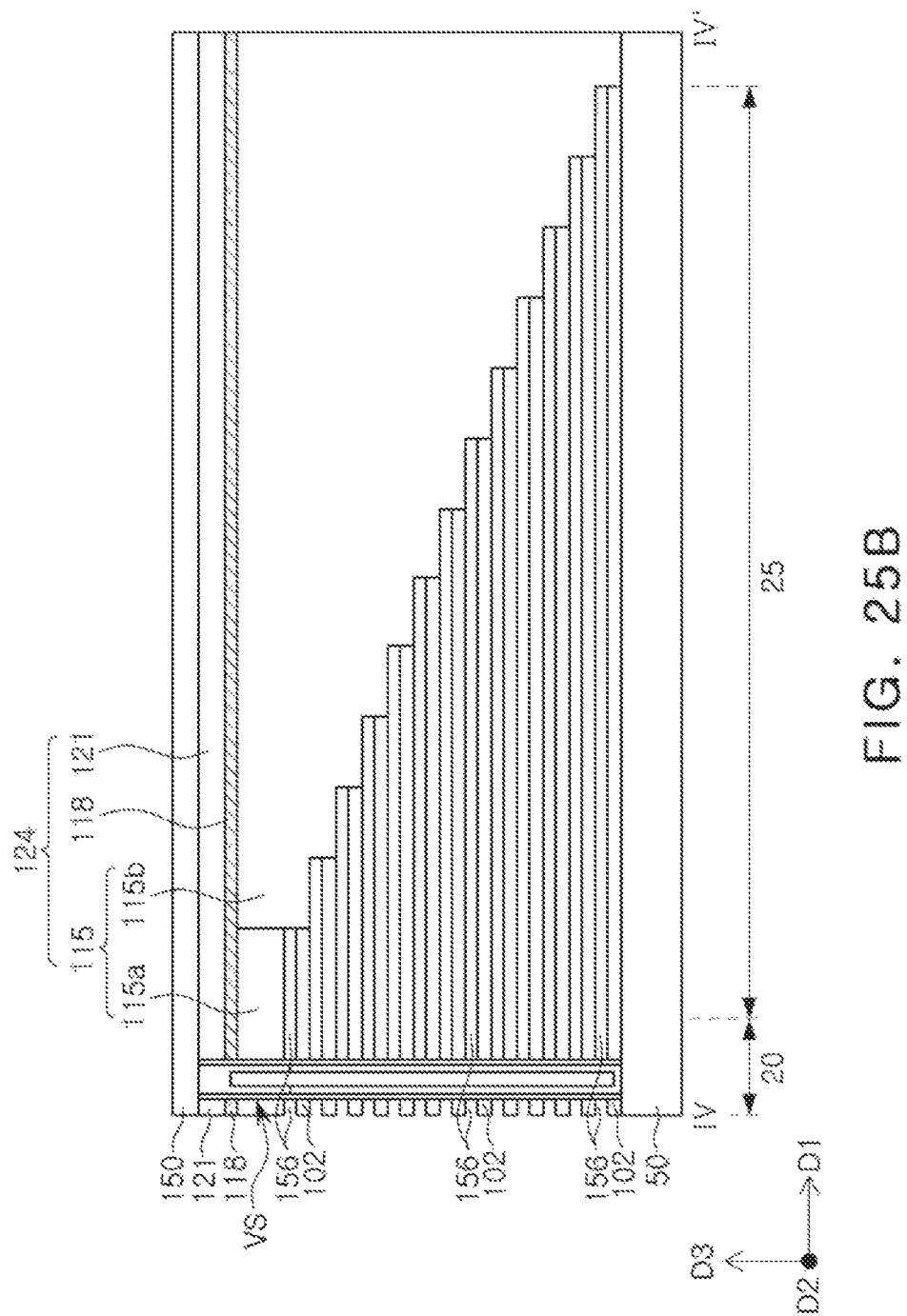
Figure 26A:
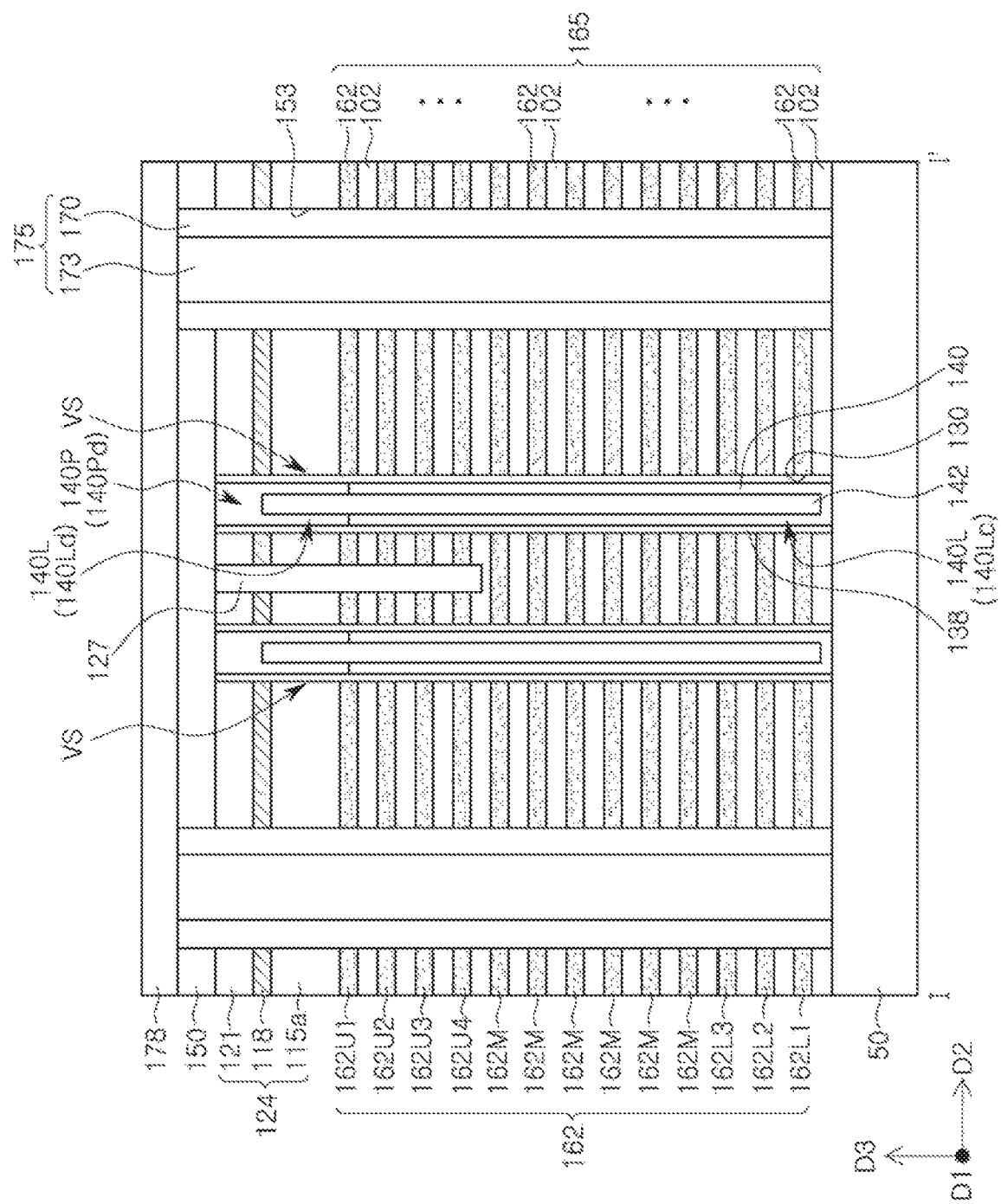
Figure 26B:
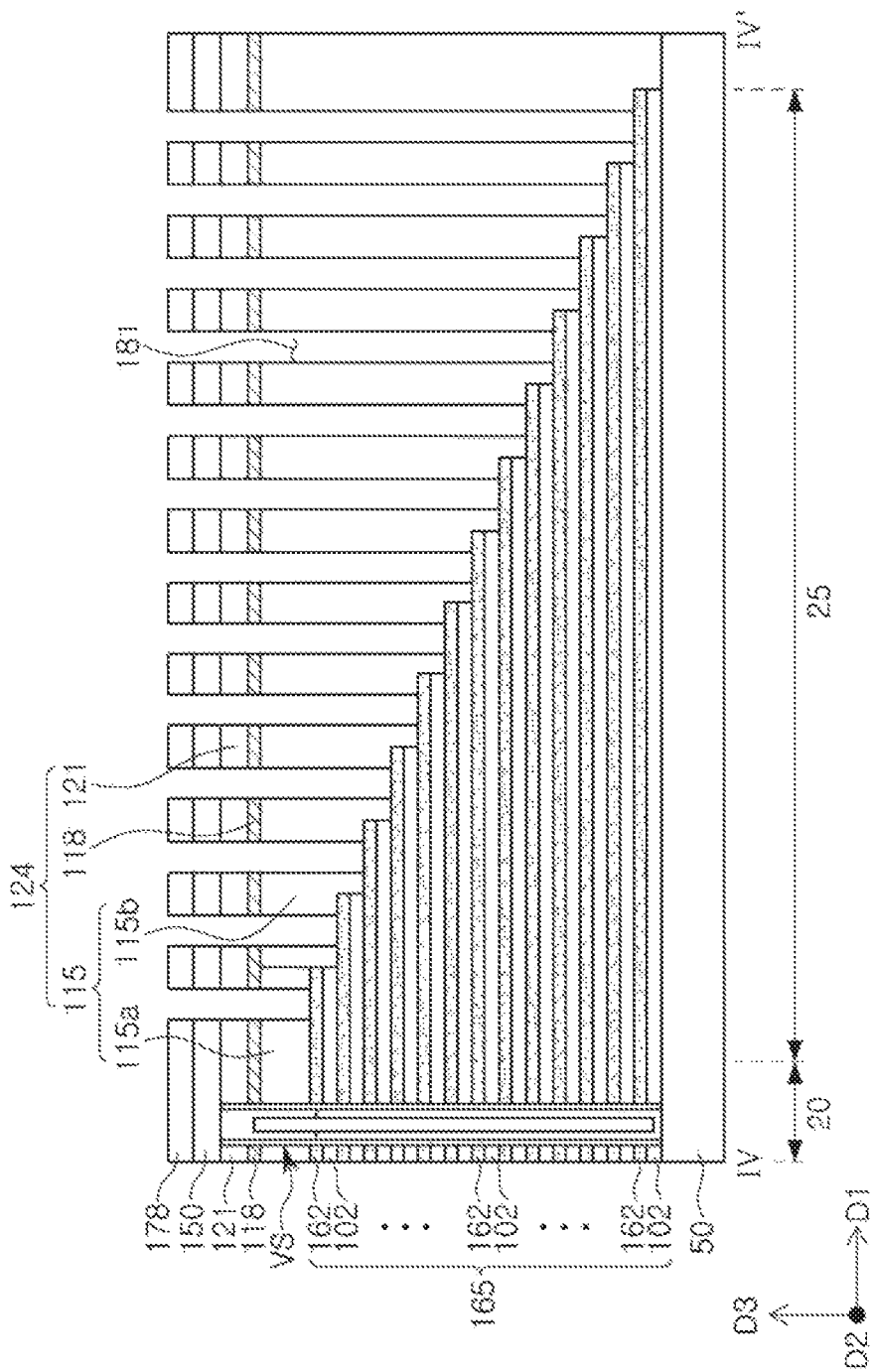

Referring to FIGS. 13, 26A, and 26B, gate layers 162 may be formed in the empty spaces 156 (in FIGS. 25A and 25B). The gate layers 162 may include one or a plurality of lower gate layers 162L, a plurality of interlayer gate layers 162M, and one or a plurality of upper gate layers 162U, stacked in order. The gate layers 162 and the interlayer insulating layers 102 may be included in a stack structure 165.

Separation structures 175 filling the separation trenches 153 may be formed. The forming the separation structures 175 may include forming a spacer layer 170 on side walls of the separation trenches 153, and forming a separation core pattern 173 filling the separation trenches 153. A second capping insulating layer 178 may be formed on the separation structures 175 and the first capping insulating layer 150. Contact holes 181 penetrating the first and second capping insulating layers 150 and 178 and the insulating structure 124 in order may be formed in the connection region 25 by performing an etching process. The contact holes 181 may expose the gate layers 162. By forming the intermediate insulating layer 118 using a material different from materials of the first and second capping insulating layers 150 and 178, the upper insulating layer 121, and the lower insulating layer 115, the intermediate insulating layer 118 may be prevented from changing to properties vulnerable to etching as the intermediate insulating layer 118 is doped with the first element. Thus, the defect in which gaps between the contact holes 181 are excessively decreased or the defect in which the contact holes 181 are connected to each other, caused by over-etching the intermediate insulating layer 118 doped with the first element, may be prevented during an etching process for forming the contact holes 181.

Referring back to FIGS. 13, 14A, and 14D, gate contact plugs 184 filling the contact holes 181 may be formed. Also, bit-line contact plugs 187 penetrating the first and second capping insulating layers 150 and 178 and electrically connected to the pad portions 140P of the vertical structure VS may be formed. Further, bit lines 190 may be formed on the bit line contact plug 187, and gate connection wiring lines 192 may be formed on the gate contact plugs 184.

Figure 27:
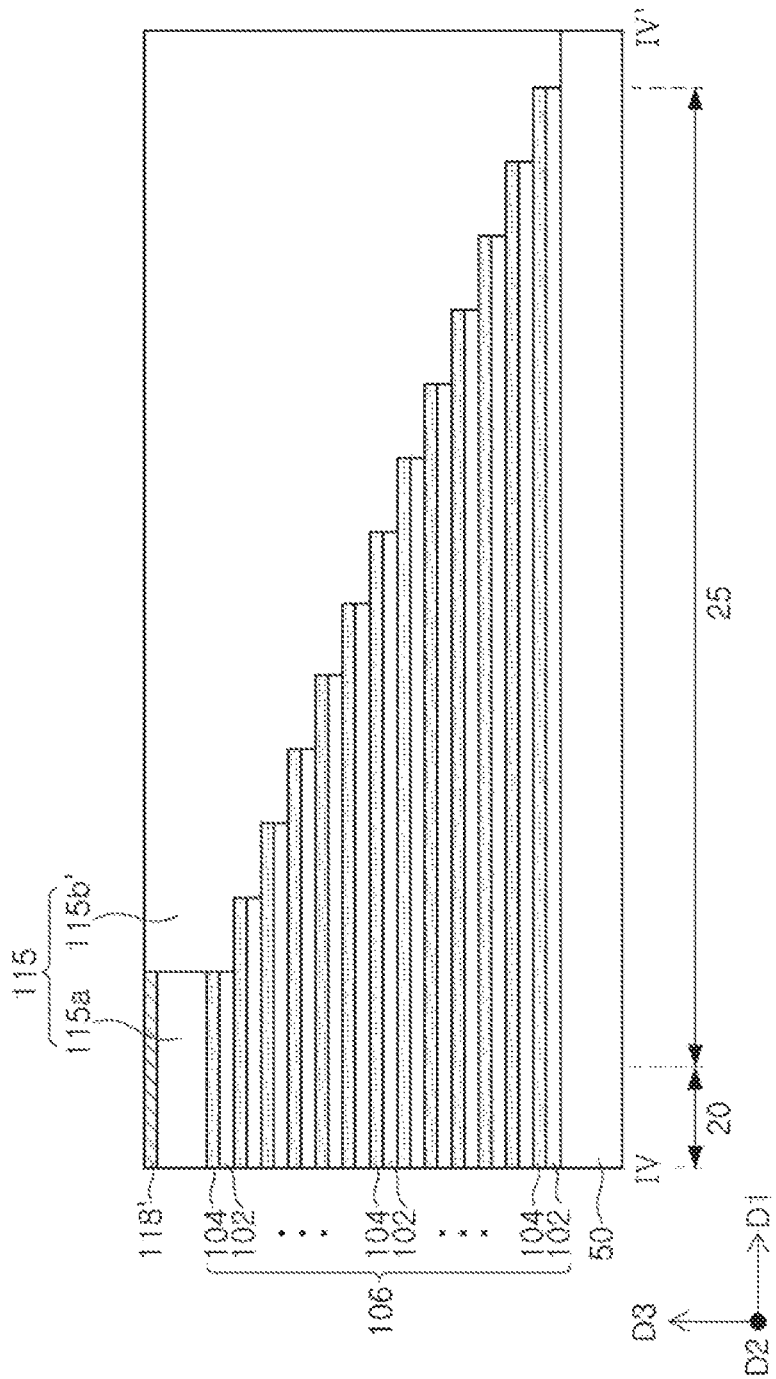
FIG. 27 is a cross-sectional diagram illustrating a modified example of a method of manufacturing a semiconductor device according to an example embodiment of the present application.

In the description below, a modified example of a method of manufacturing a semiconductor device will be described with reference to FIG. 27 in accordance with an example embodiment. FIG. 27 is a cross-sectional diagram illustrating a region taken along line IV-IV' in FIG. 13.

Referring to FIGS. 13 and 27, a mold structure 106 including interlayer insulating layers 102 and mold layers 104, alternately stacked, may be formed on a lower structure 50, a first lower insulating layer 115a and an intermediate insulating layer 118' may be formed in order on the mold structure 106, and the intermediate insulating layer 118', the first lower insulating layer 115a, and the mold structure 106 may be patterned, thereby forming a staircase structure. Accordingly, the interlayer insulating layers 102 and the mold layers 104 of the mold structure 106 may be alternately stacked in a memory cell array region 20 and may be formed in a staircase structure in a connection region 25 adjacent to the memory cell array region 20, and the first lower insulating layer 115a and the intermediate insulating layer 118' may be self-aligned. A second lower insulating layer 115b' having an upper surface coplanar with an upper surface of the intermediate insulating layer 118' may be formed. For example, the forming the second lower insulating layer 115b' may include forming an insulating layer on a lower structure 50 having the first lower insulating layer 115a, the intermediate insulating layer 118', and the mold structure 106, and planarizing the insulating layer until an upper surface of the intermediate insulating layer 118' is exposed. The first and second lower insulating layers 115a and 115b' may be included in a lower insulating layer 115. The upper insulating layer 121 illustrated in the examples in FIGS. 21A and 21B may be formed, and the process described with reference to FIGS. 22A to 26A may be performed. Thus, a semiconductor device including the insulating structure 124 (in FIG. 15) illustrated in the example in FIG. 15 may be manufactured.

Figure 28:
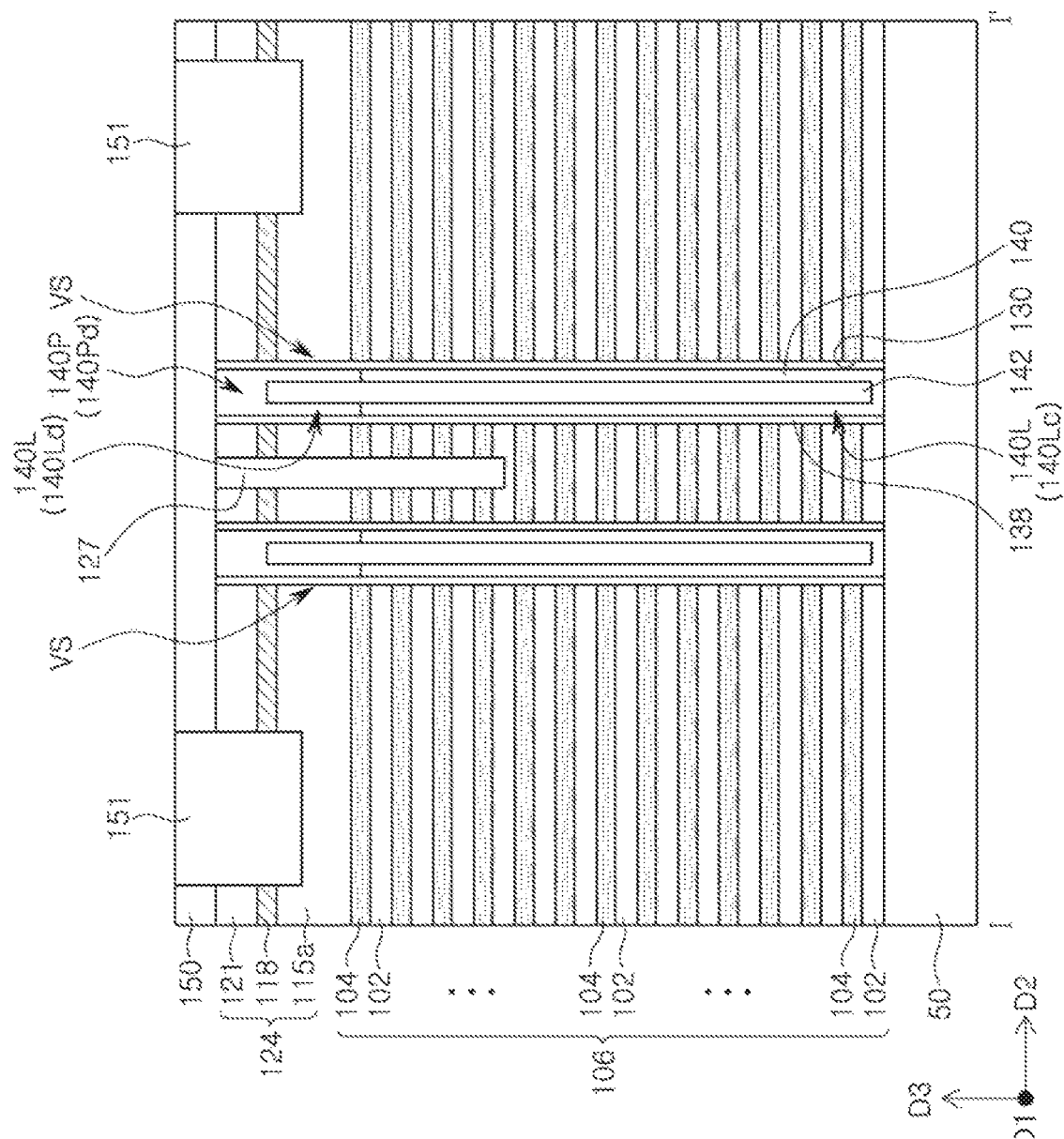
FIGS. 28 and 29 are cross-sectional diagrams illustrating a modified example of a method of manufacturing a semiconductor device according to an example embodiment of the present application.
Figure 29:
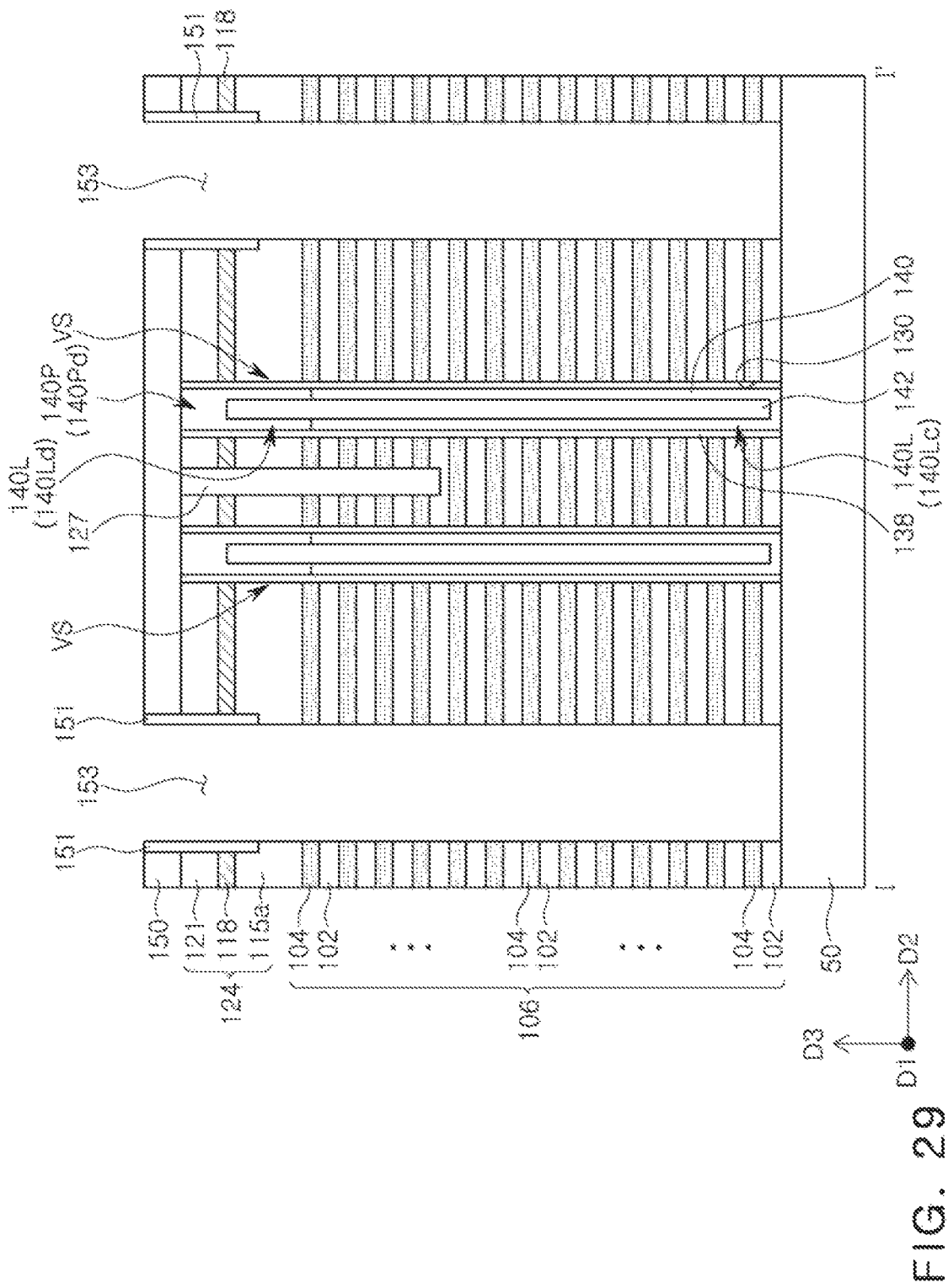

In the description below, a modified example of a method of manufacturing a semiconductor device will be described with reference to FIGS. 28 and 29. FIGS. 28 and 29 are cross-sectional diagrams illustrating a region taken along line I-I' in FIG. 13.

Referring to FIGS. 13 and 28, the method may further include forming buffer layers 151 isolating the intermediate insulating layer 118 of at least the insulating structure 124 before the forming the separation trenches 153 described with reference to FIG. 24. For example, the forming the buffer layers 151 may include, after forming the first capping insulating layer 150 as in the example illustrated in FIG. 24, forming openings penetrating the first capping insulating layer 150, the upper insulating layer 121, and the intermediate insulating layer 118 in order and exposing the first lower insulating layer 115a, and filling the openings with buffer material layers. In an example embodiment, the buffer layers 151 may be formed of a silicon oxide.

Referring to FIGS. 13 and 29, separation trenches 153 penetrating the buffer layers 151, the first lower insulating layer 115a, and the mold structure 106 in order may be formed.

In the example embodiment, the buffer layers 151 may be formed in the positioned in which the separation trenches 153 are formed, and each of the buffer layers 151 may have a width greater than a width of each of the separation trenches 153. The buffer layers 151 may be isolated from each other by the separation trenches 153, and the buffer layers 151 separated by the separation trenches 153 and remaining may cover a side surface of the intermediate insulating layer 118.

The mold layers 104 described with reference to FIGS. 25A and 25B may be removed by an etching process, and the empty spaces 156 (in FIGS. 25A and 25B) may be formed. During removing the mold layers 104 through an etching process, the buffer layers 151 may protect the intermediate insulating layer 118 from the etching process. When the buffer layers 151 are formed as above, a material for forming the intermediate insulating layer 118 may not be limited to any particular material and may vary. For example, the intermediate insulating layer 118 may be formed of a silicon oxide or a silicon nitride.

The gate layers 162, the separation structures 175, and the second capping insulating layer 178 described with reference to FIGS. 26A and 26B may be formed in order by performing the process described with reference to FIGS. 26A and 26B. Accordingly, a semiconductor device described with reference to FIG. 16 may be manufactured.

Figure 30:
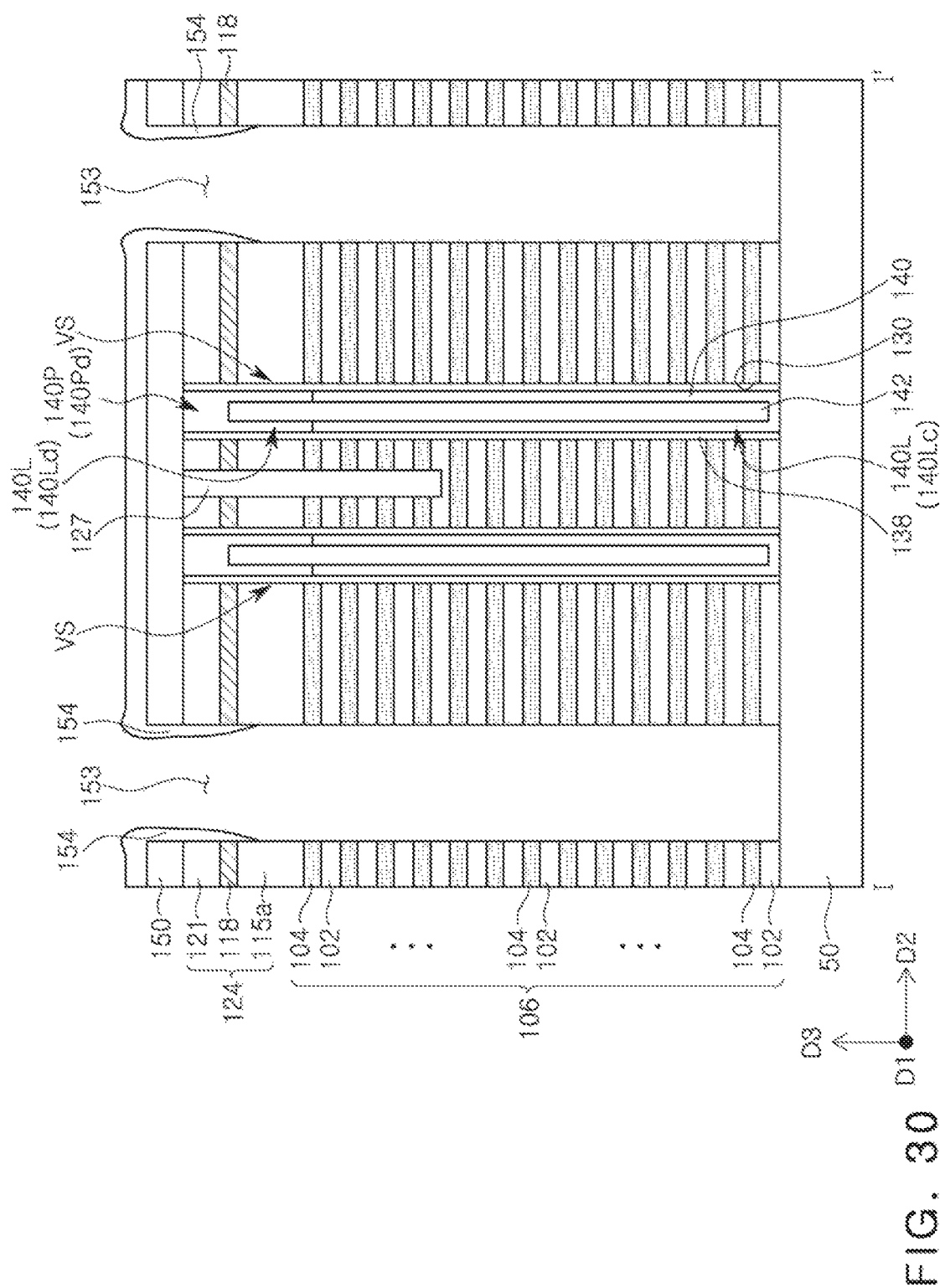
FIG. 30 is a cross-sectional diagram illustrating a modified example of a method of manufacturing a semiconductor device according to an example embodiment of the present application.

In the description below, another modified example of a method of manufacturing a semiconductor device will be described with reference to FIG. 30. FIG. 30 is cross-sectional diagrams illustrating a region taken along line I-I' in FIG. 13.

Referring to FIGS. 13 and 30, after forming the separation trenches 153 illustrated in the example in FIG. 24, a buffer layer 154 covering an upper region of the insulating structure 124 and covering a side surface of the intermediate insulating layer 118 of the insulating structure 124 exposed by the separation trenches 153 may be formed. The buffer layer 154 may be formed using a deposition process of which step coverage properties is not good. Accordingly, after the buffer layer 154, a side surface of the intermediate insulating layer 118 may be covered by the buffer layer 154, but the mold layers 104 may be exposed by the separation trenches 153.

The mold layers 104 described with reference to FIGS. 25A and 25B may be removed by an etching process, and the empty spaces 156 (in FIGS. 25A and 25B) may be formed. During removing the mold layers 104 through an etching process, the buffer layer 154 may protect the intermediate insulating layer 118 from the etching process.

The gate layers 162 described with reference to FIGS. 26A and 26B may be formed by performing the process described with reference to FIGS. 26A and 26B.

In an example embodiment, after forming the gate layers 162, the buffer layer 154 may be removed, and the separation structures 175 and the second capping insulating layer 178 described with reference to FIGS. 26A and 26B may be formed in order. Thus, a semiconductor device described with reference to FIGS. 13, and 14A to 14D may be manufactured.

In another example, after forming the gate layers 162, while remaining the buffer layer 154, the separation structures 175 and the second capping insulating layer 178 described with reference to FIGS. 26A and 26B may be formed in order. Accordingly, a semiconductor device described with reference to FIG. 17 may be manufactured.

In the aforementioned example embodiments described with reference to FIGS. 1 to 30, by disposing the intermediate insulating layer 118 surrounding the doped regions 140Ld and 140Pd of the vertical structure VS, defects occurring between the vertical structure VS positioned on a higher level than the stack structure 165 may be prevented. For example, by the ion implantation process 148 (in FIGS. 23A and 23B) for forming the doped regions 140Ld and 140Pd of the vertical structure VS as described above, the insulating structure 124 may include the first element, and a projected range (Rp) may be formed in the intermediate insulating layer 118 in the insulating structure 124. By configuring the insulating structure 124 to include the lower insulating layer 115, the intermediate insulating layer 118, and the upper insulating layer 121 stacked in order as described above, and by forming the intermediate insulating layer 118 using a material different from materials of the lower and upper insulating layers 115 and 121, defects which may occur during a semiconductor process may be prevented. For example, as described in the aforementioned example embodiments with reference to FIGS. 25A and 25B, as a material of the intermediate insulating layer 118 doped with the first element by the ion implantation process 148 (in FIGS. 23A and 23B) may have etch selectivity with the mold layers 104, during forming the empty spaces 156 (in FIGS. 25A and 25B) by removing the mold layers 104, the intermediate insulating layer 118 doped with the first element by the ion implantation process 148 (in FIGS. 23A and 23B) may remain without being etched or damaged. Thus, the insulating structure 124 including the intermediate insulating layer 118 may prevent defects occurring between the doped regions 140Ld and 140Pd of the vertical structure VS adjacent to each other.

In the aforementioned example embodiments, defects occurring during the etching process for forming the contact holes 181 (in FIGS. 26A and 26B) used for forming the gate contact plugs 184 electrically connected to the gate layers 162 of the stack structure 165 may be prevented. For example, gaps between the gate contact plugs 184 may become narrow due to high density, and during the etching process for forming the contact holes 181 (in FIGS. 26A and 26B), the intermediate insulating layer 118 doped with the first element by the ion implantation process 148 (in FIGS. 23A and 23B) may remain without being etched or damaged. Thus, the insulating structure 124 including the intermediate insulating layer 118 may prevent defects such as electrical shorts, current leakage, and the like, occurring between the gate contact plugs 184 formed in the contact holes 181 (in FIGS. 26A and 26B).

Therefore, according to the aforementioned example embodiments, a semiconductor device including the stack structure and the insulating structure stacked in order, and the vertical structures penetrating the stack structure and the insulating structure may be provided. The insulating structure may include a lower insulating layer, an intermediate insulating layer, and an upper insulating layer, stacked in order. The intermediate insulating layer may prevent defects occurring between the vertical structures positioned on a higher level than the stack structure.

While the example embodiments have been shown and described above, it will be apparent to those skilled in the art that modifications and variations could be made without departing from the scope of the present application as defined by the appended claims.

What is claimed is:

1. A semiconductor device, comprising:
a stack structure;
a lower structure, wherein the stack structure is disposed on the lower structure;
an insulating structure disposed on the stack structure;
a vertical structure extending in a direction perpendicular to an upper surface of the lower structure, wherein the vertical structure comprises a side surface opposing the stack structure and opposing the insulating structure; and
a contact plug on and contacting the vertical structure,
wherein at least a portion of the stack structure includes interlayer insulating layers and gate layers, wherein the interlayer insulating layers and the gate layers are alternately stacked,
wherein the insulating structure includes a lower insulating layer, an intermediate insulating layer, and an upper insulating layer,
wherein the intermediate insulating layer is disposed on the lower insulating layer,
wherein the upper insulating layer is disposed on the intermediate insulating layer,
wherein a material of the intermediate insulating layer is different from a material of the lower insulating layer and a material of the upper insulating layer,
wherein the intermediate insulating layer exhibits etch selectivity with respect to the upper insulating layer and the lower insulating layer,
wherein the vertical structure includes a core pattern, a channel region on a side surface of the core pattern, and a pad portion on the core pattern, and
wherein the contact plug contacts the pad portion.

2. The semiconductor device of claim 1,
wherein the intermediate insulating layer comprises a dopant, and
wherein the dopant includes a group-5 element of the periodic table.

3. The semiconductor device of claim 1, wherein a thickness of the intermediate insulating layer is greater than a thickness of each of the interlayer insulating layers.

4. The semiconductor device of claim 1, wherein a thickness of the intermediate insulating layer is greater than a thickness of each of the gate layers.

5. The semiconductor device of claim 1,
wherein the stack structure is disposed in a memory cell array region and extends, at least in part, into a connection region adjacent to the memory cell array region,
wherein the gate layers comprise pad regions, wherein the pad regions are arranged in a staircase form in the connection region,
wherein the lower insulating layer includes a first lower insulating layer and a second lower insulating layer, wherein the second lower insulating layer is disposed adjacent to the first lower insulating layer,
wherein the gate layers comprise an uppermost gate layer,
wherein the first lower insulating layer overlaps the uppermost gate layer, and
wherein the second lower insulating layer overlaps the pad regions.

6. The semiconductor device of claim 5, wherein a thickness of the first lower insulating layer is greater than a thickness of each of the interlayer insulating layers.

7. The semiconductor device of claim 5, wherein a thickness of the first lower insulating layer is greater than a thickness of each of the gate layers.

8. The semiconductor device of claim 5, wherein the first lower insulating layer and the second lower insulating layer are disposed below the intermediate insulating layer.

9. The semiconductor device of claim 5,
wherein the intermediate insulating layer is disposed between the first lower insulating layer and the upper insulating layer, and
wherein the upper insulating layer is in contact with the second lower insulating layer.

10. The semiconductor device of claim 1, wherein at least a portion of the pad portion is positioned on a same level as at least a portion of the intermediate insulating layer.

11. The semiconductor device of claim 1, wherein the intermediate insulating layer is positioned at a level lower than the pad portion.

12. The semiconductor device of claim 1, wherein the pad portion and the insulating structure include a first element, and wherein a doping concentration of the first element in the intermediate insulating layer is higher than a doping concentration of the first element in the upper and lower insulating layers.

13. The semiconductor device of claim 1, wherein the pad portion includes a doped polysilicon.

14. A semiconductor device, comprising:
a stack structure;
a lower structure, wherein the stack structure is disposed on the lower structure;
an insulating structure disposed on the stack structure;
a vertical structure extending in a direction perpendicular to an upper surface of the lower structure, wherein the vertical structure penetrates the stack structure and penetrates the insulating structure;
a capping insulating layer, wherein the capping insulating layer is disposed on the insulating structure and on the vertical structure; and
a separation structure, wherein the separation structure extends in the direction perpendicular to the upper surface of the lower structure, and wherein the separation structure penetrates the stack structure, penetrates the insulating structure, and penetrates the capping insulating layer; and
a contact plug penetrating through the capping insulating layer and contacting the vertical structure,
wherein the insulating structure includes a lower insulating layer, an intermediate insulating layer, and an upper insulating layer,
wherein the intermediate insulating layer is disposed on the lower insulating layer,
wherein the upper insulating layer is disposed on the intermediate insulating layer,
wherein a material of the intermediate insulating layer is different from a material of the lower insulating layer and a material of the upper insulating layer,
wherein the intermediate insulating layer exhibits an etch selectivity with respect to the upper insulating layer, and
wherein the vertical structure includes a core pattern, a channel region on a side surface of the core pattern and a doped region on the core pattern.

15. The semiconductor device of claim 14,
wherein at least a portion of the stack structure includes gate layers and interlayer insulating layers, wherein the interlayer insulating layers are disposed between the gate layers,
wherein the material of the interlayer insulating layers is different from a material of the interlayer insulating layers,
wherein the intermediate insulating layer comprises a dopant, and
wherein the dopant includes a group-5 element of the periodic table.

16. The semiconductor device of claim 14, further comprising:
a buffer layer disposed on the stack structure and disposed between the separation structure and the intermediate insulating layer.

17. The semiconductor device of claim 14, wherein the contact plug contacts the doped region,
wherein the doped region is formed of a polysilicon,
wherein an upper end of the doped region is at a higher level than the intermediate insulating layer,
wherein the core pattern includes an insulating material, and
wherein the channel region includes a semiconductor material.

18. A semiconductor device, comprising:
a stack structure;
a lower structure, wherein the stack structure is disposed on the lower structure;
an insulating structure disposed on the stack structure;
a vertical structure extending in a direction perpendicular to an upper surface of the lower structure, wherein the vertical structure penetrates the stack structure and penetrates the insulating structure;
a capping insulating layer, wherein the capping insulating layer is disposed on the insulating structure and on the vertical structure;
gate contact plugs, wherein the gate contact plugs penetrate the capping insulating layer and penetrate the insulating structure; and
a bit line contact plug penetrates the capping insulating layer and contacting the vertical structure,
wherein the insulating structure includes a lower insulating layer, an intermediate insulating layer, and an upper insulating layer,
wherein the intermediate insulating layer is disposed on the lower insulating layer,
wherein the upper insulating layer is disposed on the intermediate insulating layer,
wherein a material of the intermediate insulating layer is different from a material of the lower insulating layer and a material of the upper insulating layer,
wherein the intermediate insulating layer exhibits an etch selectivity with respect to the upper insulating layer and the lower insulating layer, and
wherein the vertical structure includes a core pattern, a channel region on a side surface of the core pattern and a pad portion on the core pattern.

19. The semiconductor device of claim 18,
wherein the stack structure includes intermediate insulating layers and gate layers,
wherein the gate contact plugs are electrically connected to pad regions of the gate layers,
wherein the intermediate insulating layer comprises a dopant, and
wherein the dopant includes a group-5 element of the periodic table.

20. The semiconductor device of claim 18, wherein the bit line contact plug contacts the pad portion of the vertical structure,
wherein the pad portion includes a polysilicon,
wherein an upper end of the pad portion is at a higher level than the intermediate insulating layer,
wherein the core pattern includes an insulating material, and
wherein the channel region includes a semiconductor material.

* * * * *